US008664672B2

(12) United States Patent
Ogihara et al.

(10) Patent No.: US 8,664,672 B2

(45) Date of Patent: Mar. 4, 2014

(54) LIGHT EMITTING PANEL HAVING A PLURALITY OF LIGHT EMITTING ELEMENT ARRAYS ARRANGED IN DESCENDING ORDER OF WAVELENGTH

(75) Inventors: Mitsuhiko Ogihara, Hachioji (JP); Takahito Suzuki, Hachioji (JP); Tomoki Igari, Hachioji (JP); Hiroyuki Fujiwara, Hachioji (JP); Tomohiko Sagimori, Hachioji (JP); Hironori Furuta, Hachioji (JP); Yusuke Nakai, Hachioji (JP)

(73) Assignee: Oki Data Corporation, Tokyo (JP)

( * ) Notice: Subject to any disclaimer, the term of this patent is extended or adjusted under 35 U.S.C. 154(b) by 573 days.

(21) Appl. No.: 12/144,689

(22) Filed: Jun. 24, 2008

(65) Prior Publication Data

US 2009/0001391 A1 Jan. 1, 2009

(30) Foreign Application Priority Data

Jun. 29, 2007 (JP) ................................ 2007-172067

(51) Int. Cl.
*H01L 33/00* (2010.01)

(52) U.S. Cl.
USPC .................................... 257/89; 257/E33.001

(58) Field of Classification Search
USPC ...................................... 257/79–89, E33.001
See application file for complete search history.

(56) References Cited

U.S. PATENT DOCUMENTS

| | | | | |
|---|---|---|---|---|
| 5,965,907 | A * | 10/1999 | Huang et al. | 257/89 |
| 2003/0197463 | A1* | 10/2003 | Ono et al. | 313/495 |
| 2004/0233671 | A1* | 11/2004 | Staufert | 362/294 |
| 2005/0253151 | A1* | 11/2005 | Sakai et al. | 257/79 |
| 2006/0238464 | A1* | 10/2006 | Hillis et al. | 345/82 |
| 2007/0085092 | A1* | 4/2007 | Chen | 257/89 |

FOREIGN PATENT DOCUMENTS

JP 2000-284726 A 10/2000

* cited by examiner

*Primary Examiner* — Kimberly Rizkallah
*Assistant Examiner* — Duy T Nguyen
(74) *Attorney, Agent, or Firm* — Panitch Schwarze Belisario & Nadel LLP

(57) ABSTRACT

A light emitting panel includes a plurality of light emitting element arrays each of which has a plurality of light emitting elements arranged in a plane. The light emitting element arrays are configured so that an arrangement plane of the light emitting elements of one light emitting element array is overlapped with another arrangement plane of the light emitting elements of another light emitting element array in substantially parallel to each other, and so that the light emitting elements of one light emitting element array and the light emitting elements of another light emitting element array emit lights to the same side.

17 Claims, 42 Drawing Sheets

220

LIGHT EMITTING PANEL HAVING A PLURALITY OF LIGHT EMITTING ELEMENT ARRAYS ARRANGED IN DESCENDING ORDER OF WAVELENGTH

BACKGROUND OF THE INVENTION

This invention relates to a light emitting panel in which light emitting elements are arranged in a plane, and also relates to a display device and a light source device using the light emitting panel.

There is known a display device using organic EL (electric luminescence) elements as light emitting elements arranged two-dimensionally on a substrate (see, Japanese Laid-open Patent Publication No. 2000-284726). Such a display device is needed to have a plurality of kinds of light emitting elements that emit lights having different wavelengths such as red, green and blue lights.

In a three-color display device, on the assumption that the number of pixels for each color is the same as the number of pixels of a monochrome display device, the density of light emitting elements becomes three times that of the monochrome display device. Therefore, the color display device is required to reduce the size of each light emitting element, compared with the monochrome display device. To be more specific, the color display device is required to reduce the length or diameter of each light emitting element, compared with the monochrome display device. However, conventionally, an increase in pixel density is restricted because of difficulty in reduction in size of the light emitting element.

SUMMARY OF THE INVENTION

The present invention is intended to solve the above described problems, and an object of the present invention is to increase a density of light emitting elements.

The present invention provides a light emitting panel including a plurality of light emitting element arrays each of which has a plurality of light emitting elements arranged in a plane. The plurality of light emitting element arrays are configured so that an arrangement plane of the light emitting elements of one light emitting element array is overlapped with another arrangement plane of the light emitting elements of another light emitting element array in substantially parallel to each other, and so that the light emitting elements of one light emitting element array and the light emitting elements of another light emitting element array emit lights to the same side.

With such an arrangement, it becomes possible to obtain a light emitting panel in which light emitting elements are arranged at a high density.

DETAILED DESCRIPTION OF THE PREFERRED EMBODIMENT

Hereinafter, embodiments of the present invention will be described with reference to the attached drawings. In the description of a light emitting device of a display device, n-type (n-side) is defined as a first conductivity type (a first conductivity side), and p-type (p-side) is defined as a second conductivity type (a second conductivity side). However, n-type (n-side) can be the second conductivity type (the second conductivity side) and p-type (p-side) can be the first conductivity type (the first conductivity side).

Embodiment 1

Figure 1:
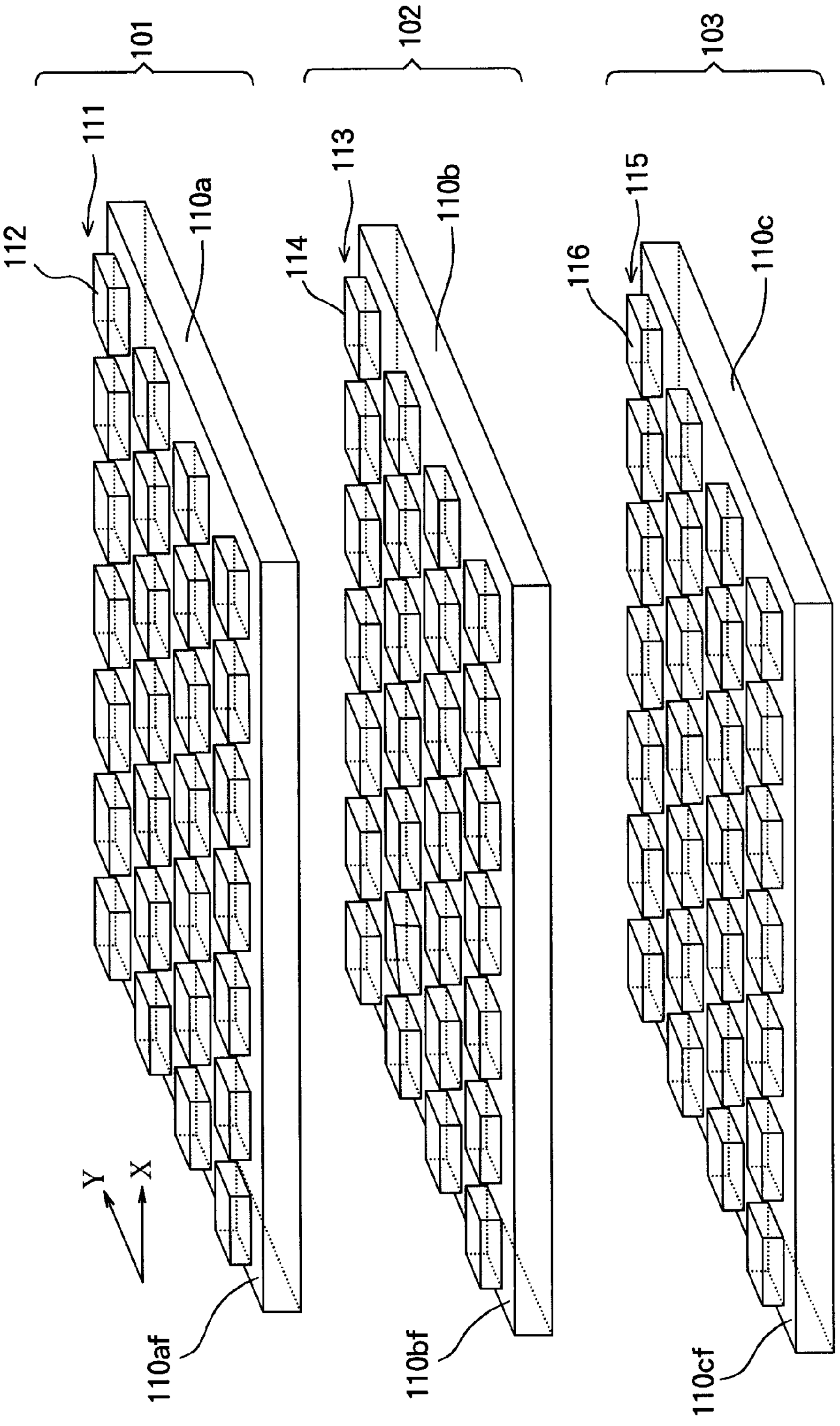
FIG. 1 is an exploded perspective view schematically showing an example of a configuration of a light emitting panel of a display device according to Embodiment 1 of the present invention.
Figure 2:
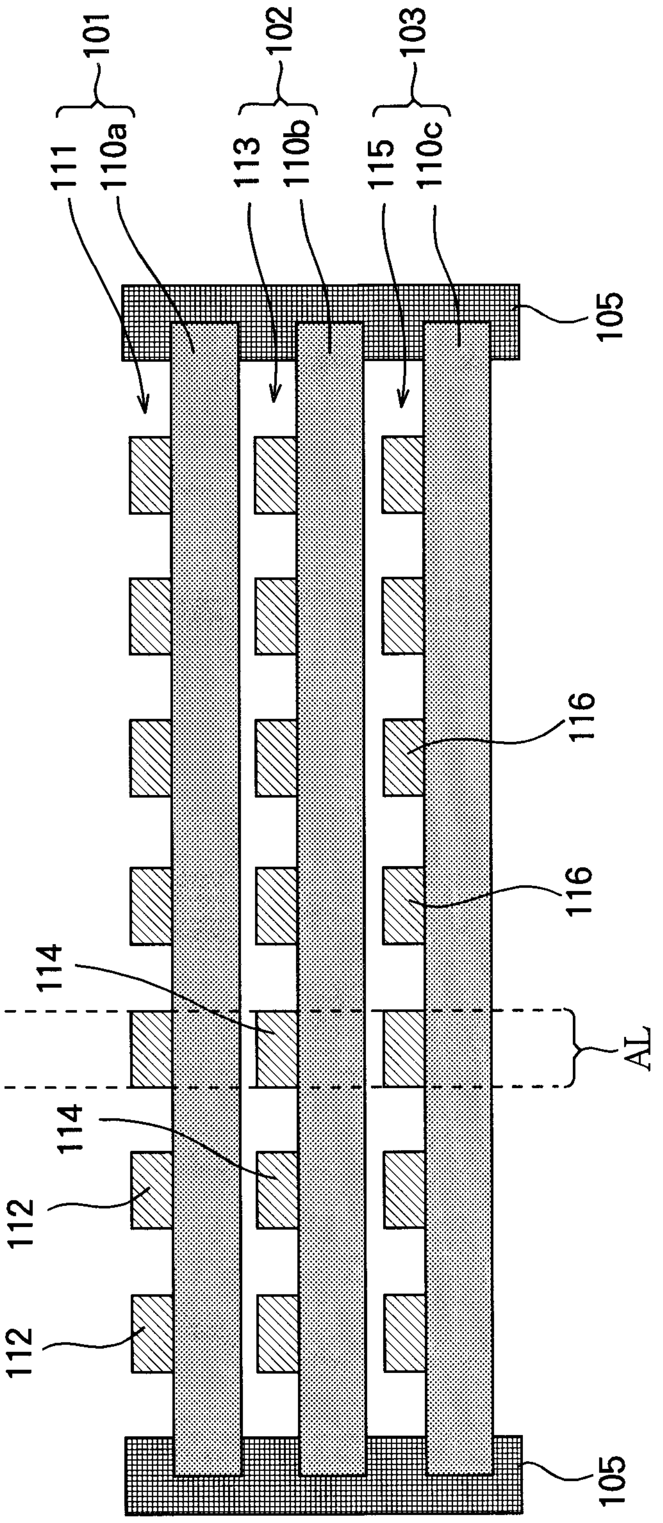
FIG. 2 is a sectional view schematically showing the light emitting panel shown in FIG. 1.

FIG. 1 is an exploded perspective view schematically showing an example of a configuration of a light emitting panel of a display device according to Embodiment 1 of the present invention. FIG. 2 is a sectional view schematically showing the light emitting panel of FIG. 1.

The light emitting panel shown in FIGS. 1 and 2 includes three light emitting element array units 101, 102 and 103. In FIGS. 1 and 2, the upside is a light emitting surface side (i.e., a side closer to a light emitting surface) of the light emitting panel, and the downside is a back surface side of the light emitting panel. Three light emitting element array units 101, 102 and 103 are overlapped with each other in the vertical direction in FIGS. 1 and 2.

The light emitting element array unit 101 includes a substrate 110*a* and a plurality of light emitting elements 112 arranged on a surface 110*af* (a surface side of the light emitting panel, i.e., an upper side in FIGS. 1 and 2) of the substrate 110*a*. Similarly, the light emitting element array unit 102 includes a substrate 110*b* and a plurality of light emitting elements 114 arranged on a surface 110*bf* of the substrate 110*b*. The light emitting element array unit 103 includes a substrate 110*c* and a plurality of light emitting elements 116 arranged on a surface 110*cf* of the substrate 110*c*.

For integrating the light emitting element array units 101, 102 and 103, a frame-like holding member 105 is provided for holding peripheral portions of the substrates 110*a*, 110*b* and 110*c* of the light emitting element array units 101, 102 and 103 in such a manner that the substrates 110*a*, 110*b* and 110*c* are overlapped with each other with suitable gaps formed therebetween. Alternatively, it is also possible to insert spacers, fillers, adhesive materials or the like into between the light emitting element array units 101, 102 and 103 so as to maintain respective gaps therebetween.

The light emitting elements 112 of the light emitting element array unit 101 are two-dimensionally arranged at substantially constant pitches in a column direction (i.e., Y direction) and a row direction (i.e., X direction) in an imaginary plane parallel to the substrate 110*a*, so as to constitute a light emitting element array 111. The light emitting elements 114 of the light emitting element array unit 102 are two-dimensionally arranged at substantially constant pitches in the column direction (the Y direction) and the row direction (the X direction) in an imaginary plane parallel to the substrate 110*b*, so as to constitute a light emitting element array 113. The light emitting elements 116 of the light emitting element array unit 103 are two-dimensionally arranged at substantially constant pitches in the column direction (the Y direction) and the row direction (the X direction) in an imaginary plane parallel to the substrate 110*c*, so as to constitute a light emitting element array 115.

The light emitting elements 112 of light emitting element array 111 can be formed separately from each other as shown in FIG. 1, or can be formed in a continuous semiconductor layer or thin film. Similarly, the light emitting elements 114 of the light emitting element array 113 can be formed separately from each other, or can be formed in a continuous semiconductor layer or thin film. The light emitting elements 116 of the light emitting element array 115 can be formed separately from each other, or can be formed in a continuous semiconductor layer or thin film.

The arrangement pitch (i.e., the center-to-center distance) of the light emitting elements 112 of the light emitting element array 111 in the Y direction, the arrangement pitch of the light emitting elements 114 of the light emitting element array 113 in the Y direction, and the arrangement pitch of the light emitting elements 116 of the light emitting element array 115 in the Y direction are the same as each other. Similarly, the arrangement pitch of the light emitting elements 112 of the light emitting element array 111 in the X direction, the arrangement pitch of the light emitting elements 114 of the light emitting element array 113 in the X direction, and the arrangement pitch of the light emitting elements 116 of the light emitting element array 115 in the X direction are the same as each other.

The light emitting elements 112 of the light emitting element array 111, the light emitting elements 114 of the light emitting element array 113, and the light emitting elements 116 of the light emitting element array 115 are aligned with each other in a direction perpendicular to the light emitting diode arrays 111, 113 and 115 (i.e., in a direction perpendicular to the substrates 110*a*, 110*b* and 110*c*). As an illustration, respective light emitting elements 112, 114 and 116 (of the respective light emitting element array 111, 113 and 115) aligned with each other are indicated by a mark AL in FIG. 2.

In the example shown in FIGS. 1 and 2, the light emitting element arrays 111, 113 and 115 are arranged in this order starting from the surface side of the light emitting panel of the display device. In other words, the light emitting element arrays 111, 113 and 115 are respectively at first, second and third positions, as seen from the surface of the light emitting panel.

The light emitting elements 112 of the light emitting element array 111 emit light having the same wavelength (i.e., the same color), and are formed of, for example, a blue light emitting inorganic semiconductor material such as InGaN or the like so as to emit light whose wavelength is in a range from 450 nm to 490 nm.

The light emitting elements 114 of the light emitting element array 113 emit light having the same wavelength (i.e., the same color), and are formed of, for example, a green light emitting inorganic semiconductor material such as GaP or the like so as to emit light whose wavelength is in a range from 490 nm to 560 nm.

The light emitting elements 116 of the light emitting element array 115 emit light having the same wavelength (i.e., the same color), and are formed of, for example, a red light emitting inorganic semiconductor material such as AlGaAs or the like so as to emit light whose wavelength is in a range from 630 nm to 760 nm.

As described above, the light emitting elements 112, 114 and 116 of the light emitting element arrays 111, 113 and 115 are formed of different semiconductor materials, and emit lights having different wavelength, i.e., of different colors.

The light emitting elements 112 of the light emitting element array 111 provided closest to the surface of the light emitting panel of the display device (i.e., provided at the first position from the surface side of the light emitting panel) emit light having the shortest wavelength. The light emitting elements 114 of the light emitting element array 113 provided at the second position from the surface side of the light emitting panel emit light having the second shortest wavelength. The light emitting elements 116 of the light emitting element array 115 provided at the third position from the surface side of the light emitting panel emit light having the longest wavelength.

The substrates 110*a*, 110*b* and 110*c* of the light emitting element array units 101, 102 and 103 are formed of, for example, glass, quartz or plastic. The substrates 110*a*, 110*b* and 110*c* are preferably formed of a material that transmits light emitted by the light emitting element provided on the back side thereof. In the case where the substrates 110*a*, 110*b* and 110*c* have the same optical transparency, the substrates 110*a*, 110*b* and 110*c* can be configured to have optical transparency at wavelengths of lights emitted by the light emitting elements 114 and 116 of the light emitting element arrays 113 and 115 (i.e., except the light emitting element array 116 on the first position from the surface side of the light emitting panel). Alternatively, in the case where the substrates 110*a*, 110*b* and 110*c* have the different optical transparencies, the substrate 110*a* can be configured to have optical transparency at wavelengths of lights emitted by the light emitting elements 114 and 116, and the substrate 110*b* can be configured to have optical transparency at wavelength of light emitted by the light emitting element 116. In this case, the substrate 110*c* can be formed of a material having light-blocking properties.

As described above, in this embodiment, the light emitting elements 112 of the light emitting element array 111 (provided at the first position from the surface side of the light emitting panel) emit light having the shortest wavelength, the light emitting elements 114 of the light emitting element array 113 (provided at the second position from the surface side of the light emitting panel) emit light having the second shortest wavelength, and the light emitting elements 116 of the light emitting element array 115 (provided at the third position from the surface side of the light emitting panel) emit light having the longest wavelength. The reason for employing such arrangement is as follows. As the wavelength increases, the attenuation of the light passing through the semiconductor material decreases. In other words, the attenuation of light emitted by the light emitting elements 116 of the light emitting element array 115 (farthest from the surface of the light emitting panel) and passing the light emitting element arrays 111 and 113 (on the first and second positions from the surface side of the light emitting panel) can be reduced, and the attenuation of light emitted by the light emitting elements 114 of the light emitting element array 113 (on the second position from the surface side of the light emitting panel) and passing the light emitting element arrays 111 (on the first position from the surface side of the light emitting panel) can be reduced, compared with the case where the light emitting element arrays 111, 113 and 115 are arranged otherwise.

Next, a manufacturing method of the light emitting elements 112, 114 and 116 constituting the light emitting diode arrays 111, 113 and 115 of the light emitting element array unit 101, 102 and 103 will be described. In the description of common features of the light emitting elements 112, 114 and 116, the substrates 110*a*, 110*b* and 110*c* are collectively referred to as a substrate 100.

Figure 3:
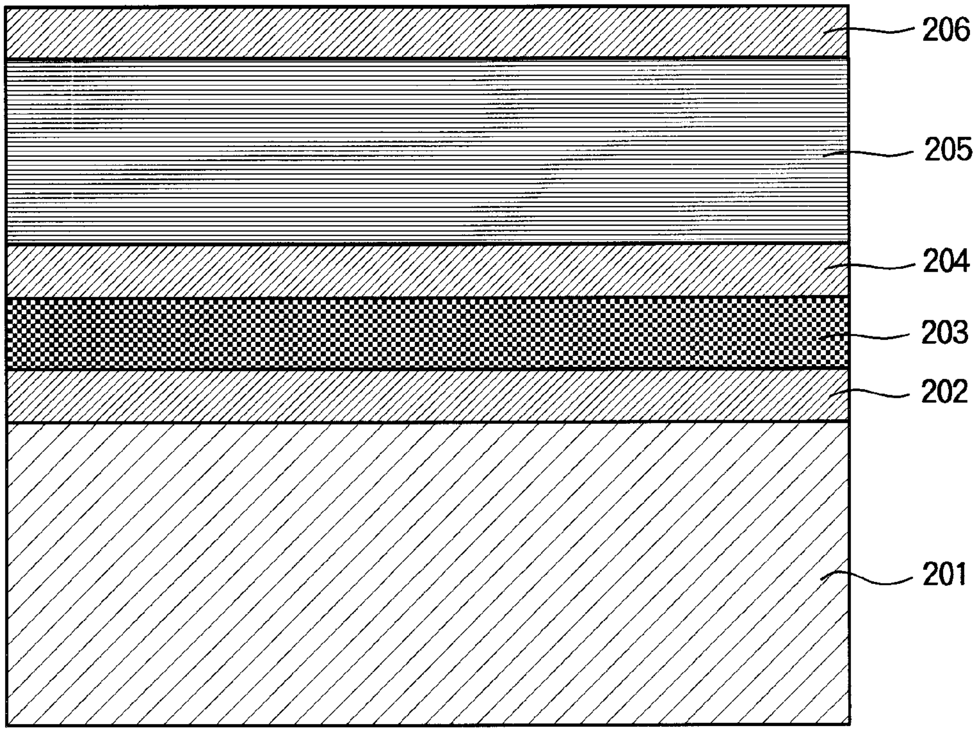
FIG. 3 is a sectional view schematically showing an example of a semiconductor epitaxial wafer used when light emitting elements shown in FIG. 1 are formed of semiconductor thin films.
Figure 4:
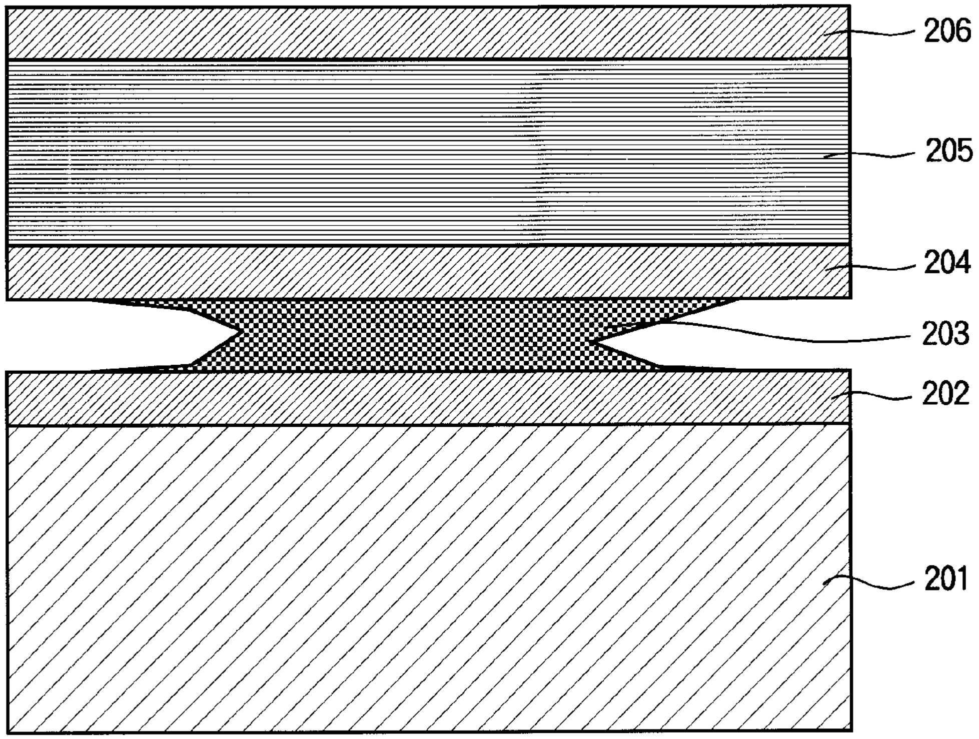
FIG. 4 is a sectional view schematically showing a state during an etching process to separate semiconductor thin film (that forms the light emitting elements shown in FIG. 3) from a substrate.
Figure 5:
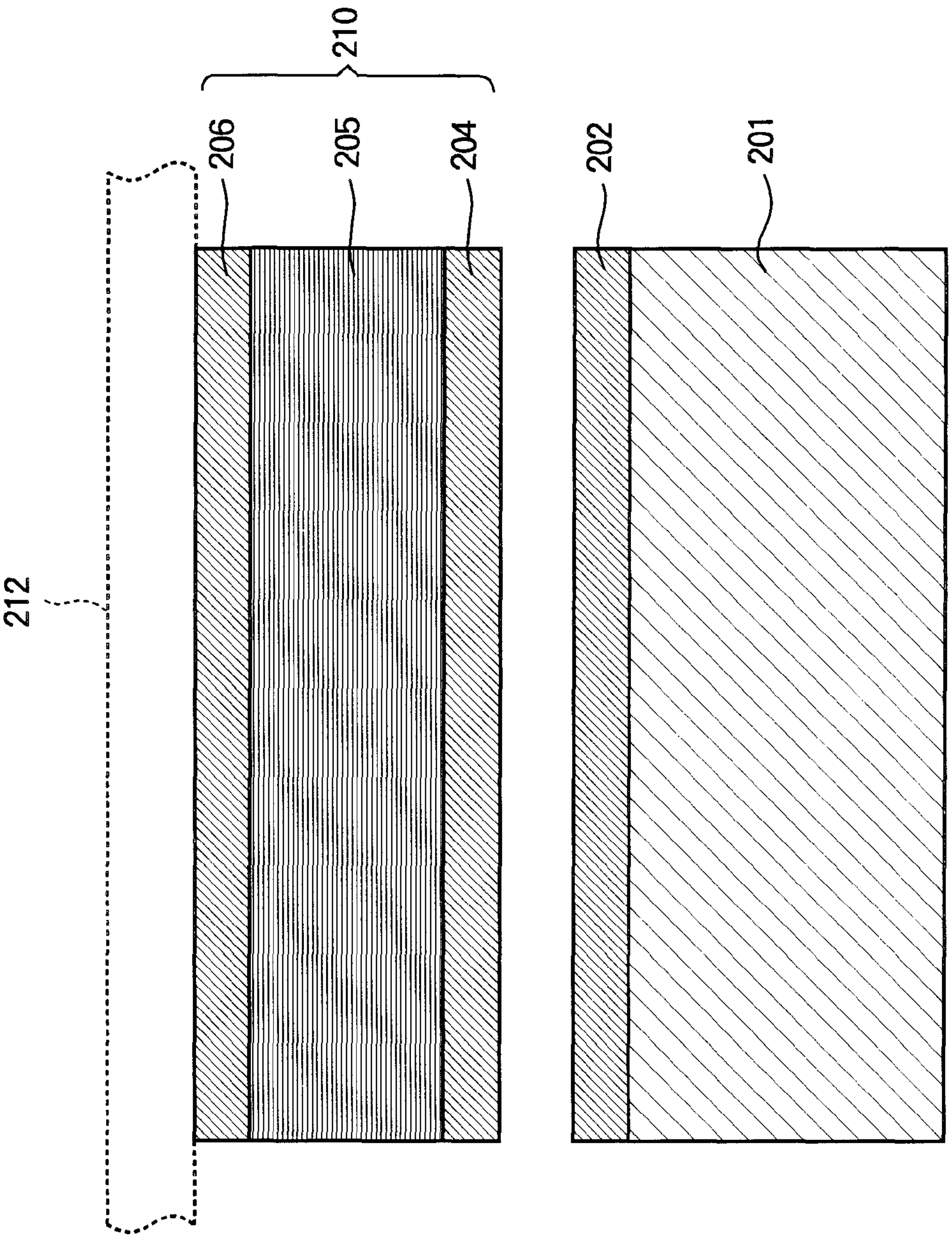
FIG. 5 is a sectional view schematically showing a state after the etching process to separate semiconductor thin film (that forms the light emitting elements shown in FIG. 3) from the substrate has been completed.

FIG. 3 is a sectional view schematically showing an example of a semiconductor epitaxial wafer used when the light emitting elements of FIG. 1 are formed of semiconductor thin film. FIG. 4 is a sectional view schematically showing a state during an etching process to separate the semiconductor thin film (for forming the light emitting elements shown in FIG. 3) from a substrate. FIG. 5 is a sectional view schematically showing a state after the etching process from the substrate is completed.

As shown in FIGS. 3 through 5, a substrate 201 (referred to as an epitaxial growth substrate) is provided for growing epitaxial semiconductor layers thereon. A buffer layer 202 is formed on the epitaxial growth substrate 201. A separation layer 203 is provided for separating a semiconductor thin film (i.e., semiconductor layers 204 through 206) from the substrate 201. A semiconductor layer 204 is formed on the separation layer 203.

The separation layer 203 has a high etching rate (compared with the semiconductor layer 204 and the substrate 201) when using etching solution or the like. In contrast, the semiconductor layer 204 has a low etching rate when using the etching solution or the like for separating the separation layer 203, and therefore the semiconductor layer 204 is not etched in the etching process of the separation layer 203.

A semiconductor layer 205 is formed on the semiconductor layer 204, and includes a light emitting region. A semiconductor layer 206 is formed on the semiconductor layer 205, and is an uppermost layer of a semiconductor thin film. The semiconductor layers 204, 205 and 206 constitute a semiconductor thin film 210 (FIG. 5) that forms a light emitting element.

In the manufacturing method of the semiconductor thin film 210, for example, the separation layer 203 of the semiconductor epitaxial wafer (FIG. 3) is selectively etched using etching solution or the like as shown in FIG. 4, and the semiconductor layers (the semiconductor thin film 210) above the separation layer 203 is separated from the substrate 201.

The separated semiconductor thin film 210 is bonded to the substrate 110 shown in FIG. 1 by means of intermolecular force. In the bonding process, an activation treatment is performed on a bonding surface of the semiconductor thin film 210, and then the semiconductor thin film 210 is brought into tight contact with a predetermined position on the substrate 110 and is pressurized. After the bonding process, it is also possible to perform a heat treatment for enhancing the bonding force as necessary. Further, it is also possible to apply a coating on a bonding region of the substrate 110 to planarize the surface thereof. Furthermore, the semiconductor thin film 210 can be bonded to the substrate 110 via an adhesive layer having adhesion properties.

When the semiconductor thin film 210 having been separated from the substrate 201 is bonded to the substrate 110, it is possible to hold the semiconductor thin film 210 using a transfer substrate (i.e., a holding body) 212 shown by a dashed line in FIG. 5. In this case, it is possible to bond the upper side of the transfer substrate 212 in FIG. 5 to the substrate 110, or to bond the bottom surface of the semiconductor thin film 210 to the substrate 110. In the latter case, the transfer substrate 212 is removed.

Further, the separation and the bonding can be performed individually for respective light emitting elements, and can be performed for respective light emitting elements constituting a part of all the light emitting elements 116 on the substrate 110.

With this, the pitch of the light emitting elements on the substrate 110 can be varied from the pitch of the light emitting elements on the on the substrate 201.

Figure 6:
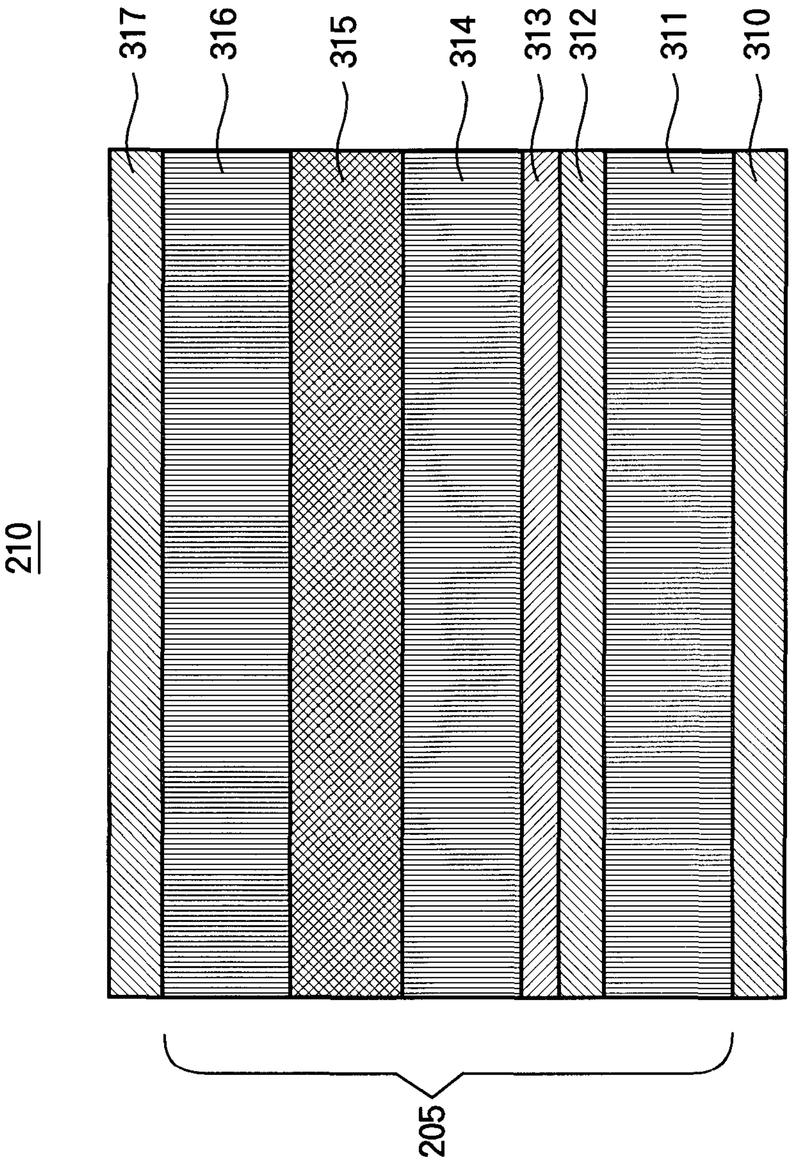
FIG. 6 is a sectional view schematically showing an example of the semiconductor thin film shown in FIG. 5.

FIG. 6 is a sectional view schematically showing an example of the semiconductor thin film 210. The example shown in FIG. 6 constitutes a light emitting element that emits red light, and is used as the light emitting element 116 in FIG. 1.

In FIG. 6, reference numeral 310 indicates an n-type GaAs bonding layer. An n-type $Al_tGa_{1-t}As$ conductive layer 311 is formed on the n-type GaAs bonding layer 310. An n-type GaAs contact layer 312 is formed on the n-type $Al_tGa_{1-t}As$ conductive layer 311. An $In_sGa_{1-s}P$ etching stopper layer 313 is formed on the n-type GaAs contact layer 312. An n-type $Al_xGa_{1-x}As$ cladding layer 314 is formed on the $In_sGa_{1-s}P$ etching stopper layer 313. An n-type $Al_yGa_{1-y}As$ active layer 315 is formed on the n-type $Al_xGa_{1-x}As$ cladding layer 314. A p-type $Al_zGa_{1-z}As$ cladding layer 316 is formed on the n-type $Al_yGa_{1-y}As$ active layer 315. A p-type GaAs contact layer 317 is formed on the p-type $Al_zGa_{1-z}As$ layer 316. The layers 311 through 317 correspond to the thin film layers (the semiconductor thin film) 205 including a light emitting region of FIG. 5.

The n-type GaAs contact layer 312 is exposed by etching (removing) the upper layers 312 through 317. An n-side contact is formed on the exposed surface of the n-type GaAs contact layer 312. The $In_sGa_{1-s}P$ etching stopper layer 313 stops etching when the upper layers are etched (removed) in the forming process of the light emitting element. The n-type $Al_yGa_{1-y}As$ active layer 315 is sandwiched by the n-type $Al_xGa_{1-x}As$ cladding layer 314 and the p-type $Al_zGa_{1-z}As$ layer 316 so as to form a light emitting region.

Regarding Al composition, y is preferably smaller than x and z, and t is preferably larger than y. Regarding In composition, s is preferably 0.5 (S=0.5) so that lattice constant thereof coincides with that of the GaAs layer, and more preferably in the range from 0.48 to 0.52 (the effective composition). It is also possible to use quaternary semiconductor AlGaInP (instead of the ternary semiconductor layer AlGaAs) to constitute a light emitting element that emits light of the wavelength from 600 to 700 nm.

Figure 7:
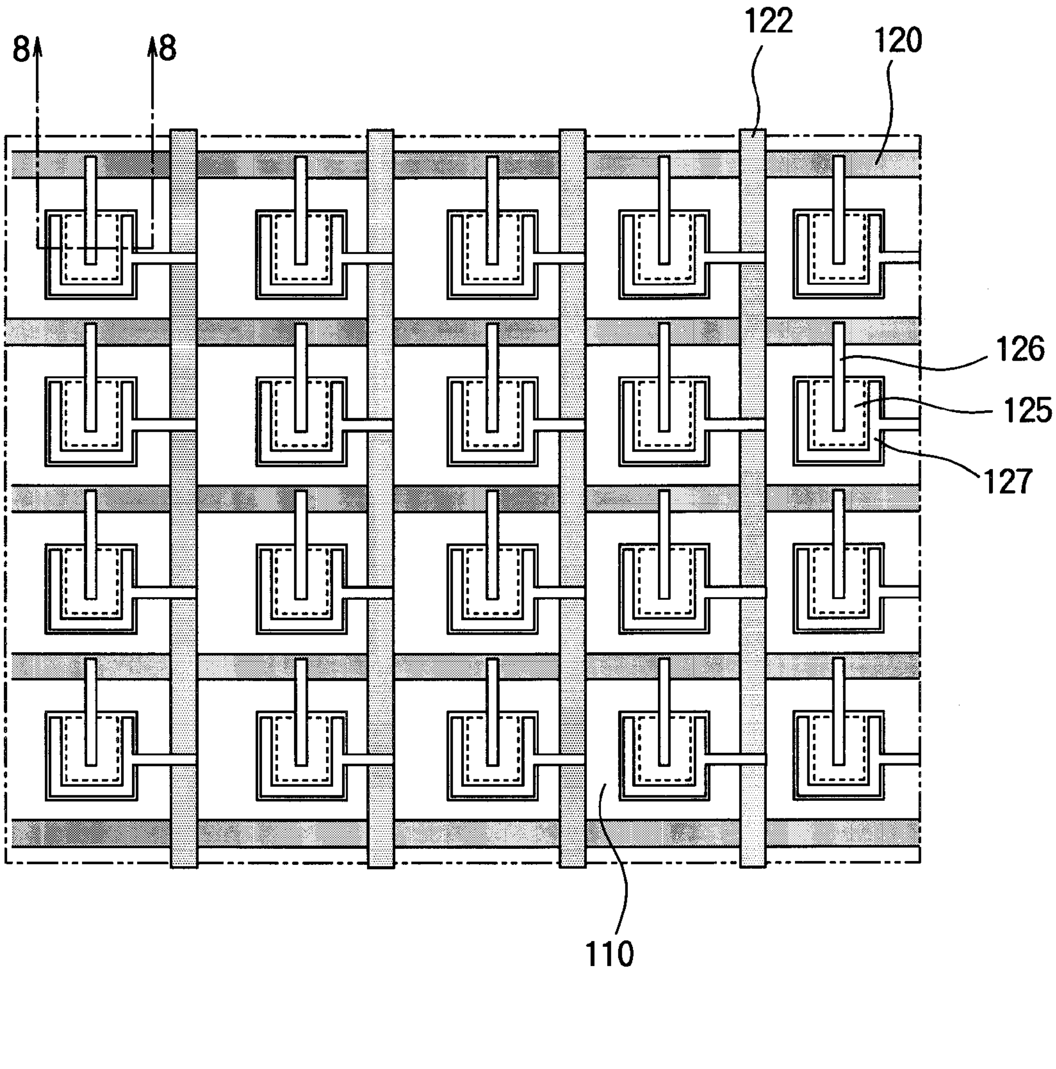
FIG. 7 is a plan view schematically showing an example of a configuration including light emitting elements constituting a part of a light emitting element array shown in FIG. 1 and electrodes and wirings connected to the light emitting elements.
Figure 8:
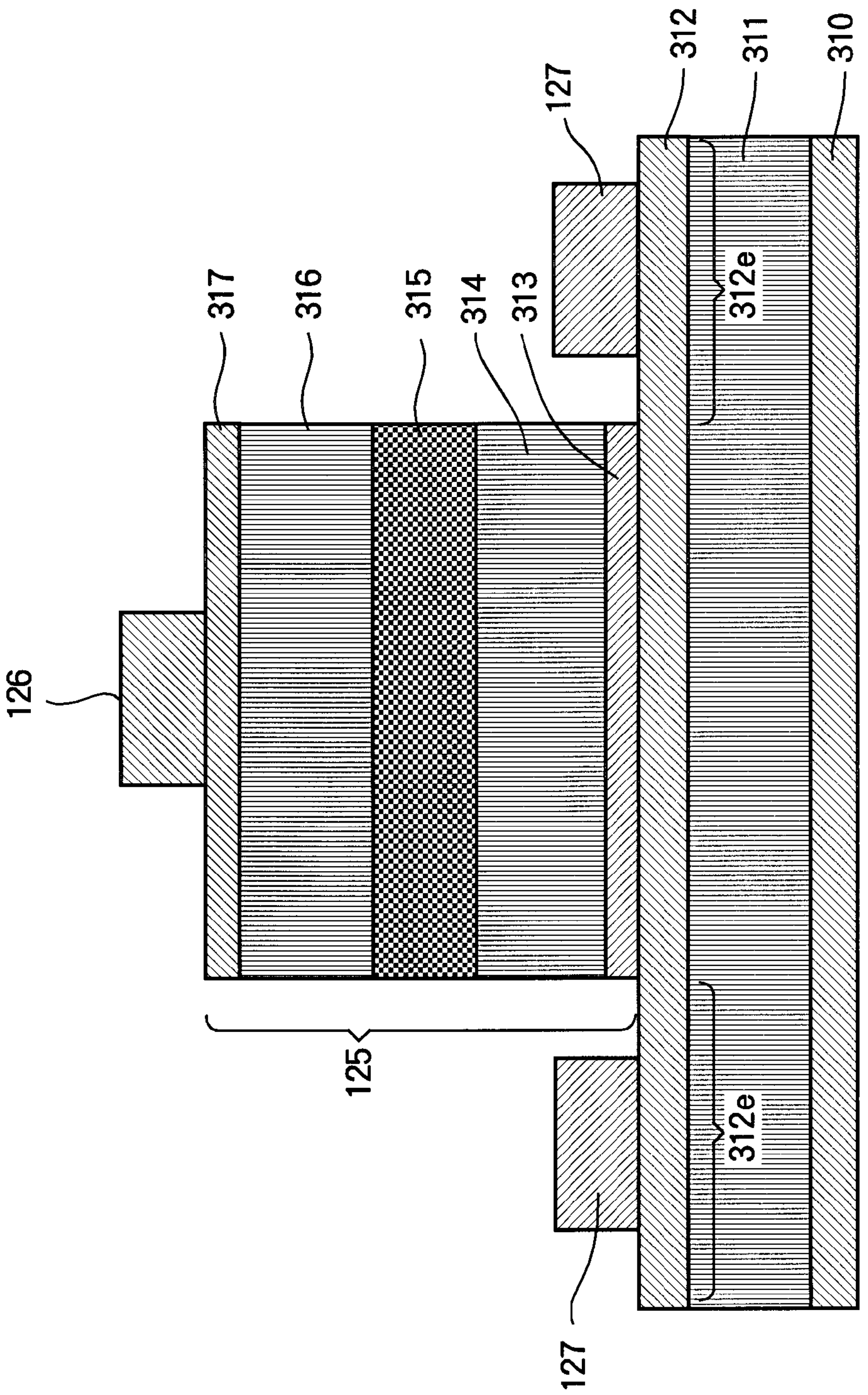
FIG. 8 is a sectional view taken along line 8-8 shown in FIG. 7.

FIG. 7 is a plan view schematically showing an example of a configuration including 20 (4 rows and 5 columns) light emitting elements that constitute a part of the light emitting element array 111, 113 or 115 and electrodes and wirings connected to the light emitting elements. FIG. 8 is a sectional view taken along line 8-8. In FIG. 8 and subsequent figures, only portions related to the features of the embodiment are illustrated, and other portions (such as interlayer insulation films) are omitted.

The configuration shown in FIGS. 7 and 8 is formed by, for example, performing mesa etching, deposition or other process on the semiconductor thin film 210 shown in FIG. 6.

It is possible to perform mesa etching after the semiconductor thin films 210 (constituting the light emitting elements) are bonded to the substrates 110*a*, 110*b* and 110*c* of the light emitting element array unit. Alternatively, it is possible to perform mesa etching on the epitaxial growth substrate 201 to form structures of the light emitting elements, to divide the respective semiconductor thin films 210, and to bond the separated pieces of the semiconductor thin films 210 to the substrates 110, 110*b* and 110*c* of the light emitting element array units. In this case, wiring process is performed for electrically connecting electrodes on the light emitting elements and wiring patterns on the substrates 110*a*, 110*b* and 110*c* after the bonding.

In FIGS. 7 and 8, reference numeral 125 indicates a light emitting region of the semiconductor thin film having a light emitting element structure, and corresponds to the light emitting elements 112, 114 or 116 shown in FIG. 1.

A p-side electrode 126 and an n-side electrode 127 are connected to the light emitting region 125. A p-side wiring 120 is connected to the p-side electrode 126, an n-side wiring 122 is connected to the n-side electrode 127. The p-side wiring 120 and the n-side wiring 122 extend in directions perpendicular to each other, and are arranged in a lattice.

In the configuration shown in FIG. 7, the p-side wiring 120 and the n-side wiring 122 arranged in a lattice function to prevent the diffusion of the light emitted by the light emitting elements disposed on the back side thereof.

By selectively removing layers 313, 314, 315, 316 and 317 of the semiconductor thin film 210 as shown in FIG. 8, the light emitting region 125 of the light emitting element is formed, and a part 312*e* of the n-type GaAs contact layer 312 is exposed. The n-side electrode 127 is formed on the exposed part 312*e* using deposition or the like, and the p-side electrode 126 is formed on the p-type GaAs contact layer 317.

The n-side electrode 127 can be formed of, for example, metal such as AuGeNi/Au, AuGe/Ni/Au or the like capable of forming ohmic contact with the n-type GaAs contact layer 312. The n-side electrode 127 and the n-side wiring 122 are connected by, for example, an Au-based metal wiring such as Ti/Pt/Au or the like, or Al-based metal wiring such as Al, Ni/Al, Ni/AlNd, Ni/AlSiCu or the like.

The n-side electrode 126 can be formed of, for example, Au-based metal such as Ti/Pt/Au, AuZn or the like or Al-based metal such as Al, Ni/Al, Ti/Al, AlSiCu, AlNd, Ni/Al-SiCu, Ni/AlNd capable of forming ohmic contact with the p-type GaAs contact layer 317.

Figure 9:
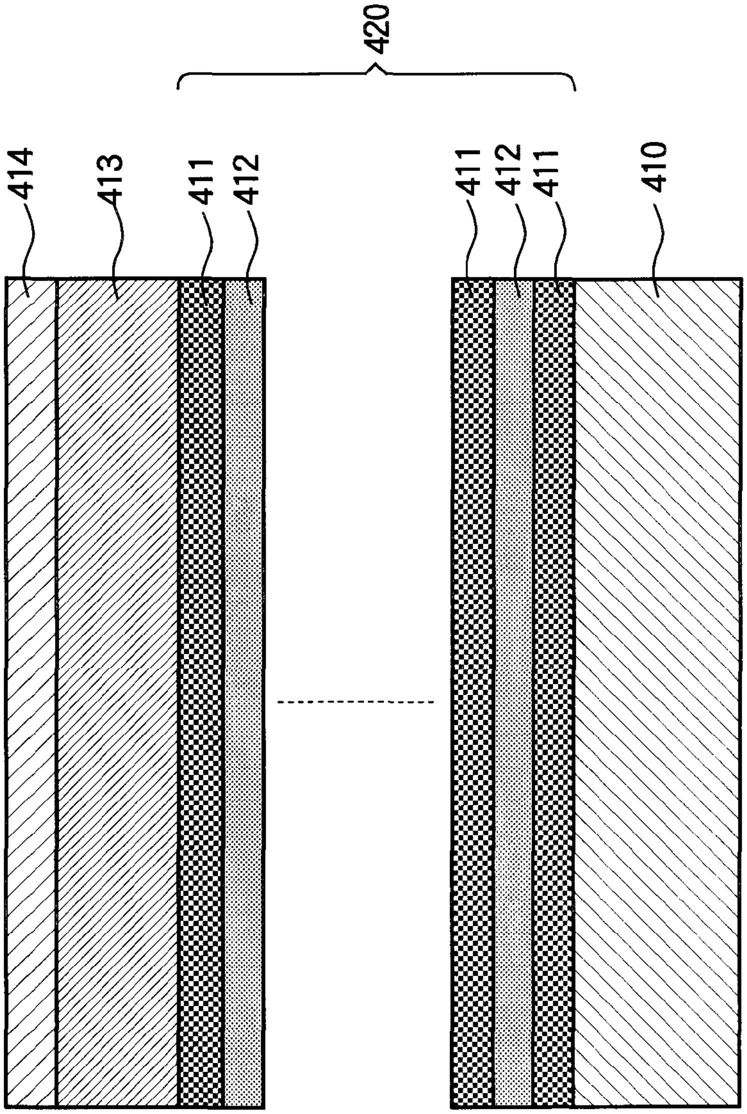
FIG. 9 is a sectional view schematically showing another example of the semiconductor thin film having a different structure from the semiconductor thin film of FIG. 6.

FIG. 9 is a sectional view schematically showing another example of the semiconductor thin film (referred to as a semiconductor thin film 220) different from the semiconductor thin film 210 shown in FIG. 6.

The semiconductor thin film 220 shown in FIG. 9 constitutes a light emitting element using nitride-based semiconductor material that emits light whose wavelength is in a range, for example, substantially from 450 to 560 nm, and is used as the light emitting element 112 or 114.

The semiconductor thin film 220 shown in FIG. 9 has a multiple quantum well 420. In FIG. 9, reference numeral 410 indicates an n-type GaN contact layer. The multiple quantum well 420 is formed on the n-type GaN contact layer 410, and includes $In_xGa_{1-x}N$ layers 411 and GaN layers 412 which are alternately laminated. A p-type $Al_yGa_{1-y}N$ cladding layer 413 is formed on the multiple quantum well 420, and a p-type GaN contact layer 414 is formed on the p-type $Al_yGa_{1-y}N$ cladding layer 413.

Figure 10:
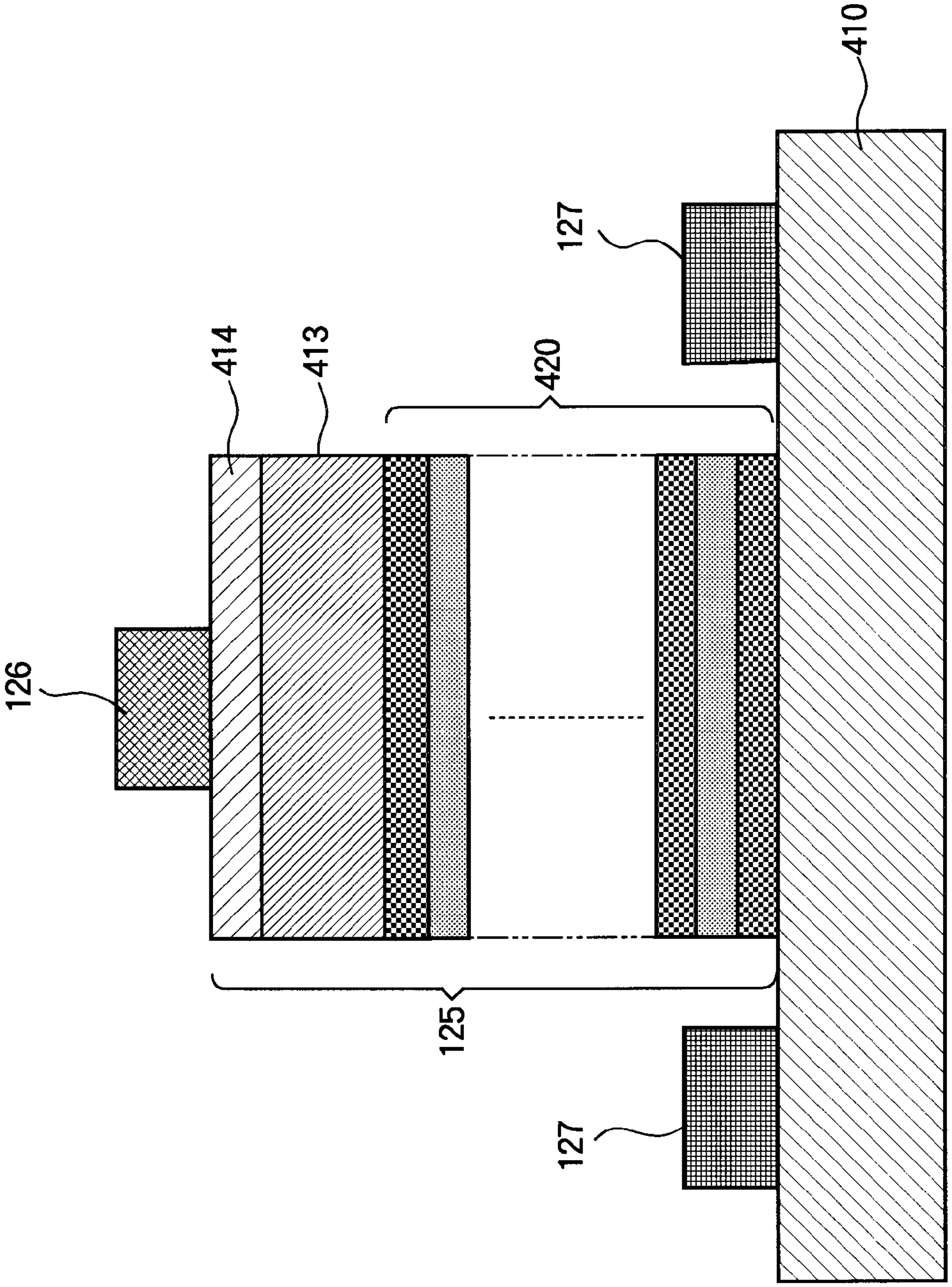
FIG. 10 is a sectional view schematically showing a structure of a light emitting element formed using the semiconductor thin film shown in FIG. 9.

FIG. 10 is a sectional view schematically showing a light emitting element formed using the semiconductor thin film 220 and electrodes connected to the light emitting element, and corresponds to a sectional view taken along line 8-8 shown in FIG. 7.

For example, by selectively removing the layers 420, 413 and 414 of the semiconductor thin film 220 using mesa etching, the light emitting region 125 is formed, and a part of the n-type GaN contact layer 410 is exposed. The n-side electrode 127 is formed on the exposed part of the n-type GaN contact layer 410, and the p-side electrode 126 or the like is formed on the p-type GaN contact layer 414 using deposition or the like.

The n-side electrode 127 is formed of, for example, metal such as Ti/Al, Al, Ti/Mo/Au, Ti/Pt/Au or the like capable of forming ohmic contact with the n-type GaN contact layer 410.

The p-side electrode 126 is formed of, for example, metal such as Ni/Pt/Au, Ni/Pt or the like capable of forming ohmic contact with the p-type GaN contact layer 414.

Figure 11:
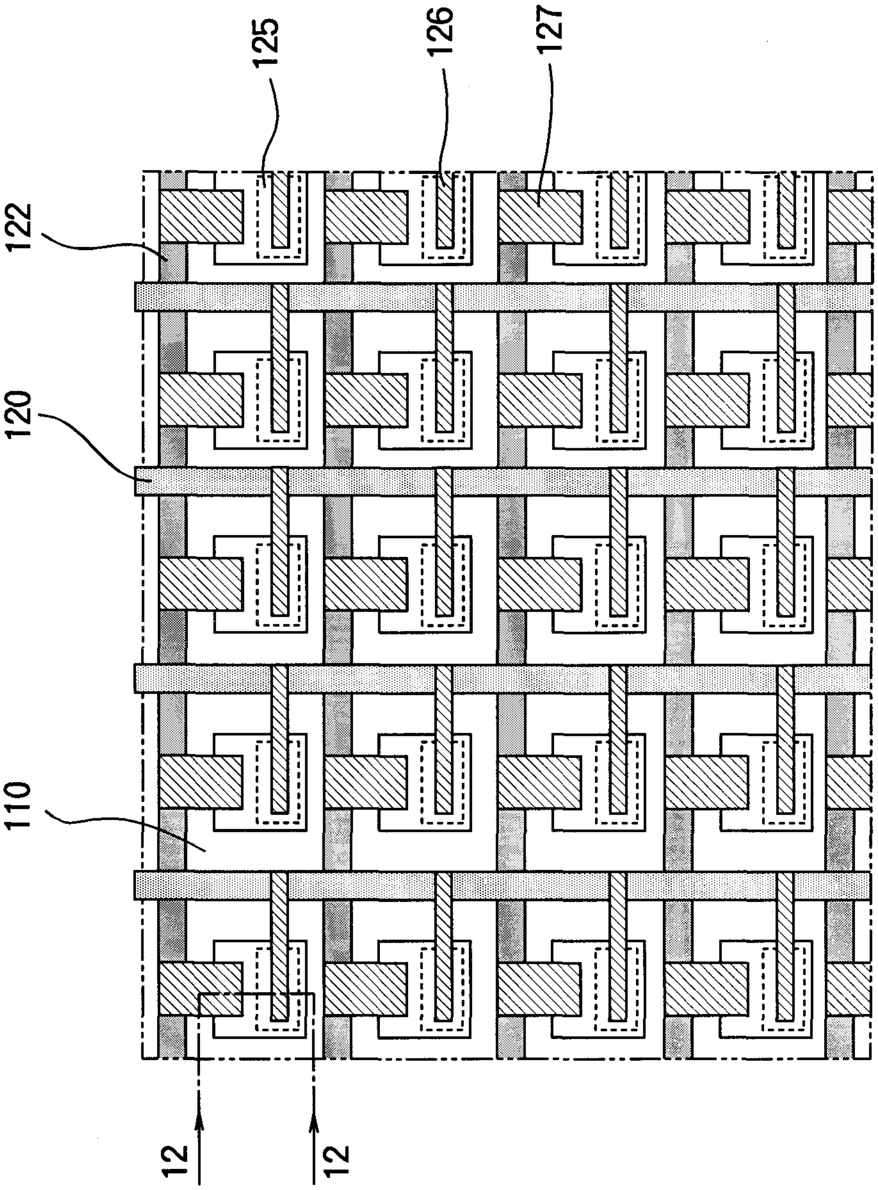
FIG. 11 is a plan view schematically showing another example of the configuration including light emitting elements constituting a part of the light emitting element array shown in FIG. 1 and electrodes and wirings connected to the light emitting elements.
Figure 12:
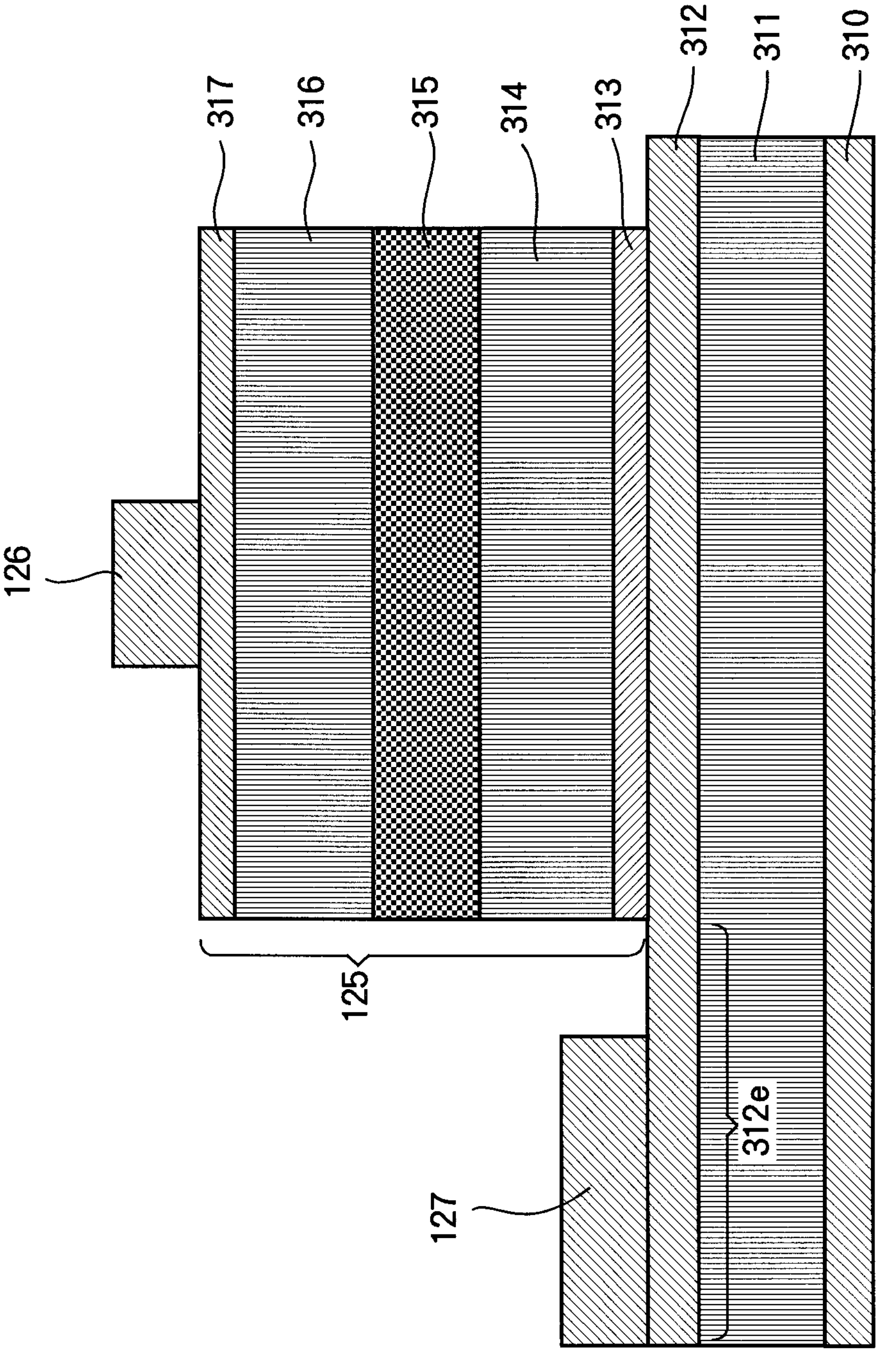
FIG. 12 is a sectional view taken along line 12-12 of FIG. 11.

The light emitting elements of the semiconductor thin film constituting the light emitting element array and the electrodes and wirings connected to the light emitting elements can be configured as shown in FIGS. 11 and 12, instead of the configuration shown in FIGS. 7 and 8. FIG. 11 is a plan view schematically showing another configuration including 20 light emitting elements (4 rows and 5 columns) that constitute a part of the light emitting element array 111, 113 or 115 and the electrodes and the wirings connected to the light emitting elements. In FIG. 11, the light emitting elements on the right-most column are partially illustrated. FIG. 12 is a sectional view taken along line 12-12 shown in FIG. 11.

The p-side wirings 120 and n-side wirings 122 respectively extend in the column direction and in the row direction in FIG. 11, although the p-side wiring 120 and n-side wiring 122 respectively extend in the row direction and in the column direction in FIG. 7.

The configuration shown in FIGS. 11 and 12 can be formed by performing, for example, mesa etching, deposition or the like on the semiconductor thin film 210 shown in FIG. 6.

In FIGS. 11 and 12, reference numeral 125 indicates a light emitting region formed in the semiconductor thin film 210. A p-side electrode 126 and an n-side electrode 127 are connected to the light emitting region 125. A p-side wiring 120 is connected to the p-side electrode 126, an n-side wiring 122 is connected to the n-side electrode 127. In the configuration shown in FIG. 11, the p-side wiring 120 and the n-side wiring 122 extend in directions perpendicular to each other, and are arranged in a lattice, as was described with reference to FIG. 7. As is the case with the configuration shown in FIG. 7, the p-side wiring 120 and the n-side wiring 122 arranged in a lattice function to prevent the diffusion of the light emitted by the light emitting elements disposed on the back side thereof.

The difference between the light emitting element shown in FIG. 12 and the light emitting element shown in FIG. 8 is that the n-side electrode 127 is disposed on only one side of each light emitting region 125 in FIG. 12, although the n-side electrode 127 is disposed on both sides of each light emitting region 125 in FIG. 8. In the case where the size of the light emitting region 125 is small, the configuration shown in FIG. 12 in which the n-side electrode 127 is disposed on only one side of each light emitting region 125 provides simpler structure than the configuration shown in FIG. 8, and exhibits better characteristics.

Figure 13:
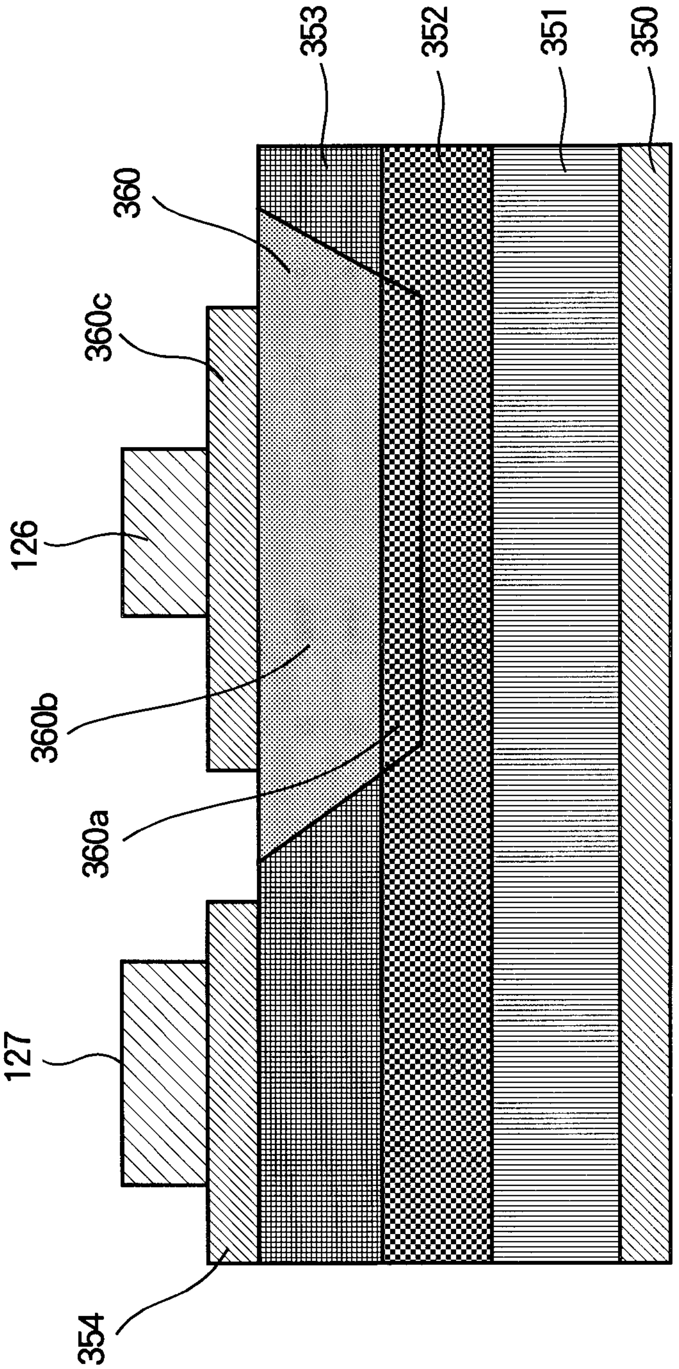
FIG. 13 is a sectional view schematically showing an example of a light emitting element formed by selectively diffusing impurities into a semiconductor thin film to form a light emitting element structure.

FIG. 13 is a sectional view schematically showing an example of a light emitting element formed by selectively diffusing impurities into the semiconductor thin film to form a light emitting element structure.

In the above described examples shown in FIGS. 8, 10 and 12, the light emitting element structure is formed by mesa etching. In contrast, in the example shown in FIG. 13, the light emitting element structure is formed by selective diffusion of impurities.

In FIG. 13, reference numerals 350 through 354 indicate, for example, n-type semiconductor layers. To be more specific, the reference numeral 350 indicates an n-type GaAs layer. An n-type $Al_xGa_{1-x}As$ cladding layer 351 is formed on the n-type GaAs layer 350. An n-type $Al_yGa_{1-y}As$ active layer 352 is formed on the n-type $Al_xGa_{1-x}As$ cladding layer 351. An n-type AlGaAs cladding layer 353 is formed on the n-type $Al_yGa_{1-y}As$ active layer 352. An n-type GaAs contact layer 354 is formed on the n-type AlGaAs cladding layer 353. A p-type impurity diffusion region 360 is formed by diffusing, for example, Zn as p-type impurities into the n-type semiconductor layers 352 through 354. The p-type impurity region 360 includes a p-type impurity diffusion region 360*a* where p-type impurities (Zn) are diffused into the active layer 352, a p-type impurity diffusion region 360*b* where p-type impurities are diffused into the cladding layer 353, and a p-side contact layer 360*c* where p-type impurities are diffused into the contact layer 354.

Figure 14:
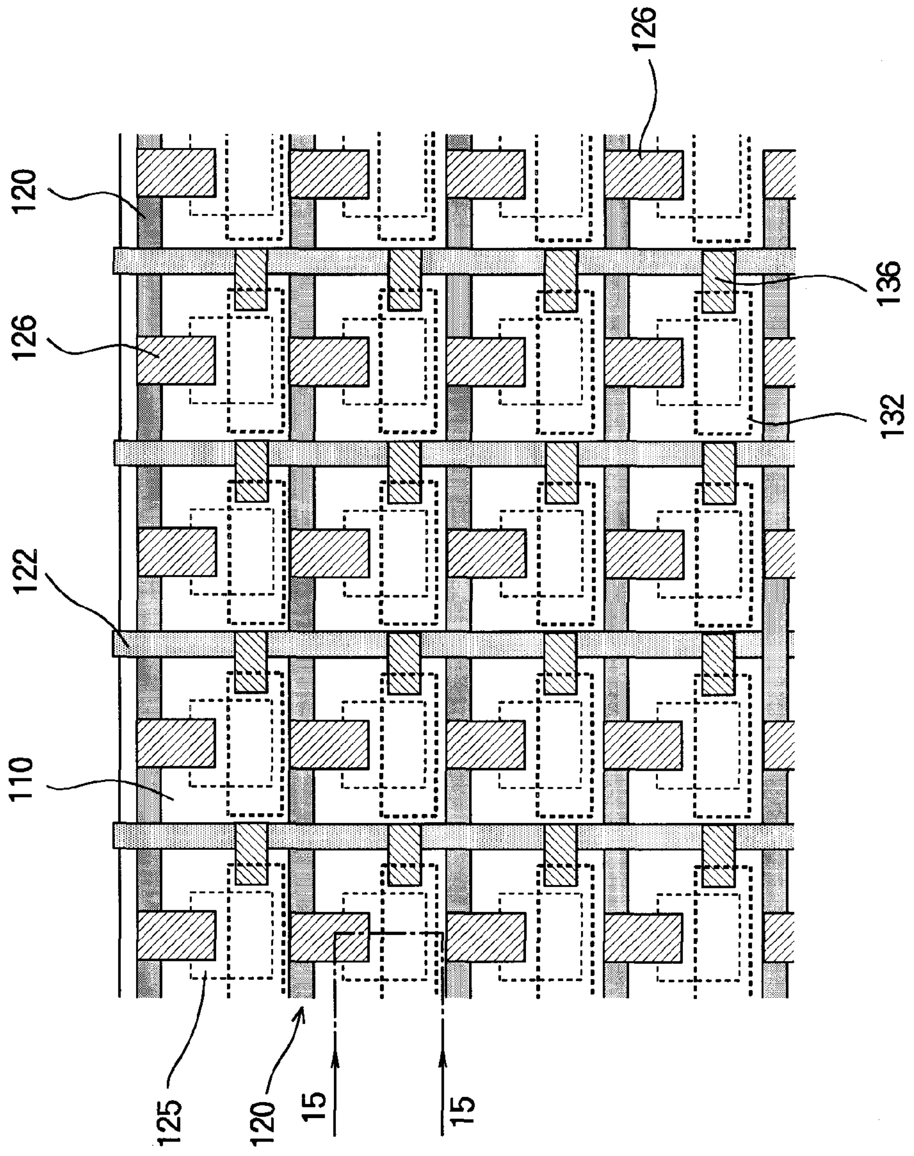
FIG. 14 is a plan view schematically showing still another example of the configuration including light emitting elements constituting a part of the light emitting element array shown in FIG. 1 and electrodes and wirings connected to the light emitting elements.
Figure 15:
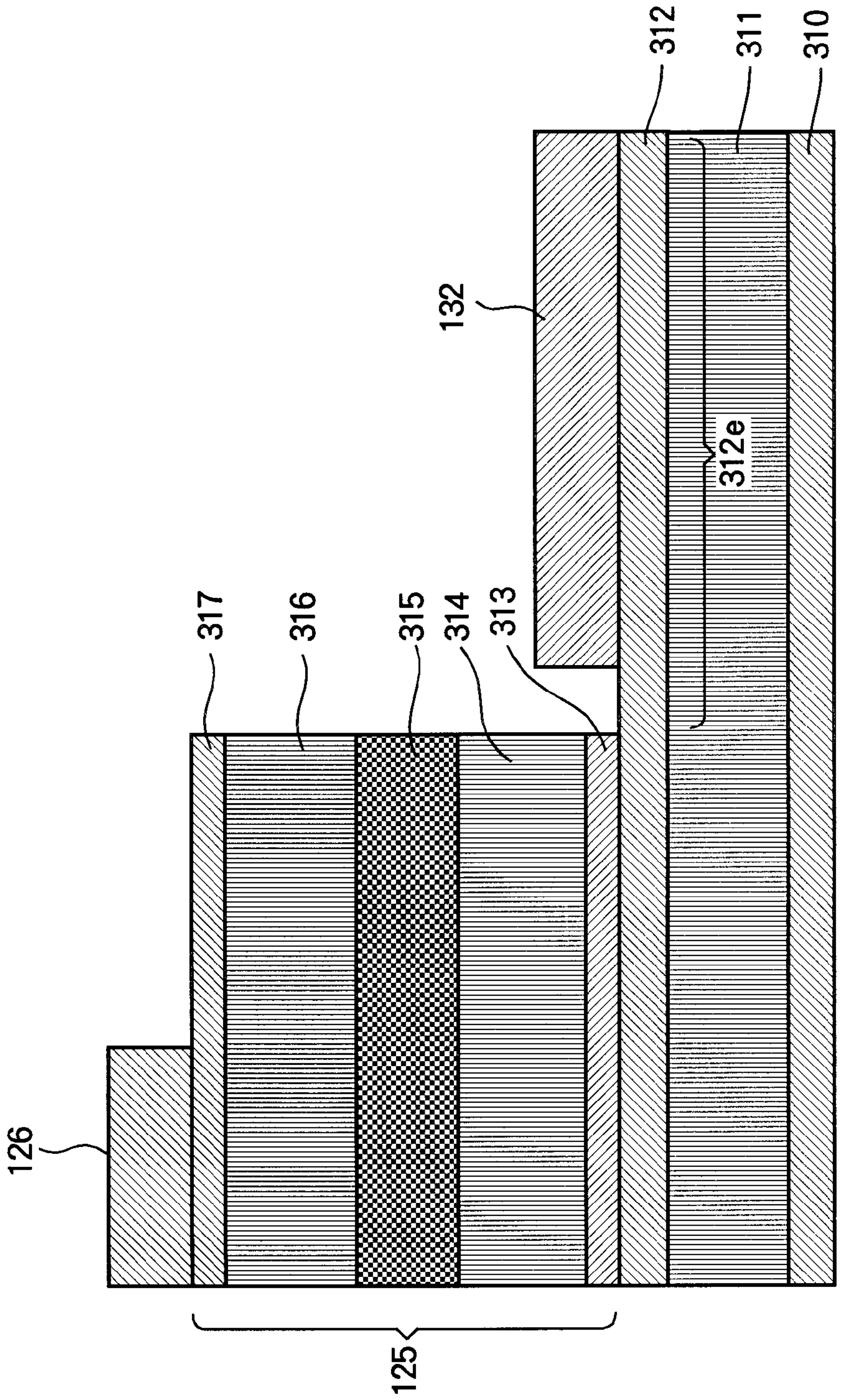
FIG. 15 is a sectional view taken along line 15-15 shown in FIG. 14.

The light emitting elements of the semiconductor thin film constituting the light emitting element array and the electrodes and wirings can be configured as shown in FIGS. 14 and 15 instead of the configuration shown in FIGS. 11 and 12. FIG. 14 is a plan view schematically showing still another configuration including 20 light emitting elements (4 rows and 5 columns) that constitute a part of the light emitting element array 115 shown in FIG. 1 and the electrodes and wirings connected to the light emitting elements. In FIG. 11, the light emitting elements on the rightmost column are partially illustrated. FIG. 15 is a sectional view taken along line 15-15 shown in FIG. 14.

In the configuration shown in FIG. 14, an n-side contact layer 312 is covered with a transparent electrode 132, an n-side connection wiring 136 is provided on a position distanced from the light emitting region 125, and is connected to the n-side wiring 122. A p-side electrode 126 is formed on a p-side contact layer 317, and is connected to the p-side wiring 120.

The configuration shown in FIGS. 14 and 15 can be formed by performing, for example, mesa etching, deposition or the like on the semiconductor thin film 210 shown in FIG. 6.

In FIGS. 14 and 15, reference numeral 125 indicates the light emitting region formed in the semiconductor thin film 210. The p-side electrode 126 and the n-side electrode (the transparent electrode) 132 are connected to the light emitting region 125. The p-side wiring 120 is connected to the p-side electrode 126, the n-side wiring 122 is connected to the n-side electrode 132 via the n-side connection wiring 136. The p-side wiring 120 and the n-side wiring 122 extend in directions perpendicular to each other, and are arranged in a lattice. In the configuration shown in FIG. 14, the p-side wiring 120 and the n-side wiring 122 arranged in a lattice function to prevent the diffusion of the light emitted by the light emitting elements disposed on the back side thereof.

The difference between the light emitting element shown in FIG. 15 and the light emitting element shown in FIG. 12 is as follows. In FIG. 12, the n-side electrode 127 is disposed on the exposed portion 312*e* of the n-side contact layer 312. In contrast, in FIG. 15, the transparent electrode 132 (instead of the n-side electrode 127) is formed to cover the exposed portion 312*e* of the n-side contact layer 312 and protrudes therefrom. Further, the n-side connection wiring 136 is connected to the protruding portion of the transparent electrode 132. In this configuration, the exposed portion 312*e* of the n-side contact layer 312 is covered by the transparent electrode 132 and is connected to the n-side connection wiring 136 at a region distanced from the light emitting region 125 of the light emitting element. Therefore, the n-side connection wiring 136 does not interfere with the light emitted by the other light emitting element disposed on the back surface (downside in FIG. 15) and spread around the light emitting region 125, and therefore the efficiency of output of light can be enhanced.

Similarly, it is also possible to form the p-side electrode 126 as a transparent electrode protruding to a region distanced from the light emitting region 125 of the light emitting element, and to connect the p-side wiring 120 to the transparent electrode.

In the above described example, although the light emitting elements of the light emitting element array are aligned with each other in the direction perpendicular to the light emitting element array, the light emitting elements can be arranged so as to be shifted in a planar direction parallel to the surfaces of the light emitting element arrays.

Figure 16:
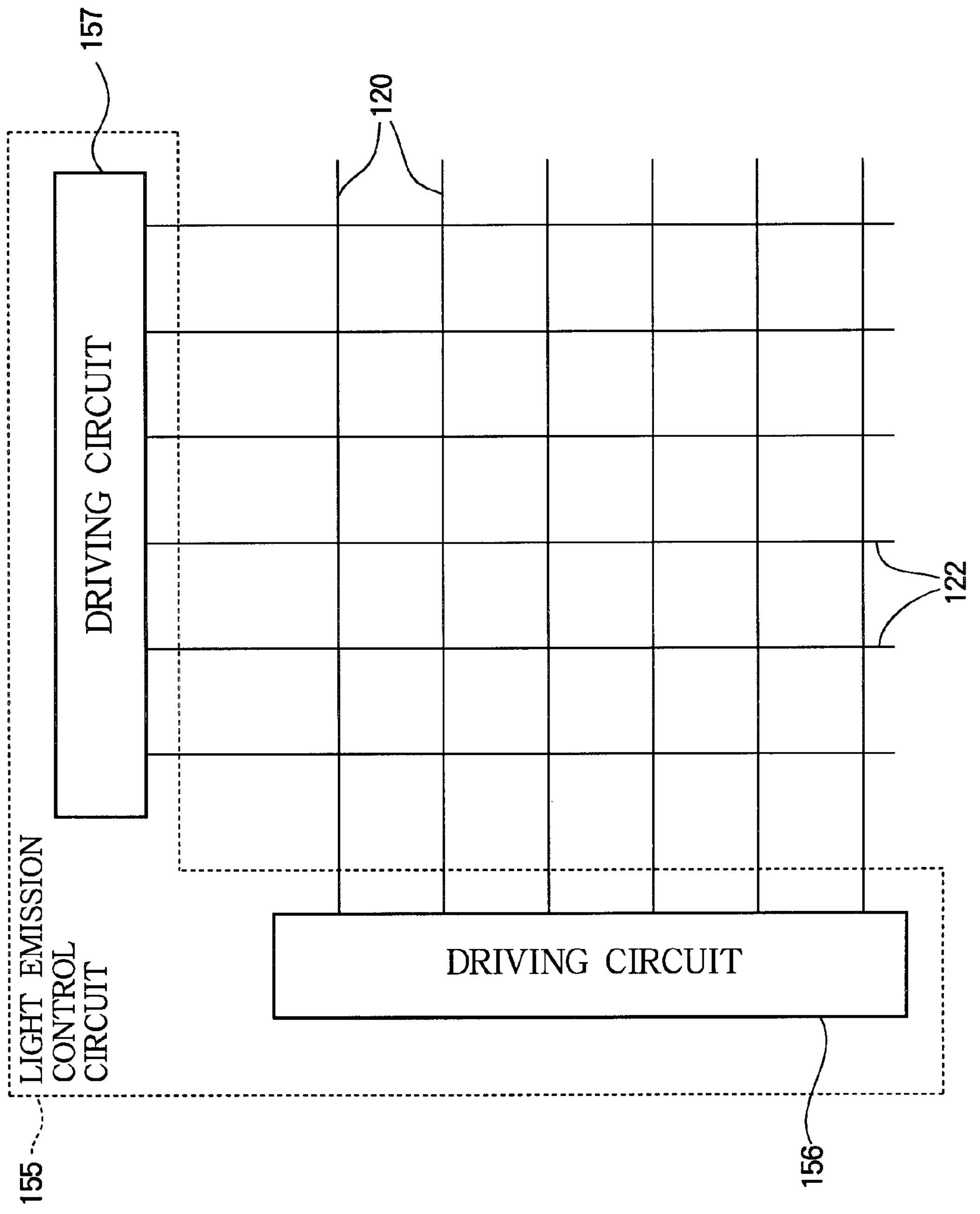
FIG. 16 is a schematic wiring diagram showing a relationship between wirings of a light emitting element array unit and a light emission control circuit.

The wirings 120 and 122 are connected to a first driving circuit 156 and a second driving circuit 157 of a light emission control circuit 155 via not shown connectors or the like, for example, as shown in FIG. 16. FIG. 16 shows a control system of a display device, which is the same as a control system of a light source device in the case where the light emitting panel of this embodiment is applied to the light source device. The driving circuits 156 and 157 can selectively apply voltage to one of the wirings 120 and one of the wirings 122 so as to drive one of the light emitting elements of the light emitting element array to emit light. These driving circuits 156 and 157 can be provided on each of the substrates.

The first and second driving circuits 156 and 157 are provided separately on each of the light emitting element arrays 111, 113 and 115, and therefore all light emitting elements of the light emitting element arrays 111, 113 and 115 can be individually turned off and turned on.

However, it is also possible to control the respective light emitting element arrays 111, 113 and 115 partially or entirely by connecting the light emitting elements of the light emitting element arrays 111, 113 and 115 in parallel or series according to various kinds of operations, and various kinds of modifications can be made.

Figure 17:
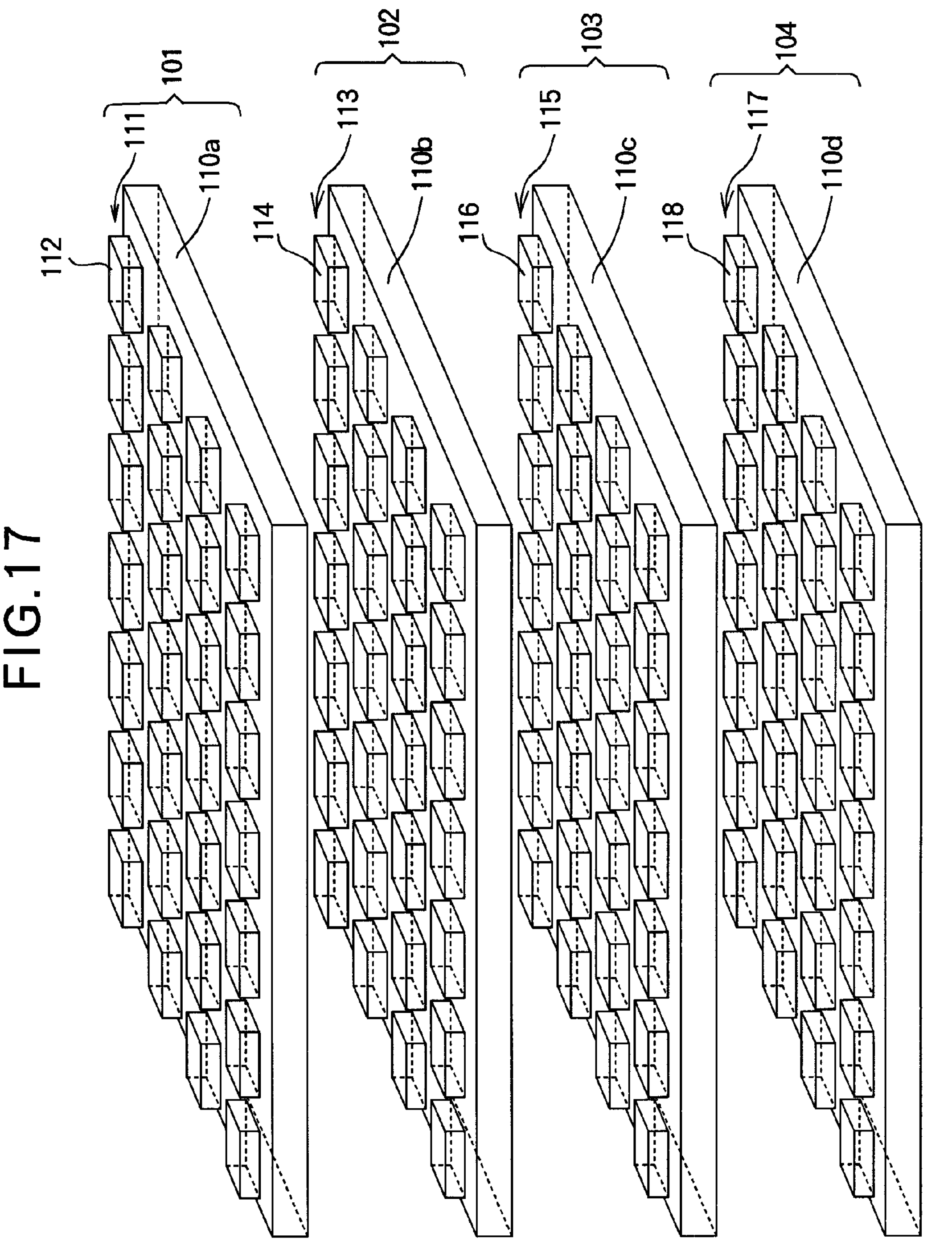
FIG. 17 is an exploded perspective view schematically showing further example of the configuration of the light emitting panel of the display device according to Embodiment 1 of the present invention.

Although the number of light emitting element array units shown in FIG. 1 is 3, the number of the light emitting element array units is not limited to 3. For example, it is possible to employ a configuration in which four light emitting element array units 101, 102, 103 and 104 overlapped with each other as shown in FIG. 17. It is also possible to employ a configuration in which five or more light emitting element array units are overlapped with each other. Further, it is also possible to employ a configuration in which two light emitting element array unit 101 and 102 are overlapped with each other as shown in FIG. 18.

As shown in FIG. 17, when the four light emitting unit element arrays 101, 102, 103 and 104 are used, it is possible that the light emitting elements 112, 114, 116 and 118 (of the light emitting element array 111, 113, 115 and 117) are formed of the semiconductor materials that emit lights having different wavelengths. Since the four light emitting element arrays 101, 102, 103 and 104 emit lights having different wavelengths, it becomes possible to widen the range of color reproduction in the case where the light emitting panel is used as a color display device.

Further, four light emitting element array units can be configured so that three light emitting element array units emit blue, green and red lights, and one light emitting element array unit emits light of the same color system as (i.e., whose wavelength is the same as or close to) one of the lights of the three light emitting element array units. In the case where the lights have same wavelengths, it becomes possible to increase the light intensity of a particular color.

Figure 18:
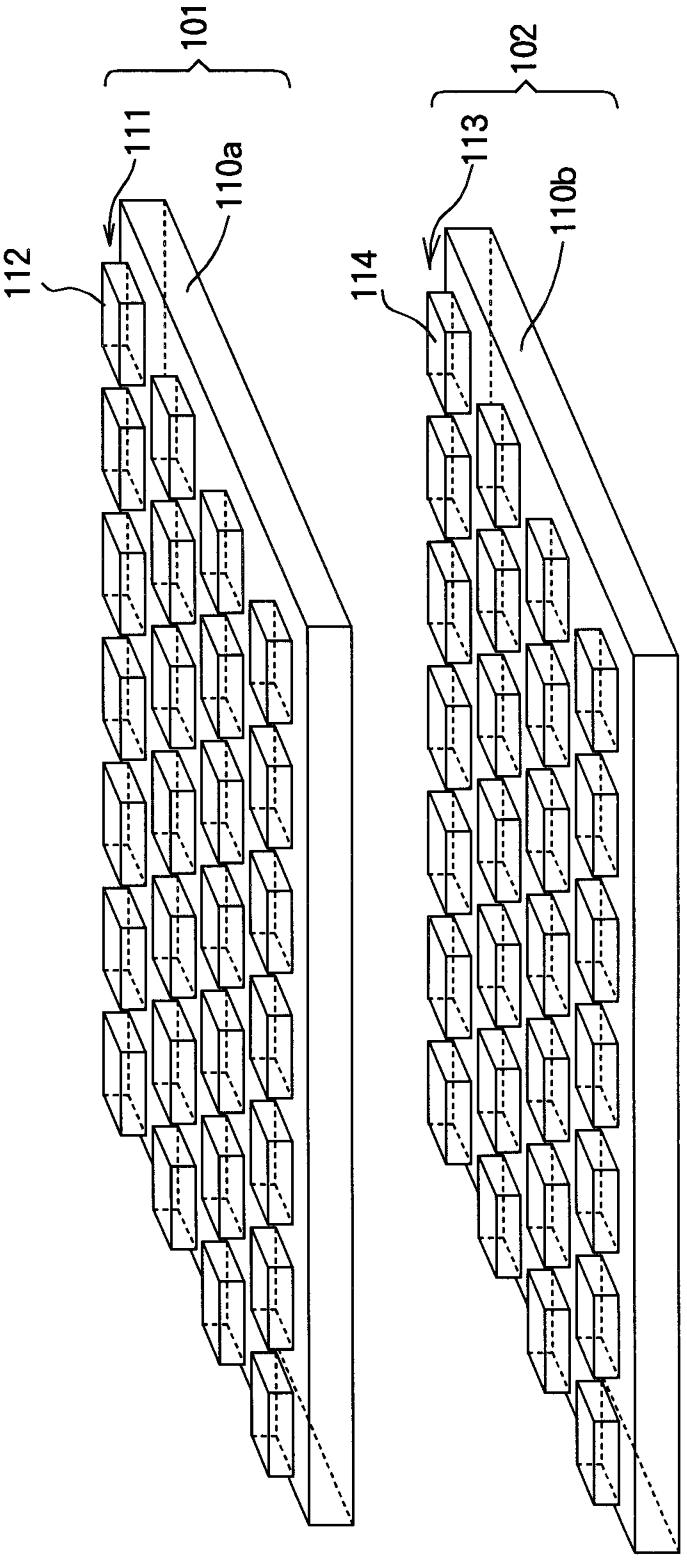
FIG. 18 is an exploded perspective view schematically showing still further example of the configuration of the light emitting panel of the display device according to Embodiment 1 of the present invention.

As shown in FIG. 18, when the display device includes two light emitting element array units, it is possible to use the light emitting element array units emitting lights of different color systems selected among blue, green and red. Alternatively, it is possible to use the light emitting element array units that emit lights of the same color system and having different wavelengths.

Further, the light emitting element of the light emitting element array unit can be formed of a material that emits light other than visible light. For example, the light emitting element can be formed of a material including InGaAsP or the like that emits light having long wavelength, or a material including GaN, AlGaN, ZnO or the like that emits light having short wavelength. Particularly, in the case where the light emitting element is formed of a material that emits light including the wavelength within a ultraviolet range, a display device can be providing with a phosphor layer on a surface through which ultraviolet rays are emitted.

As described above, according to Embodiment 1 of the present invention, the light emitting panel includes a plurality of light emitting element array units each of which includes a plurality of light emitting elements arranged in an imaginary plane, and the light emitting elements of the respective light emitting element array units emit lights having different wavelengths. Therefore, the light emitting elements can be arranged in high density, and the light emitting panel with high pixel density can be accomplished. Further, in the manufacturing process of the light emitting panel, it becomes possible to manufacture respective light emitting element array units separately, and to assemble the light emitting element array units with each other, with the result that the product yield rate can be enhanced.

Embodiment 2

Figure 19:
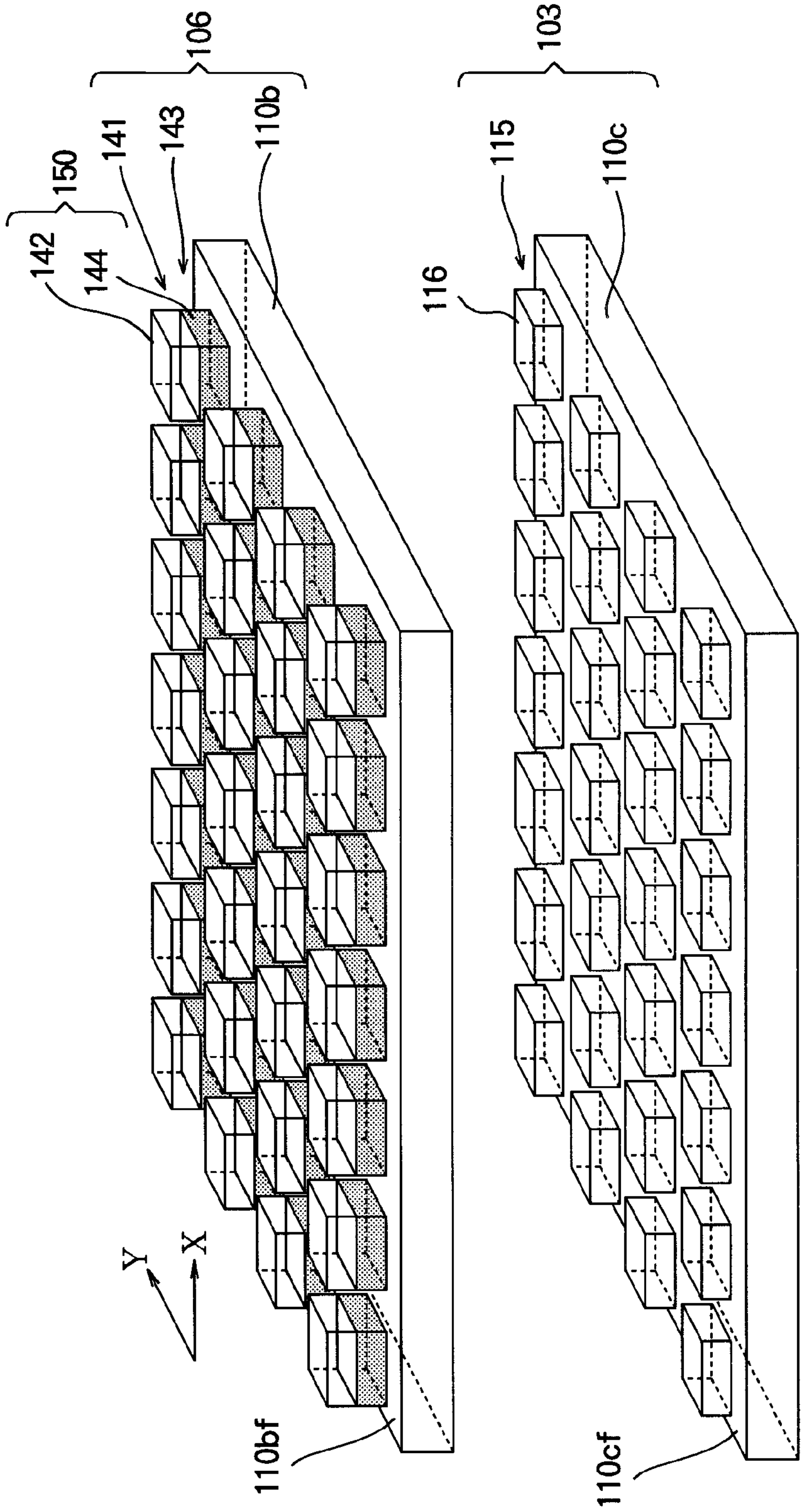
FIG. 19 is an exploded perspective view schematically showing an example of a configuration of a light emitting panel of a display device according to Embodiment 2 of the present invention.

FIG. 19 is an exploded perspective view schematically showing an example of a configuration of a light emitting panel of a display device according to Embodiment 2 of the present invention.

The light emitting panel shown in FIG. 19 is generally the same as the light emitting panel shown in FIG. 1, but different in the following respects.

That is, the light emitting panel shown in FIG. 19 includes a substrate 110*b* and a plurality of light emitting element complexes 150 arranged on a surface 110*bf* of the substrate 110*b*. Each light emitting element complex 150 has laminated semiconductor layers including a plurality of light emitting regions. To be more specific, each light emitting element complex 150 includes a first light emitting element 144 formed of the surface 110*bf* of the substrate 100*b*, and a second light emitting element 142 formed on the first light emitting element 141.

A plurality of light emitting element complexes 150 are arranged two-dimensionally in a matrix at constant intervals in the column direction (Y direction) and row direction (X direction). Therefore, a plurality of first light emitting elements 144 are arranged two-dimensionally in a matrix at constant pitch in an imaginary plane parallel to the substrate 110*b* in the column direction (Y direction) and the row direction (X direction), and constitute a light emitting element array 143. Similarly, a plurality of second light emitting elements 142 are arranged two-dimensionally in a matrix at constant pitches in an imaginary plane parallel to the substrate 110*b* in the column direction (Y direction) and the row direction (X direction), and constitute a light emitting element array 145. The imaginary plane in which the light emitting elements 144 are arranged and the imaginary plane in which the light emitting elements 142 are arranged are in different positions (i.e., positions of different heights or distances from the substrate 110*b*).

The light emitting elements 142 of the light emitting element array 141, the light emitting elements 144 of the light emitting element array 143, and the light emitting elements 116 of the light emitting element array 115 emit lights having different wavelengths (i.e., different from one light emitting element array to another). For example, the light emitting elements 142 of the light emitting element array 141 emit blue light, the light emitting elements 144 of the light emitting element array 143 emit green light, and the light emitting elements 116 of the light emitting element array 115 emit red light (as is the case with the light emitting element 116 shown in FIG. 1). In other words, the light emitting element emitting light having shorter wavelength is provided closer to the surface of the light emitting panel, with the result that the attenuation of light from the light emitting element disposed farther from the surface of the light emitting panel can be reduced, as was described in Embodiment 1.

The light emitting elements 142 and 144 are aligned with each other in the direction perpendicular to the substrate 110*b*, i.e., perpendicular to the light emitting element arrays 141 and 143. Further, the light emitting elements 142 and 144 are aligned with the light emitting elements 116 in the direction perpendicular to the substrates 110*b* and 110*c*, i.e., perpendicular to the light emitting element arrays 141, 143 and 115.

Figure 20:
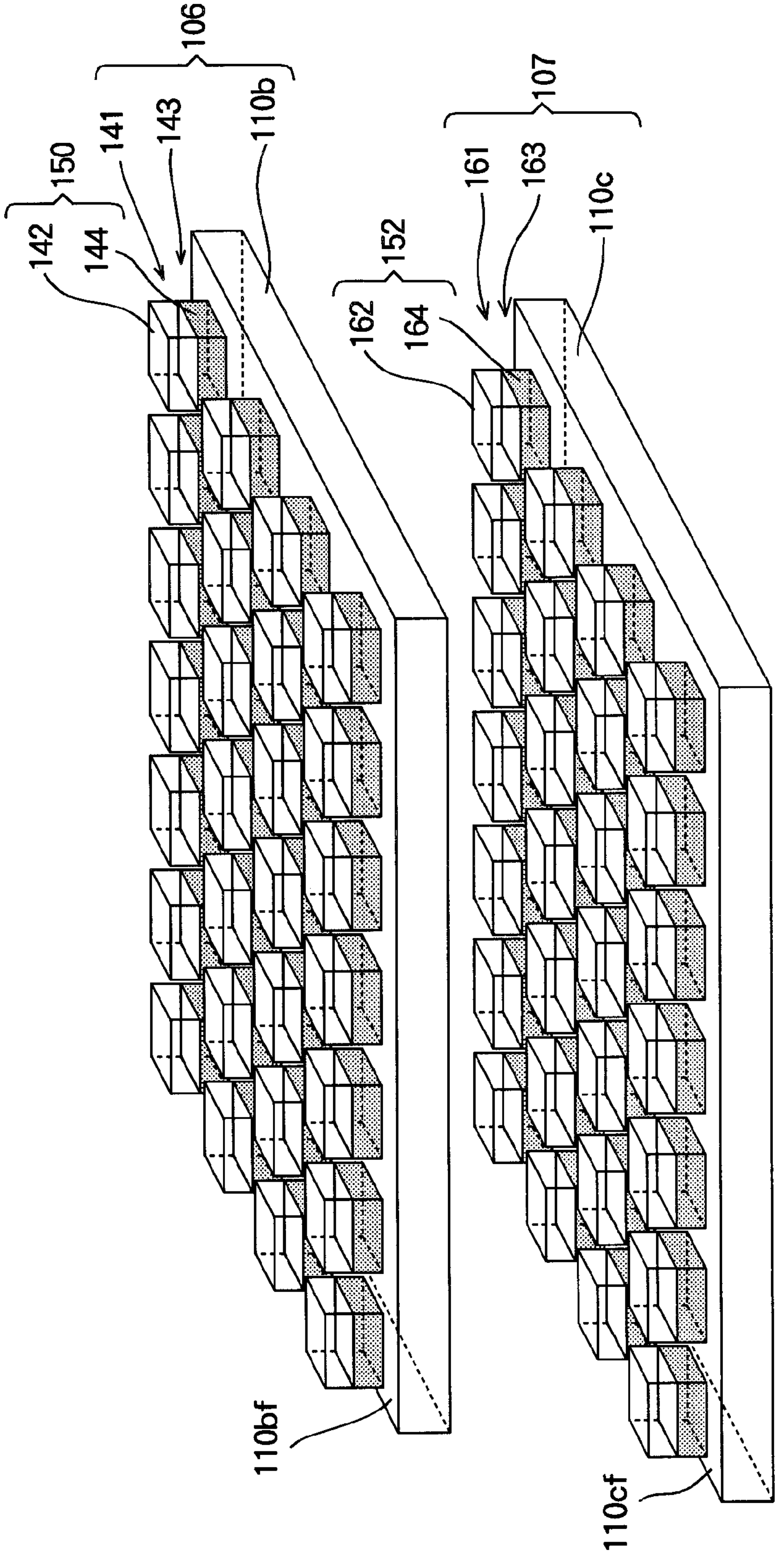
FIG. 20 is an exploded perspective view schematically showing another example of the configuration of the light emitting panel of the display device according to Embodiment 2 of the present invention.

FIG. 20 is an exploded perspective view schematically showing another example of the configuration of the light emitting panel of the display device according to Embodiment 2 of the present invention.

In the above described example shown in FIG. 19, one light emitting element array 115 is provided on the surface 110*cf* of the substrate 110*c*, and two light emitting element arrays 141 and 143 are provided on the surface 110*bf* of the substrate 110*b*. In contrast, in the example shown in FIG. 20, two light emitting element arrays 141 and 143 (composed of laminated light emitting elements 141 and 143) are provided on the surface 110*bf* of the substrate 110*b* (as in the example shown in FIG. 19), and two light emitting element arrays 161 and 163 (composed of laminated light emitting elements 162 and 164) are provided on the surface 110*cf* of the substrate 110*c*. The light emitting elements 162 and 164 constitute a light emitting element complex 152.

The substrate 110*b*, the light emitting element arrays 141 and 143 constitute the light emitting element array unit 106. The substrate 110*c*, the light emitting element arrays 161 and 163 constitute the light emitting element array unit 107.

The light emitting element array 141, 143, 161 and 163 are aligned with each other in the direction perpendicular to the arrangement planes of the light emitting element arrays 141, 143, 161 and 163.

Further, in this example, it is preferable that the light emitting element array emitting light having shorter wavelength is provided closer to the surface of the light emitting panel.

Figure 21:
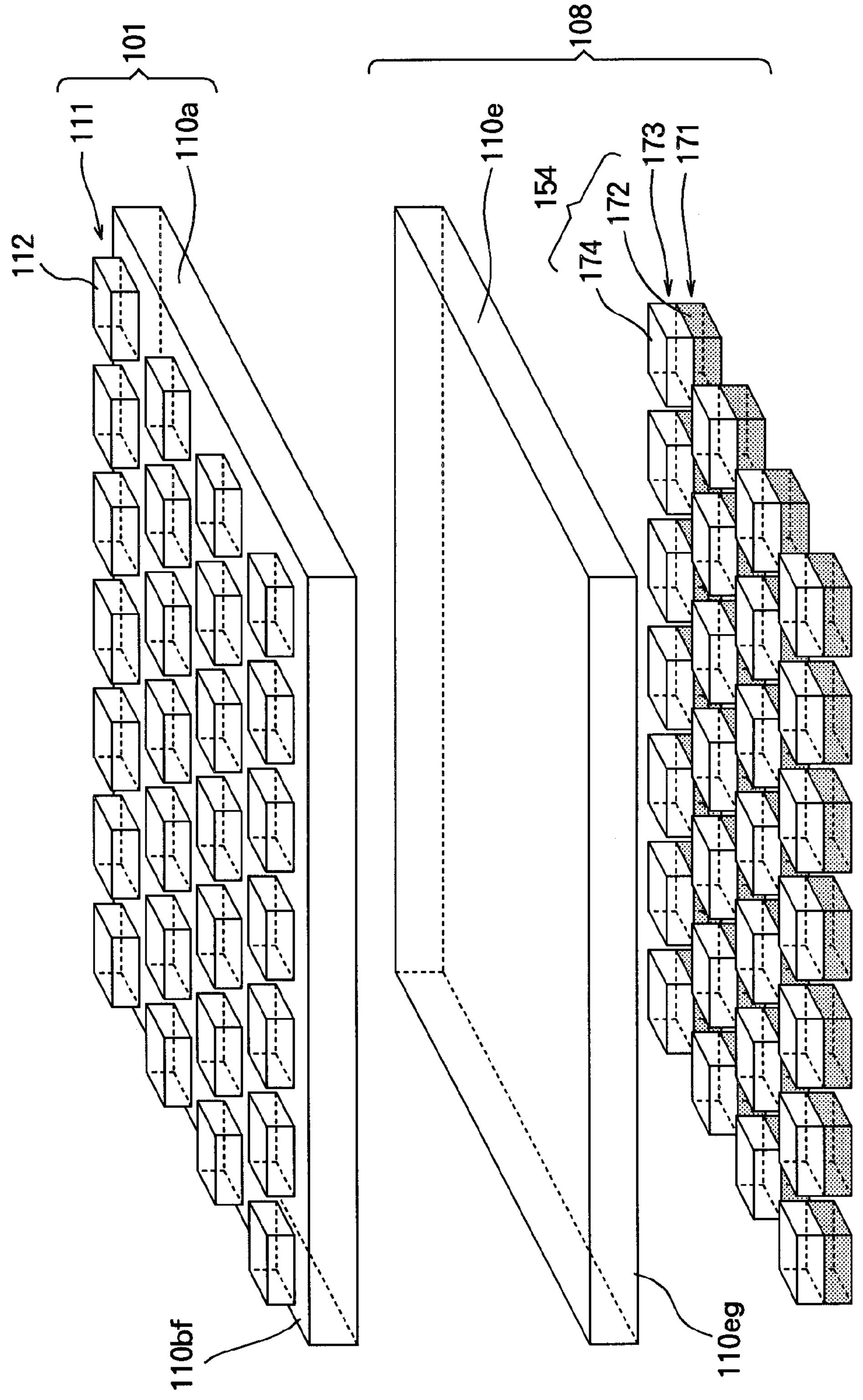
FIG. 21 is an exploded perspective view schematically showing still another example of the configuration of the light emitting panel of the display device according to Embodiment 2 of the present invention.

FIG. 21 is an exploded perspective view schematically showing still another example of the configuration of the light emitting panel of the display device according to Embodiment 2 of the present invention.

The light emitting panel shown in FIG. 21 includes a first light emitting element array unit 101 and a second light emitting element array 102.

The first light emitting element array unit 101 is the same as the light emitting element array unit 101 shown in FIG. 1.

The second light emitting element array unit 108 includes a substrate 110*e* and a plurality of light emitting element complexes 154 arranged on a back surface 110*eg* of the substrate 110*e*. Each light emitting element complex 154 includes two light emitting elements laminated on each other. To be more specific, each light emitting element complex 154 includes a first light emitting element 174 formed on the back surface 110*eg* of the substrate 110*e*, and a second light emitting element 172 formed on the first light emitting element 174 (i.e., formed below the first light emitting element 174 in FIG. 21).

The light emitting element complexes 154 are arranged two-dimensionally in a matrix. Therefore, a plurality of light emitting elements 174 are arranged two-dimensionally in a matrix in an imaginary plane parallel to the substrate 110*e* so as to form a light emitting element array 173. Similarly, a plurality of light emitting elements 172 are arranged two-dimensionally in a matrix in an imaginary plane parallel to the substrate 110*e* so as to form a light emitting element array 171. The imaginary plane in which the light emitting elements 174 are arranged and the imaginary plane in which the light emitting elements 172 are arranged are in different positions (i.e., positions of different distances from the substrate 110*e*).

In the example shown in FIG. 21, it is preferable to arrange the light emitting element arrays in such a manner that the light emitting element array emitting light having shorter wavelength is provided closer to the surface of the light emitting panel.

For example, in the case where the light is emitted from the upside of FIG. 21, the light emitting element 112 of the light emitting element array 111 emits blue light, the light emitting element 174 of the light emitting element array 173 emits green light, and the light emitting element 172 of the light emitting element array 171 emits red light.

The substrate 110*e* is preferably configured to have transparency to transmit lights emitted by the light emitting elements 174 and 172 provided on the back surface 110*eg* thereof. In this respect, the substrate 110*e* is needed to have the same characteristic as the substrate 110*a*.

Figure 22:
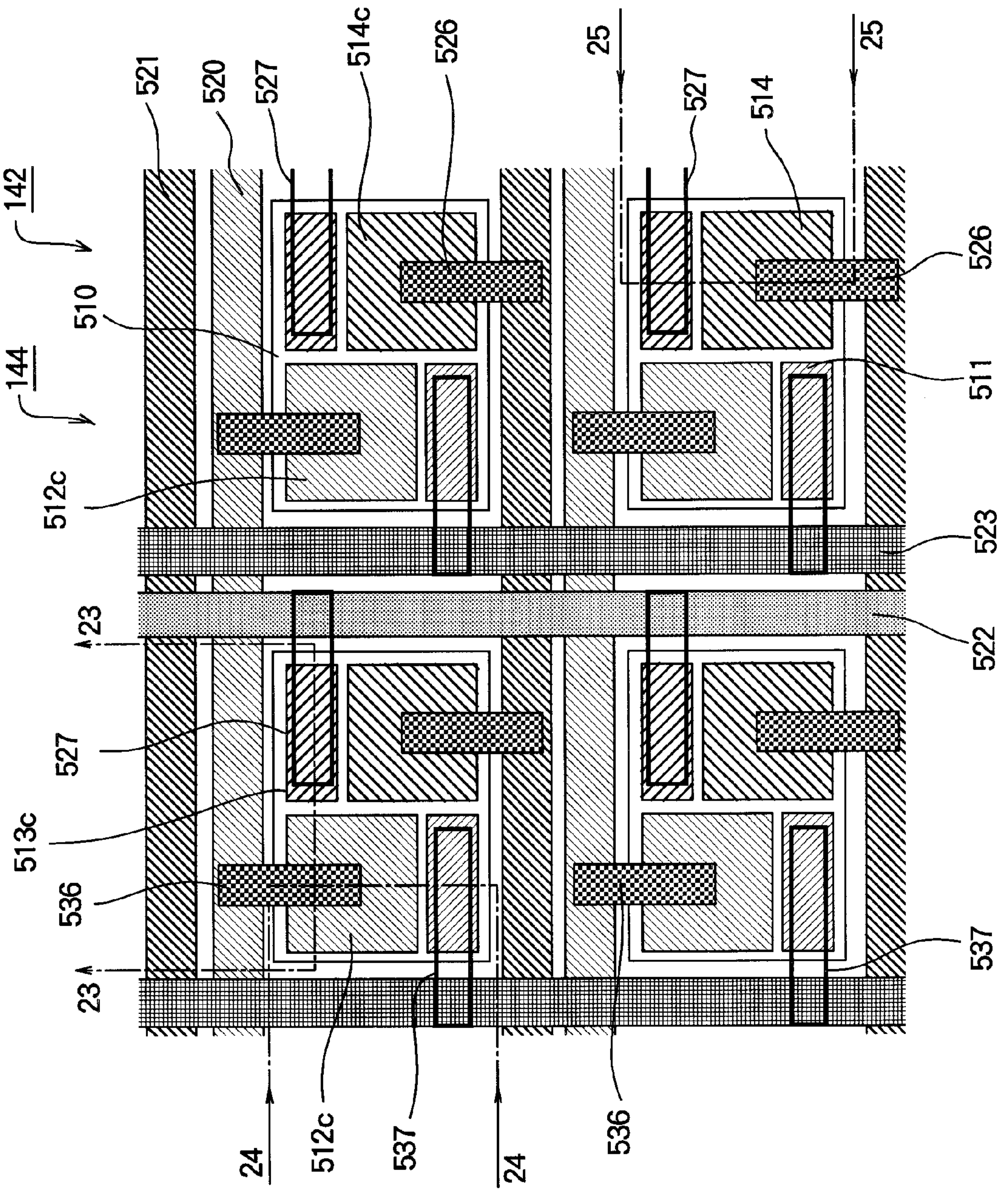
FIG. 22 is a plan view schematically showing an example of a configuration including light emitting elements constituting a part of the light emitting element array shown in FIG. 20 and electrodes and wirings connected to the light emitting element.
Figure 23:
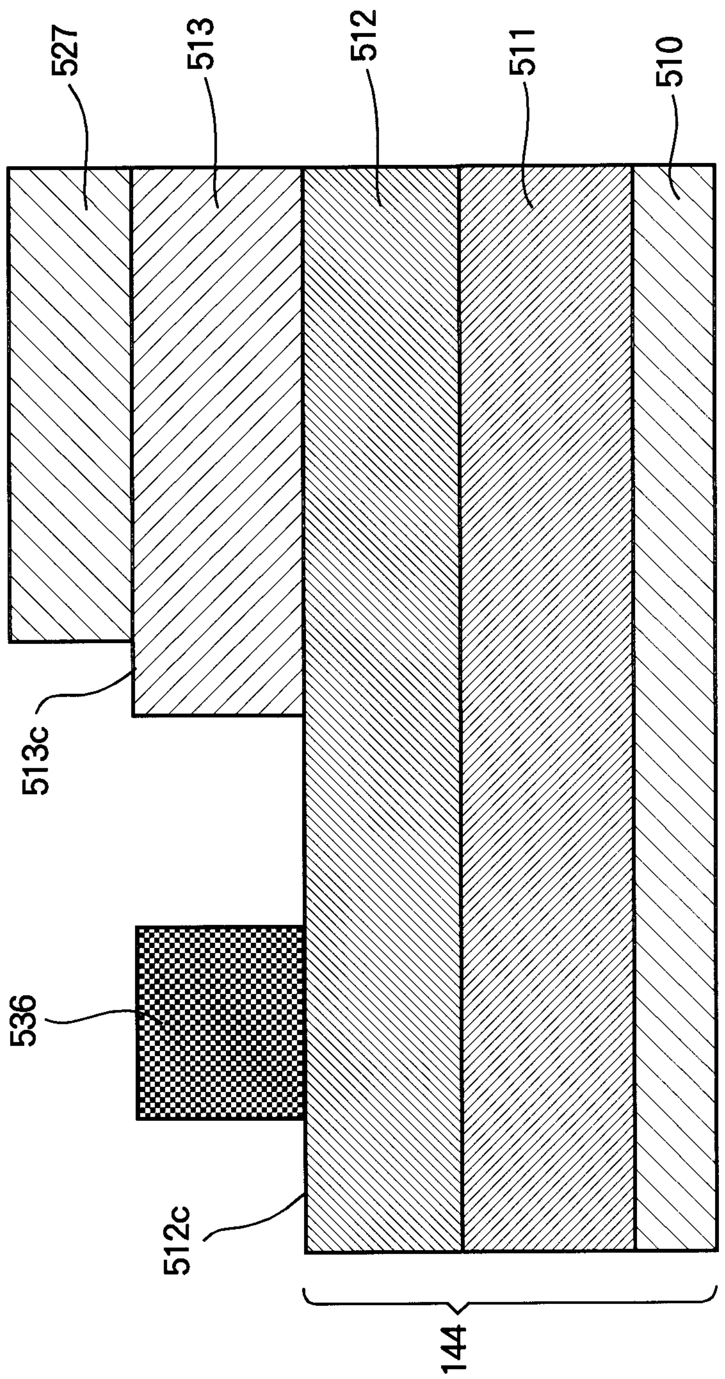
FIG. 23 is a sectional view taken along line 23-23 shown in FIG. 22.
Figure 24:
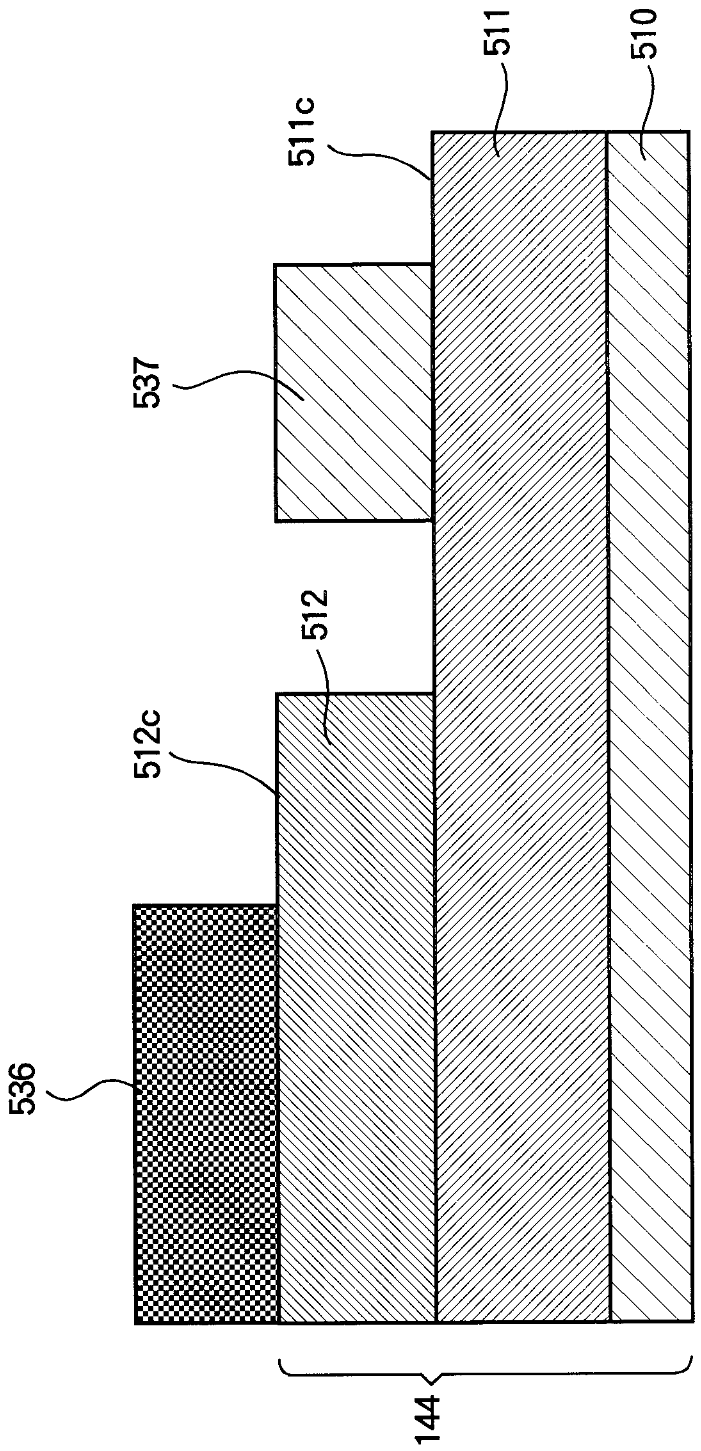
FIG. 24 is a sectional view taken along line 24-24 shown in FIG. 22.
Figure 25:
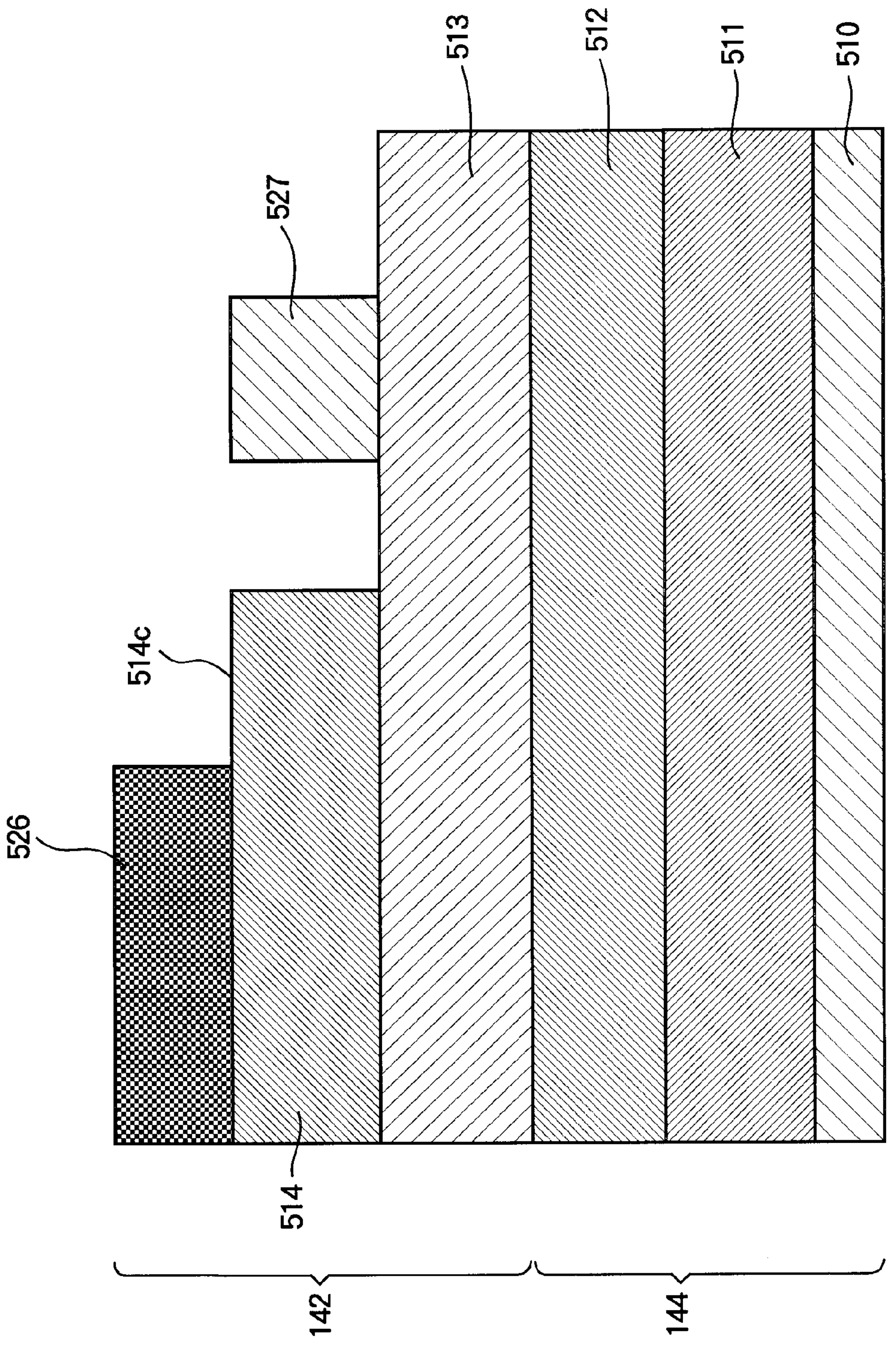
FIG. 25 is a sectional view taken along line 25-25 shown in FIG. 22.

FIG. 22 is a plan view schematically showing a configuration including four light emitting elements 142 constituting a part of the light emitting element array 141, four light emitting elements 144 constituting a part of the light emitting element array 143 shown in FIG. 19, and electrodes and wirings connected to the light emitting elements. FIG. 23 is a sectional view taken along line 23-23 shown in FIG. 22. FIG. 24 is a sectional view taken along line 24-24 shown in FIG. 22. FIG. 25 is a sectional view taken along line 25-25 shown in FIG. 22.

The configuration shown in FIGS. 22 through 25 can be formed by, for example, performing mesa etching or deposition or the like on the semiconductor thin film layer including two laminated light emitting layers.

In the configuration shown in FIGS. 22 through 25, a bonding layer 510 is a lowermost layer of the light emitting element complex 150 shown in FIG. 19, and functions to bond the light emitting element complex 150 to the substrate 110*b*. Reference numeral 511 indicates an n-type semiconductor layer of the light emitting element 144 shown in FIG. 19. The uppermost layer of the n-type semiconductor layer 511 constitutes a contact layer 511*c* connected to a second n-side electrode 537. Reference numeral 512 indicates a p-type semiconductor layer of the light emitting element 144 shown in FIG. 19. The uppermost layer of the p-type semiconductor layer 512 constitutes a contact layer 512*c* connected to a second p-side electrode 536. Reference numeral 513 indicates an n-type semiconductor layer of the light emitting element 142 shown in FIG. 19. The uppermost layer of the n-type semiconductor layer 513 constitutes a contact layer 513*c* connected to a first n-side electrode 527. Reference numeral 514 indicates a p-type semiconductor layer of the light emitting element 142 shown in FIG. 19. The uppermost layer of the p-type semiconductor layer 514 constitutes a contact layer 514*c* connected to a first p-side electrode 526.

Each of the semiconductor layers 511 through 514 includes a plurality of layers such as an active layer, a cladding layer or the like, detailed description thereof being omitted. The contact layers 511*c*, 512*c*, 513*c* and 514*c* are illustrated so as to have no thickness in order to simplify the drawings.

The first n-side electrode 527 is connected to a first n-side wiring 522, and the first p-side electrode 526 is connected to a first p-side wiring 521. The second n-side electrode 537 is connected to a second n-side wiring 523, and the second p-side electrode 536 is connected to a second p-side wiring 520.

The respective light emitting elements of the respective columns and rows of this embodiment can be controlled to emit lights as was described in Embodiment 1.

For example, in order to turn on the light emitting element 144, the wirings 523 and 520 corresponding to one of the second n-side electrodes 537 and one of the second p-side electrodes 536 (FIG. 22) are selected, and a voltage is applied to the light emitting element 144. Further, in order to turn on the light emitting element 142, the wirings 522 and 521 corresponding to one of the first n-side electrodes 527 and one of the first p-side electrodes 526 are selected, and a voltage is applied to the light emitting element 142.

Therefore, it is possible to individually control all of the light emitting elements on the substrate 110*b* by connecting the respective electrodes to the respective wirings connected to an external light emission control circuit as described above. Further, it is possible to individually control the light emitting element arrays 141 and 143 by connecting the light emitting element arrays 141 and 143 to respective light emission control circuits. Furthermore, it is possible to control the light emitting element arrays 141 and 143 partially or entirely by connecting the light emitting element arrays 141 and 143 to the light emission controlling circuit(s) in parallel or in series according to various kinds of operations, and various kinds of modifications can be made.

Figure 26:
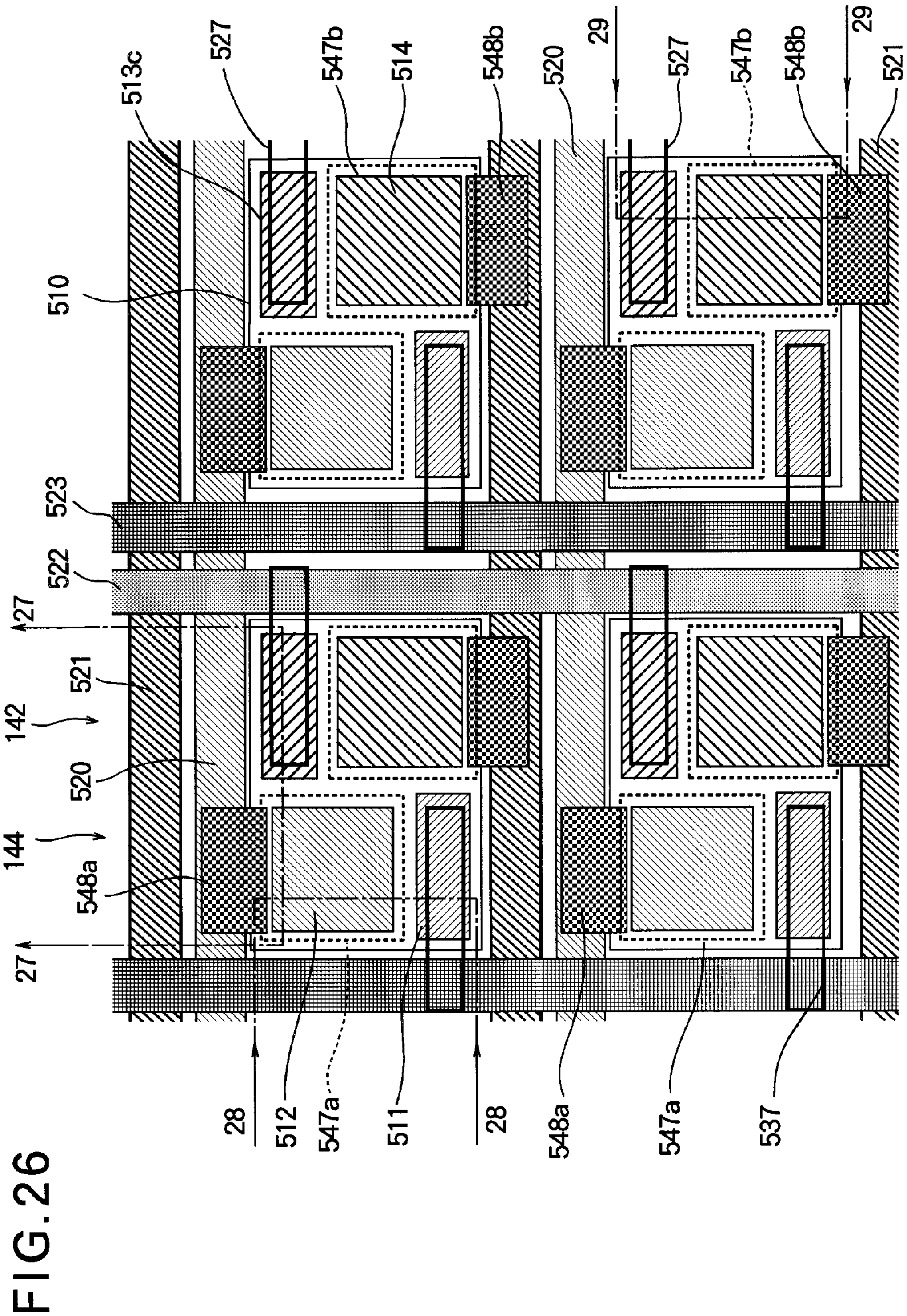
FIG. 26 is a plan view schematically showing another example of the configuration including light emitting elements constituting a part of the light emitting element array shown in FIG. 20 and electrodes and wirings connected to the light emitting elements.
Figure 27:
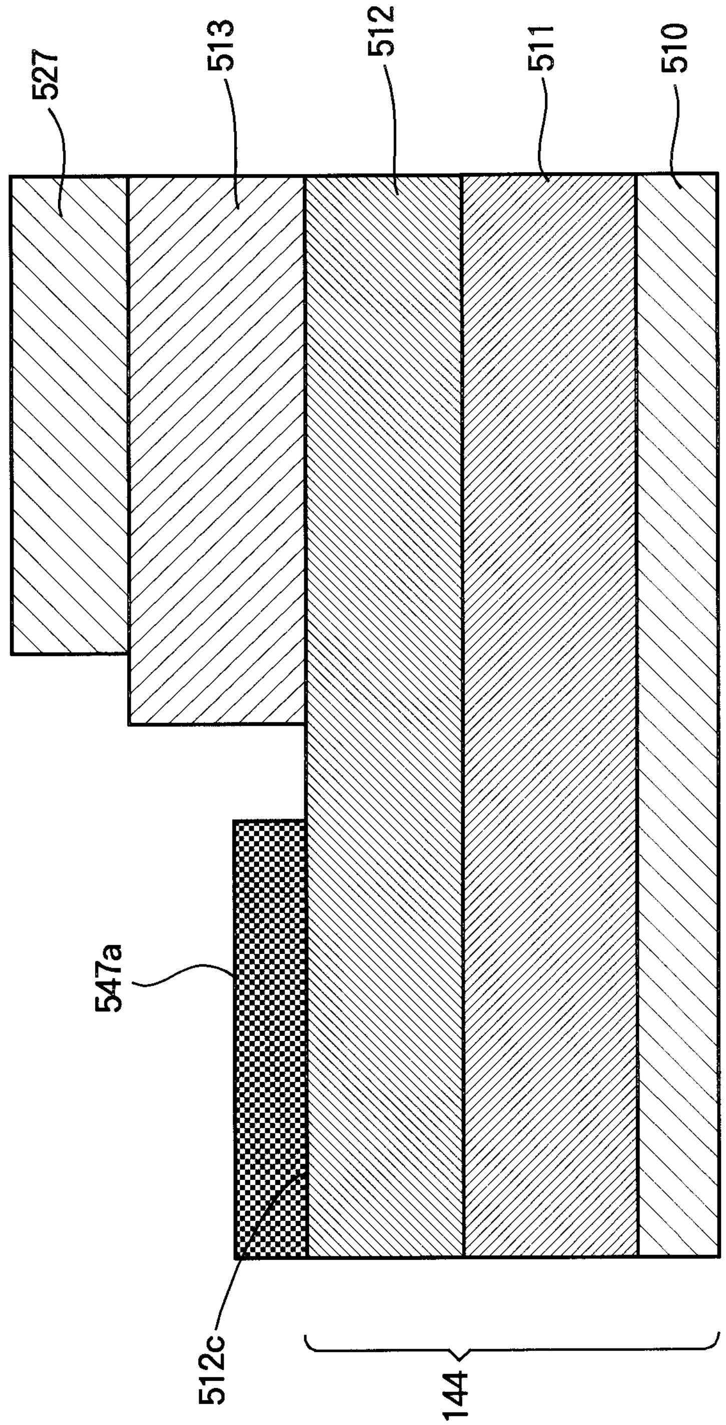
FIG. 27 is a sectional view taken along line 27-27 shown in FIG. 26.
Figure 28:
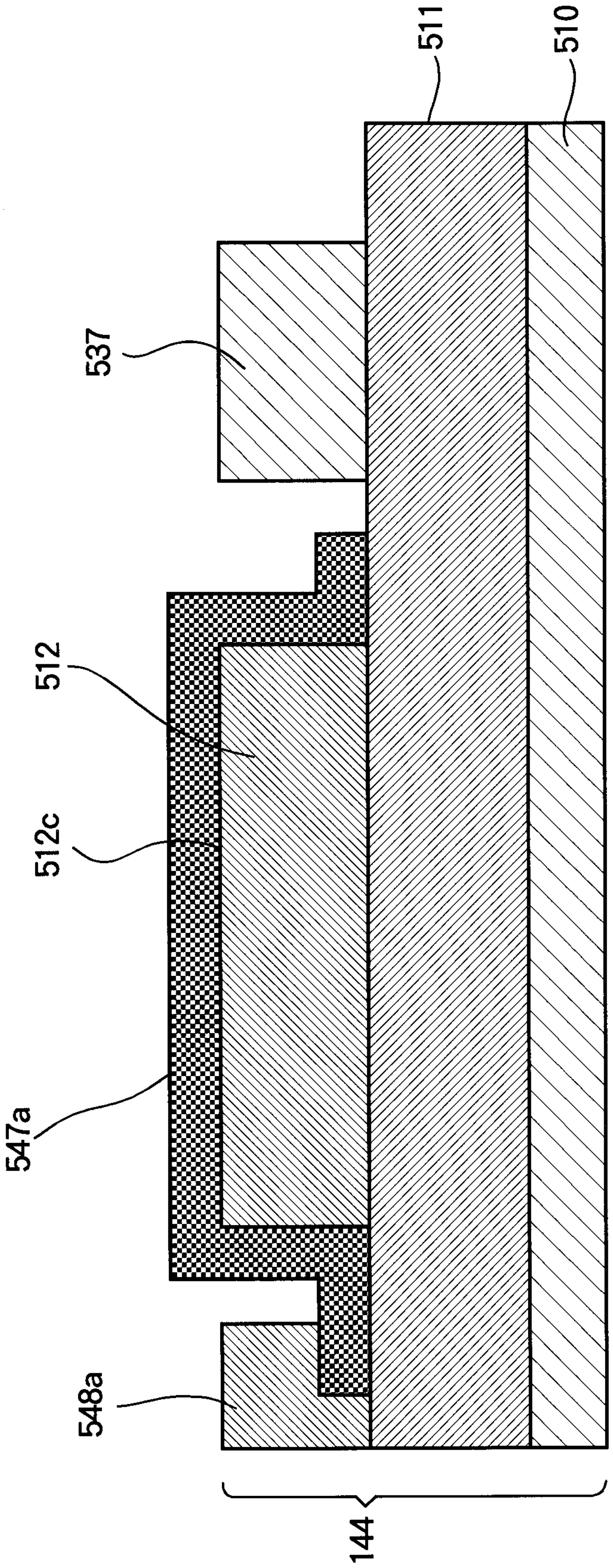
FIG. 28 is a sectional view taken along line 28-28 shown in FIG. 26.
Figure 29:
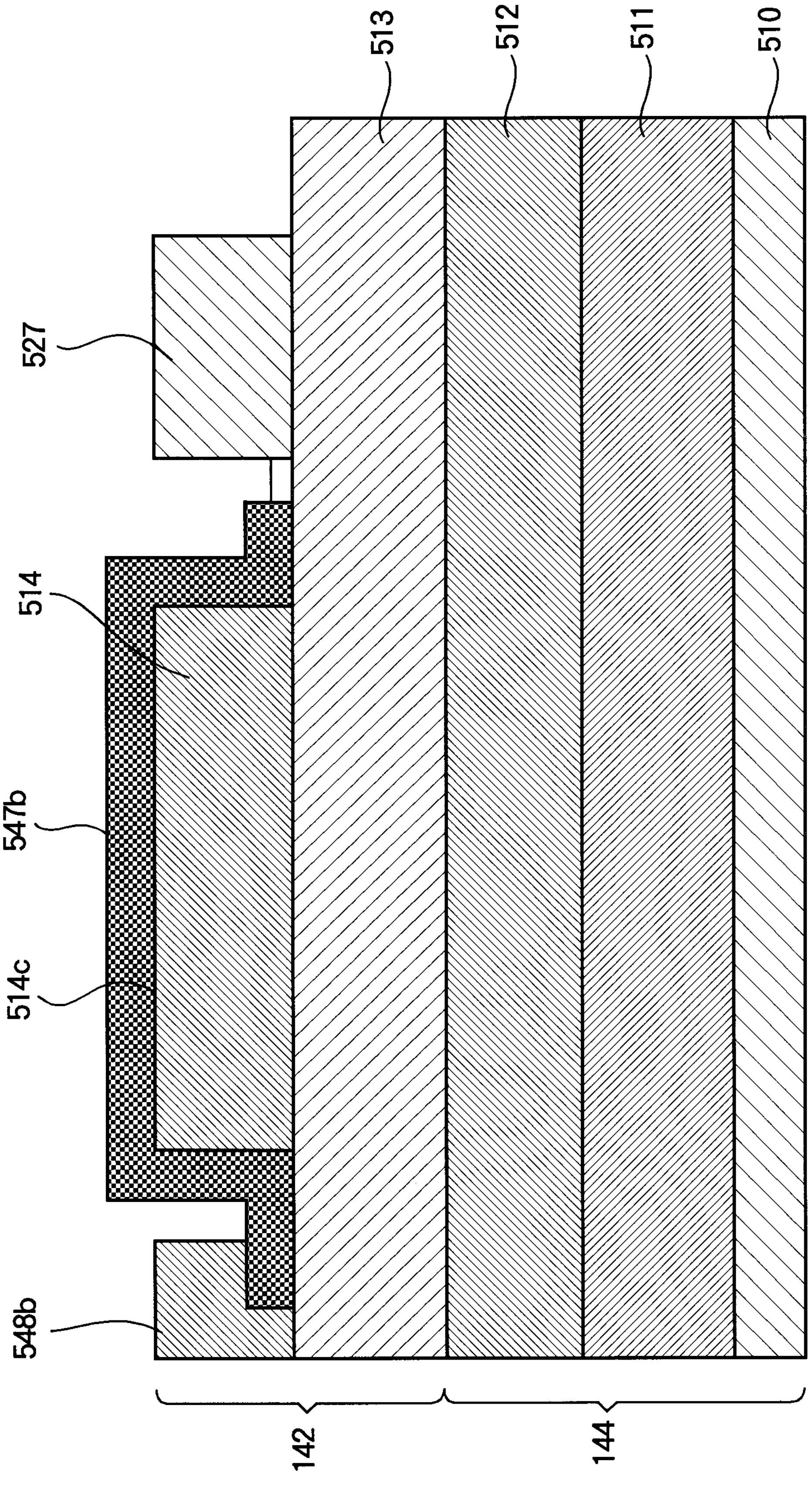
FIG. 29 is a sectional view taken along line 29-29 shown in FIG. 26.

FIG. 26 is a plan view schematically showing another example of the configuration including four light emitting elements 142 constituting a part of the light emitting element array 141, four light emitting elements 144 constituting a part of the light emitting element array 143 shown in FIG. 19, electrodes and wirings connected to the light emitting elements. FIG. 27 is a sectional view taken along line 27-27 in FIG. 26. FIG. 28 is a sectional view taken along line 28-28 in FIG. 26. FIG. 29 is a sectional view taken along line 29-29 in FIG. 26. In these drawings, an interlayer insulation film (provided between the p-side and n-side electrodes or wirings) is omitted in order to simplify the description.

The configuration shown in FIGS. 26 through 29 can be formed by, for example, performing mesa etching, deposition or the like on the semiconductor thin film layer including two laminated light emitting layers as is the case with the configuration shown in FIGS. 22 through 26.

The configuration shown in FIG. 26 is different from the configuration shown in FIG. 22 in the following respects. That is, in the configuration shown in FIG. 26, a transparent electrode 547*a* is formed on the contact layer 512*c* of the p-type semiconductor layer 512 of the light emitting element 144, a transparent electrode 547*b* is formed on the contact layer 514*c* of the p-type semiconductor layer 514 of the light emitting element 142. The transparent electrode 547*a* is connected to a second p-side wiring 520 via a connection wiring 548*a*, and the transparent electrode 547*b* is connected to a first p-side wiring 521 via a connection wiring 548*b*.

The configuration shown in FIG. 26 is the same as that shown in FIG. 22 in other respects. The light emitting elements 142 and the light emitting elements 144 can be individually controlled (i.e., turned on and off) using the same controlling method as described with reference to FIG. 22.

Figure 30:
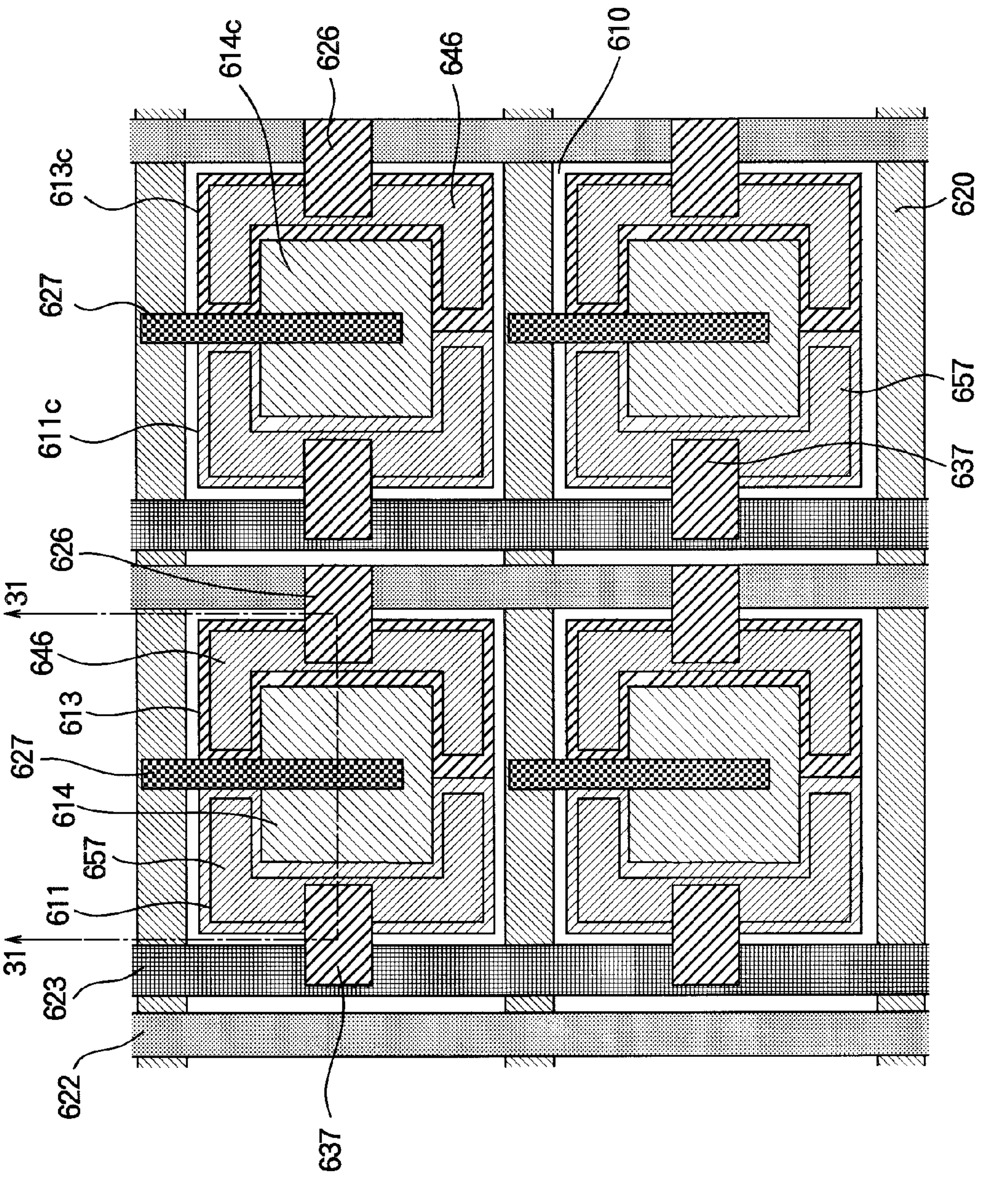
FIG. 30 is a plan view schematically showing still another example of the configuration including light emitting elements constituting a part of the light emitting element array shown in FIG. 20 and electrodes and wirings connected to the light emitting element.
Figure 31:
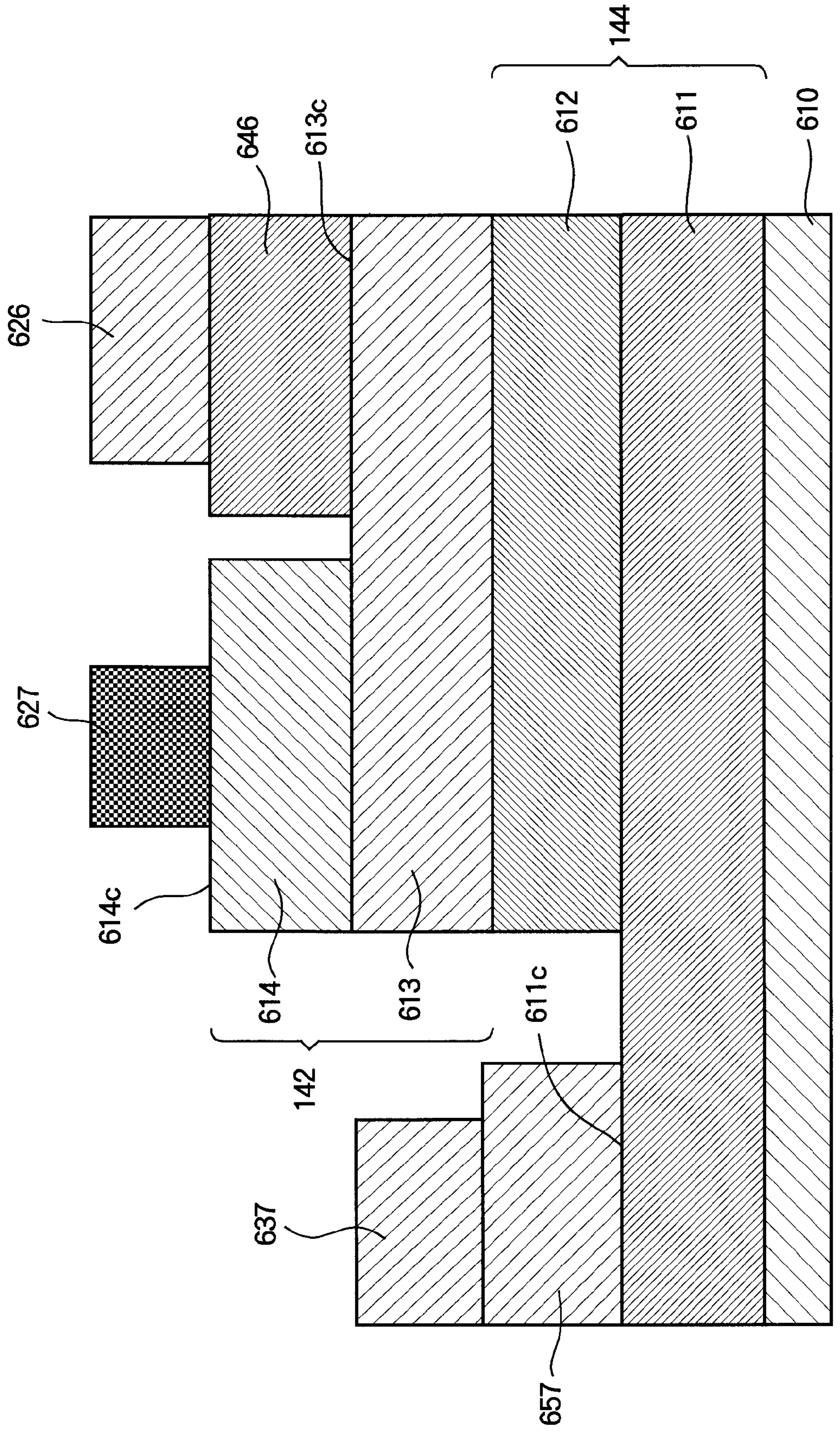
FIG. 31 is a sectional view taken along line 31-31 shown in FIG. 30.

FIG. 30 is a plan view schematically showing still another example of the configuration including four light emitting elements 142 constituting a part of the light emitting element array 141, four light emitting elements 144 constituting a part of the light emitting element array 143 shown in FIG. 19, the electrodes and wirings connected to the light emitting elements. FIG. 31 is a sectional view taken along line 31-31 in FIG. 30.

The configuration shown in FIGS. 30 and 31 can be formed by, for example, mesa etching, deposition or the like on the semiconductor thin film including laminated two layers, as is the case with the configuration shown in FIGS. 22 through 25 and the configuration shown in FIGS. 26 through 29.

In FIGS. 30 and 31, reference numeral 610 indicates a bonding layer 610 which is a lowermost layer of the light emitting element complex 150 shown in FIG. 19, and functions to bond the light emitting element complex 150 to the substrate 110*b*. Reference numeral 611 indicates an n-type semiconductor layer of the light emitting element 144 shown in FIG. 19. The uppermost layer of the n-type semiconductor layer 611 constitutes a contact layer 611*c* connected to an n-side electrode 657. Reference numeral 612 indicates a p-type semiconductor layer of the light emitting element 144 shown in FIG. 19. Reference numeral 613 indicates a p-type semiconductor layer of the light emitting element 142 shown in FIG. 19. The uppermost layer of the p-type semiconductor layer 613 constitutes a contact layer 613*c* connected to a p-side electrode 646. Reference numeral 614 indicates an n-type semiconductor layer of the light emitting element 142 shown in FIG. 19. The uppermost layer of the n-type semiconductor layer 614 constitutes a contact layer 614*c* connected to an n-side electrode 627.

Each of the semiconductor layers 611 through 614 includes a plurality of layers such as, for example, an active layer, a cladding layer, a contact layer or the like, the detailed description thereof being omitted. Further, the contact layers 611*c*, 613*c* and 614*c* are illustrated to have no thickness in order to simplify the drawings.

The n-side electrode 657 is connected to an n-side wiring 623 via a connection wiring 637. The n-side electrode 627 is connected to an n-side wiring 620. The p-side electrode 646 is connected to a p-side wiring 622 via a connection wiring 626.

Figure 32:
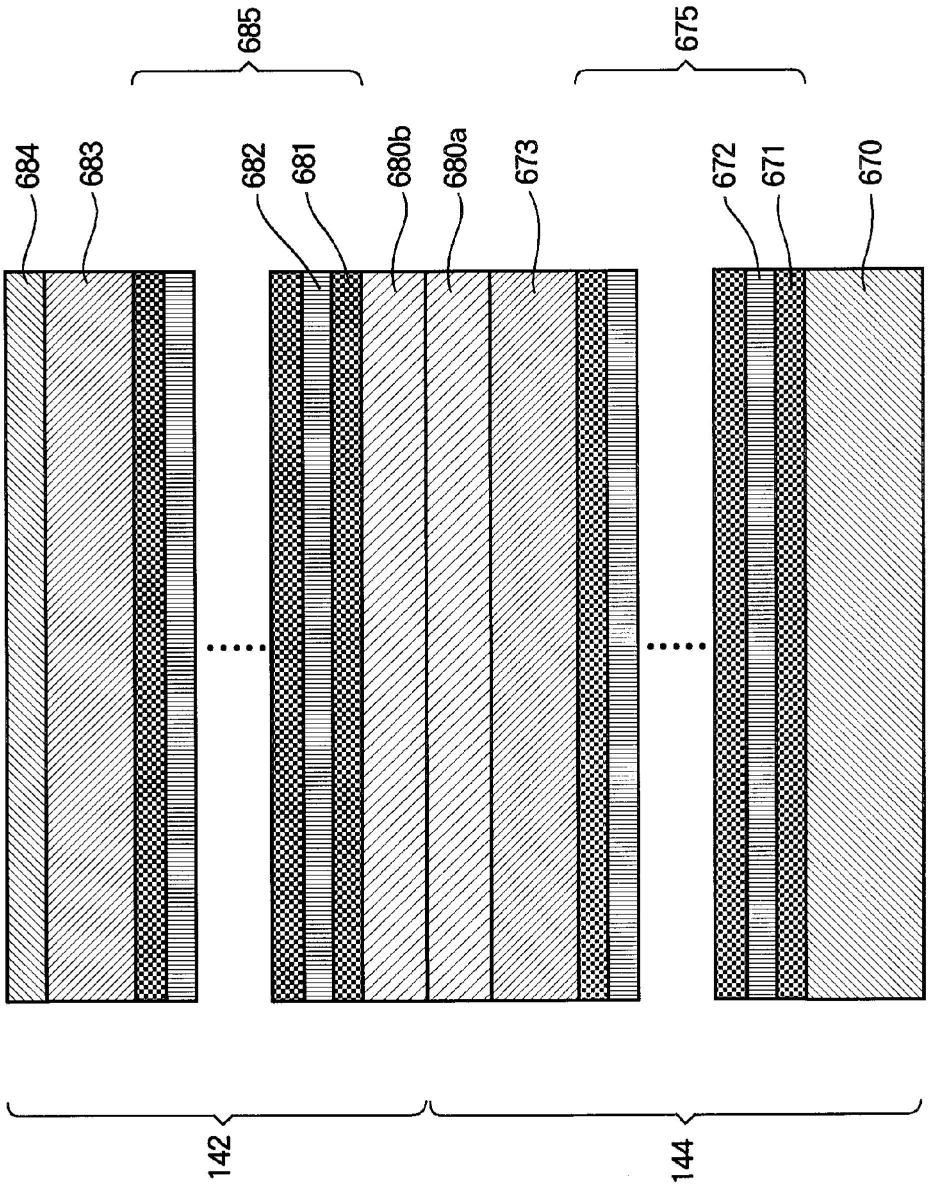
FIG. 32 is a sectional view schematically showing an example of a configuration of a semiconductor epitaxial thin film forming the light emitting elements shown in FIGS. 22 through 25 and FIGS. 26 through 29.

FIG. 32 is a sectional view schematically showing an example of a configuration of a semiconductor epitaxial thin film constituting the light emitting elements 142 and 144 shown in FIGS. 22 through 25 and FIGS. 26 through 29.

The semiconductor layers shown in FIG. 32 can be formed of semiconductor layers formed by epitaxial growing process. Alternatively, the semiconductor layers shown in FIG. 32 can be formed by individually forming a thin film constituting the light emitting element 142 and another thin film constituting the light emitting element 144 on the respective epitaxial growth substrates as was described with reference to FIG. 5 or the like, separating the thin films from the epitaxial growth substrates, and bonding the thin films to each other using the intermolecular force or interactive force on the bonding surfaces.

In the configuration shown in FIG. 32, the light emitting element 144 is composed of semiconductor layers 670 through 680*a*, and the light emitting element 142 is composed of semiconductor layers 680*b* through 684.

Reference numeral 670 indicates an n-type GaN layer. Reference numeral 671 indicates an $In_xGa_{1-x}N$ layer, and reference numeral 672 indicates a GaN layer. A multiple quantum well layer 675 includes the $In_xGa_{1-x}N$ layers 671 and the GaN layers 672 laminated alternately on each other. Reference numeral 673 indicates a p-type $Al_yGa_{1-y}N$ layer, and reference numeral 680*a* indicates a p-type GaN layer.

Reference numeral 680*b* indicates an n-type GaN layer. Reference numeral 681 indicates an $In_xGa_{1-x}N$ layer, and reference numeral 682 indicates a GaN layer. A multiple quantum well layer 685 includes the $In_xGa_{1-x}N$ layers 681 and the GaN layers 682 laminated alternately on each other. Reference numeral 683 indicates a p-type $Al_yGa_{1-y}N$ layer, and reference numeral 684 indicates a p-type GaN layer.

Figure 33:
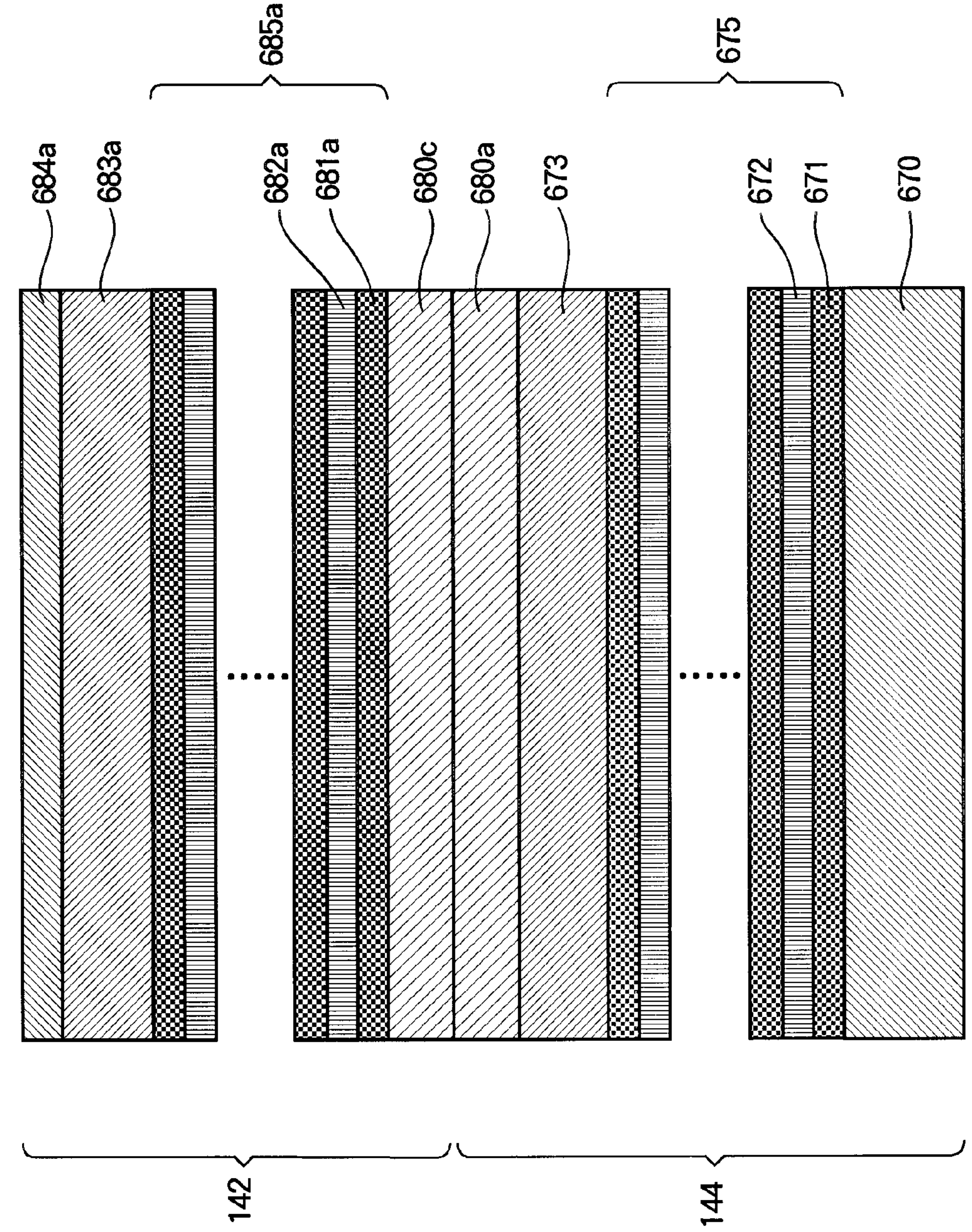
FIG. 33 is a sectional view schematically showing an example of a semiconductor epitaxial thin film layer that forms the light emitting elements shown in FIGS. 30 and 31.

FIG. 33 is a sectional view schematically showing an example of a configuration of the semiconductor epitaxial thin film constituting the light emitting elements 142 and 144 shown in FIGS. 30 and 31.

The semiconductor layers shown in FIG. 33 can be formed by epitaxially growing respective semiconductor layers. Alternatively, the semiconductor layer shown in FIG. 33 can be formed by individually forming a thin film constituting the light emitting element 142 and another thin film constituting the light emitting element 144 on the respective epitaxial growth substrates as was described with reference to FIG. 5 or the like, separating the thin films from the epitaxial growth substrates, and bonding the thin films to each other using the intermolecular force or interactive force on the bonding surfaces.

In the configuration shown in FIG. 33, the light emitting element 144 is composed of semiconductor layers 670 through 680*a*, and the light emitting element 142 is composed of semiconductor layers 680*c* through 684*a*.

Reference numeral 670 indicates an n-type GaN layer. Reference numeral 671 indicates an $In_xGa_{1-x}N$ layer, and reference numeral 672 indicates a GaN layer. A multiple quantum well layer 675 includes the $In_xGa_{1-x}N$ layers 671 and the GaN layers 672 alternately laminated on each other. Reference numeral 673 indicates a p-type $Al_yGa_{1-y}N$ layer, and reference numeral 680*a* indicates a p-type GaN layer.

Reference numeral 680*c* indicates a p-type GaN layer. Reference numeral 681*a* indicates an $In_xGa_{1-x}N$ layer, and reference numeral 682*a* indicates a GaN layer. A multiple quantum well layer 685*a* includes the $In_xGa_{1-x}N$ layers 681*a* and the GaN layers 682*a* alternately laminated on each other. Reference numeral 683*a* indicates an n-type $Al_yGa_{1-y}N$ layer, and reference numeral 684*a* indicates an n-type GaN layer.

In the configuration shown in FIGS. 22 and 26, it is possible to apply voltage to the light emitting elements 144 and 142 at the same time so as to cause the light emitting elements 144 and 142 to emit lights, by preventing electric current from flowing through a path between the p-type semiconductor layer 512 of the light emitting element 144 and the n-type semiconductor layer 513 of the light emitting element 142. For example, the p-type semiconductor layer 512 of the light emitting element 144 and the n-type semiconductor layer 513 of the light emitting element 142 can be at the same electric potentials. Alternatively, the electric potential of the n-type semiconductor layer 513 of the light emitting element 142 can be set higher than the electric potential of the p-type semiconductor layer 512 of the light emitting element 144.

In the configuration shown in FIG. 30, the light emitting element 144 can be lighted by applying a voltage to between the first n-side electrode 657 and the p-side electrode 646 in a forward direction so that current flows therebetween. The light emitting element 142 can be lighted by applying a voltage to between the p-side electrode 646 and the second n-side electrode 627 in the forward direction so that current flows therebetween. The light emitting elements 144 and 142 can be lighted at the same time by applying voltage so that the electric potential of the first n-side electrode 657 of the light emitting element 144 and the electric potential of the second n-side electrode 627 of the light emitting element 142 are lower than the electric potential of the p-side electrode 646.

As described above, according to Embodiment 2, the light emitting element of the light emitting element array unit includes a plurality of laminated light emitting layers. Therefore, in addition to the advantages of Embodiment 1, it becomes possible to reduce the number of light emitting element array units, i.e., to reduce the number of substrates (110*a* and 110*b*).

Embodiment 3

Figure 34:
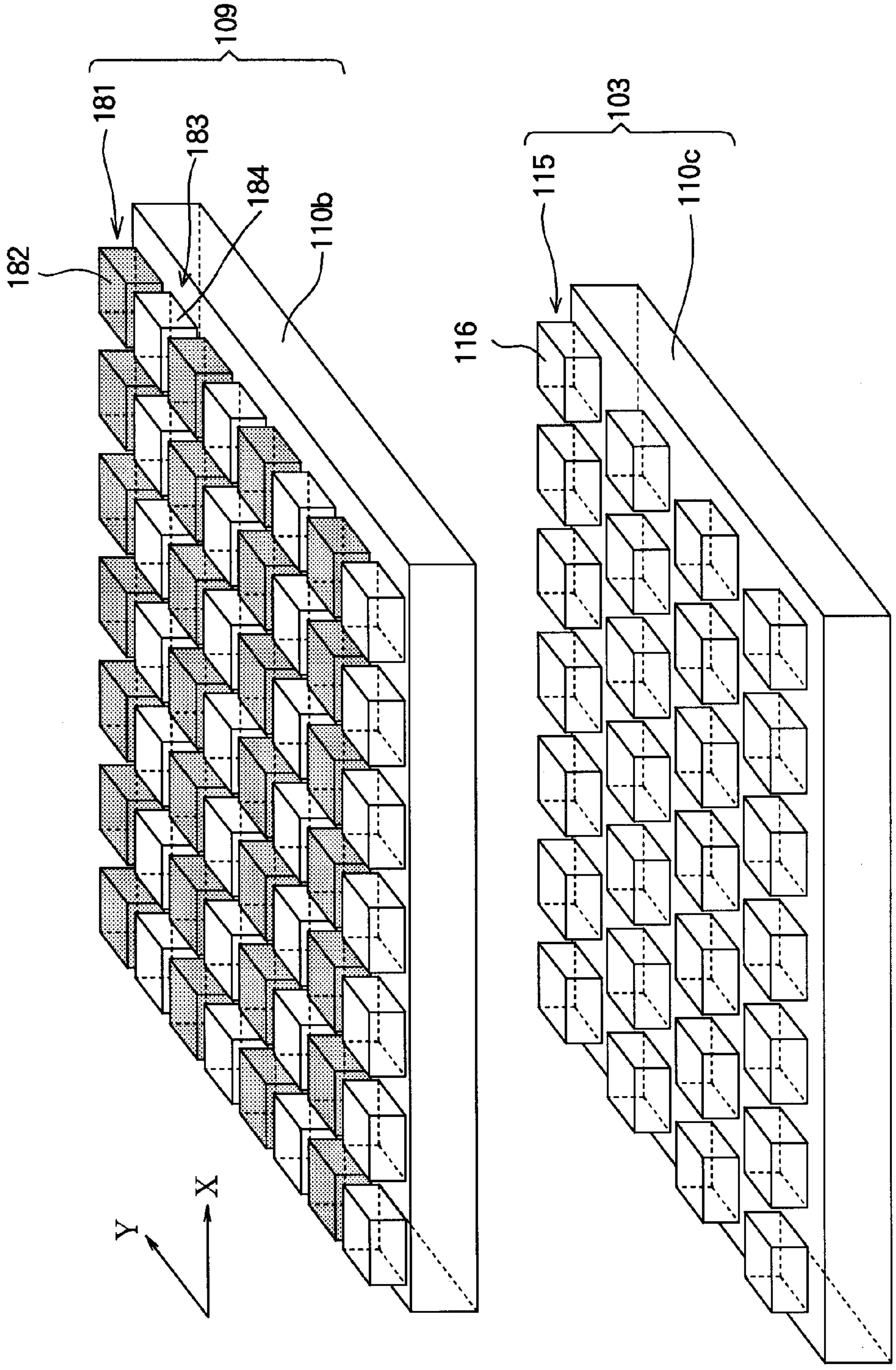
FIG. 34 is an exploded perspective view schematically showing an example of a configuration of a light emitting panel of a display device according to Embodiment 3 of the present invention.

FIG. 34 is an exploded perspective view schematically showing an example of a configuration of a light emitting panel of a display device according to Embodiment 3 of the present invention.

Embodiment 3 is different from Embodiment 2 in the following respects. That is, in Embodiment 3, at least one light emitting element array unit includes first light emitting elements that emit light having first wavelength (for example, blue light) and second light emitting elements that emit light having second wavelength (for example, green light) which are not laminated but arranged two-dimensionally in a plane at different positions.

The display device shown in FIG. 34 includes a light emitting element array unit 103 and a light emitting element array unit 109. The light emitting element array unit 103 is the same as the light emitting element array unit 103 shown in FIG. 1, and includes a plurality of light emitting elements 116 arranged two-dimensionally in a matrix on the substrate 110*c* to constitute a light emitting element array 115.

The light emitting element array unit 109 includes a substrate 110*b* and light emitting element arrays 181 and 183 disposed on the same side of the substrate 110*b* (the upper side i.e., the surface side of the light emitting panel). The light emitting element array 181 includes a plurality of light emitting elements 182 arranged two-dimensionally in a matrix, and the light emitting element array 183 includes a plurality of light emitting elements 184 arranged two-dimensionally in a matrix. It is also possible to arrange three or more kinds of light emitting elements that emit lights having different wavelengths on the same substrate.

The light emitting element array 181 and the light emitting element array 183 are formed in the same imaginary plane. The light emitting elements 182 of the light emitting element array 181 and the light emitting element 184 of the light emitting element array 183 are arranged on different positions in a planar direction. To be more specific, the respective light emitting elements 184 of the light emitting element array 183 are disposed on positions shifted from the corresponding light emitting elements 182 of the light emitting element array 181 in the Y direction by a distance equal to a half of an arrangement pitch of the light emitting elements 182 in the Y direction. In other words, the light emitting elements 182 of the light emitting element array 181 and the light emitting element 184 of the light emitting element array 183 are disposed alternately in the Y direction.

It is also possible that the light emitting elements 182 and 184 are disposed alternately in the X direction (instead of the Y direction), or disposed alternately in both of the X direction and the Y direction.

The light emitting element 182 of the light emitting element array 181 and the light emitting element 184 of the light emitting element array 183 emit lights having different wavelengths. For example, the light emitting elements 182 of the light emitting element array 181 emit blue light, and the light emitting elements 184 of the light emitting element array 183 emit green light. Further, the light emitting element 116 of the light emitting element array 115 emit red light as is the case with the light emitting elements 116 shown in FIG. 1. With such an arrangement, it becomes possible to reduce the attenuation of the light emitted by the light emitting element 116 of the light emitting element array 115 distantly positioned from the surface of the light emitting panel.

Figure 35:
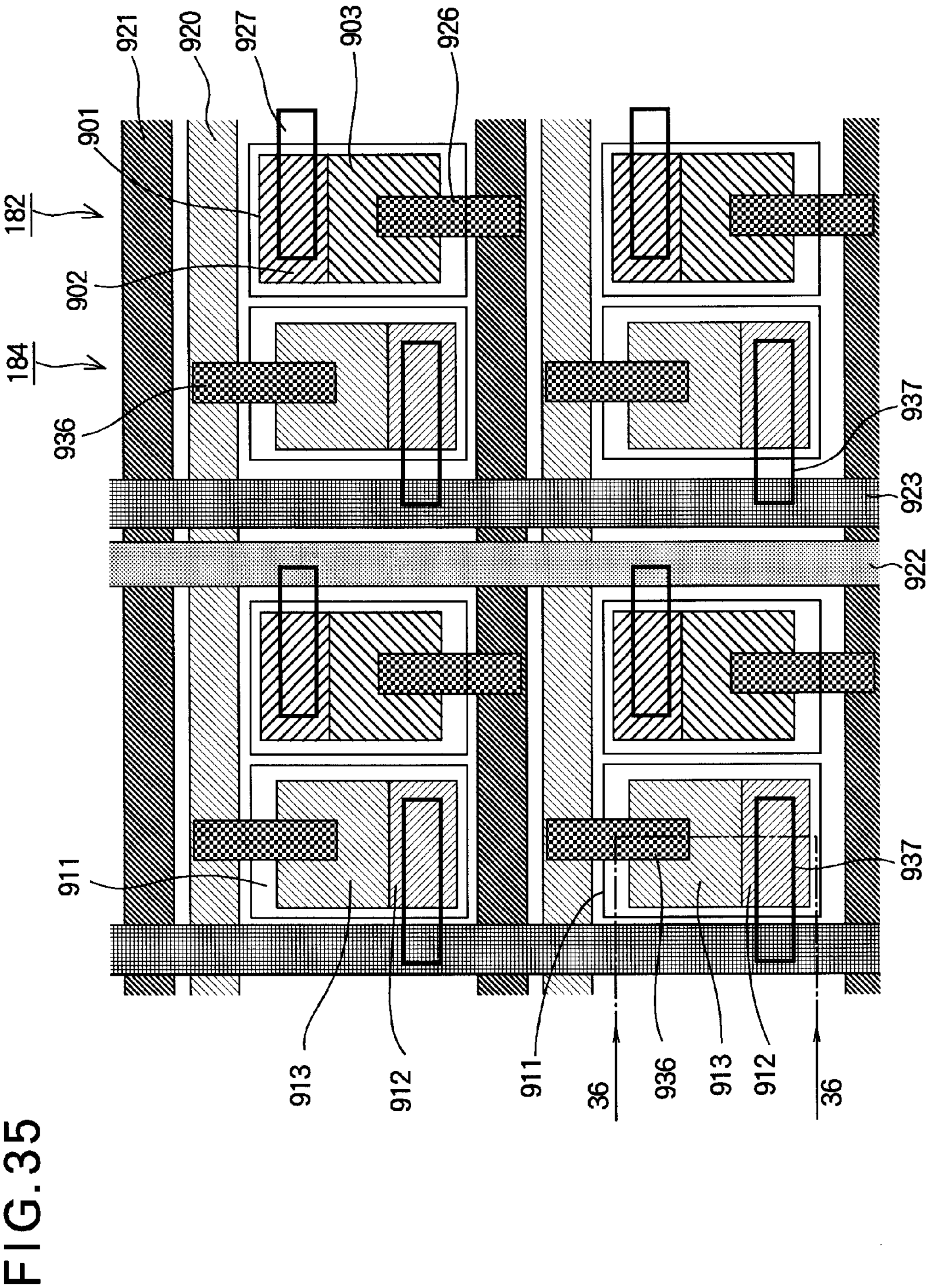
FIG. 35 is a plan view schematically showing an example of a configuration including light emitting elements constituting a part of the light emitting element array shown in FIG. 34 and electrodes and wirings connected to the light emitting element.
Figure 36:
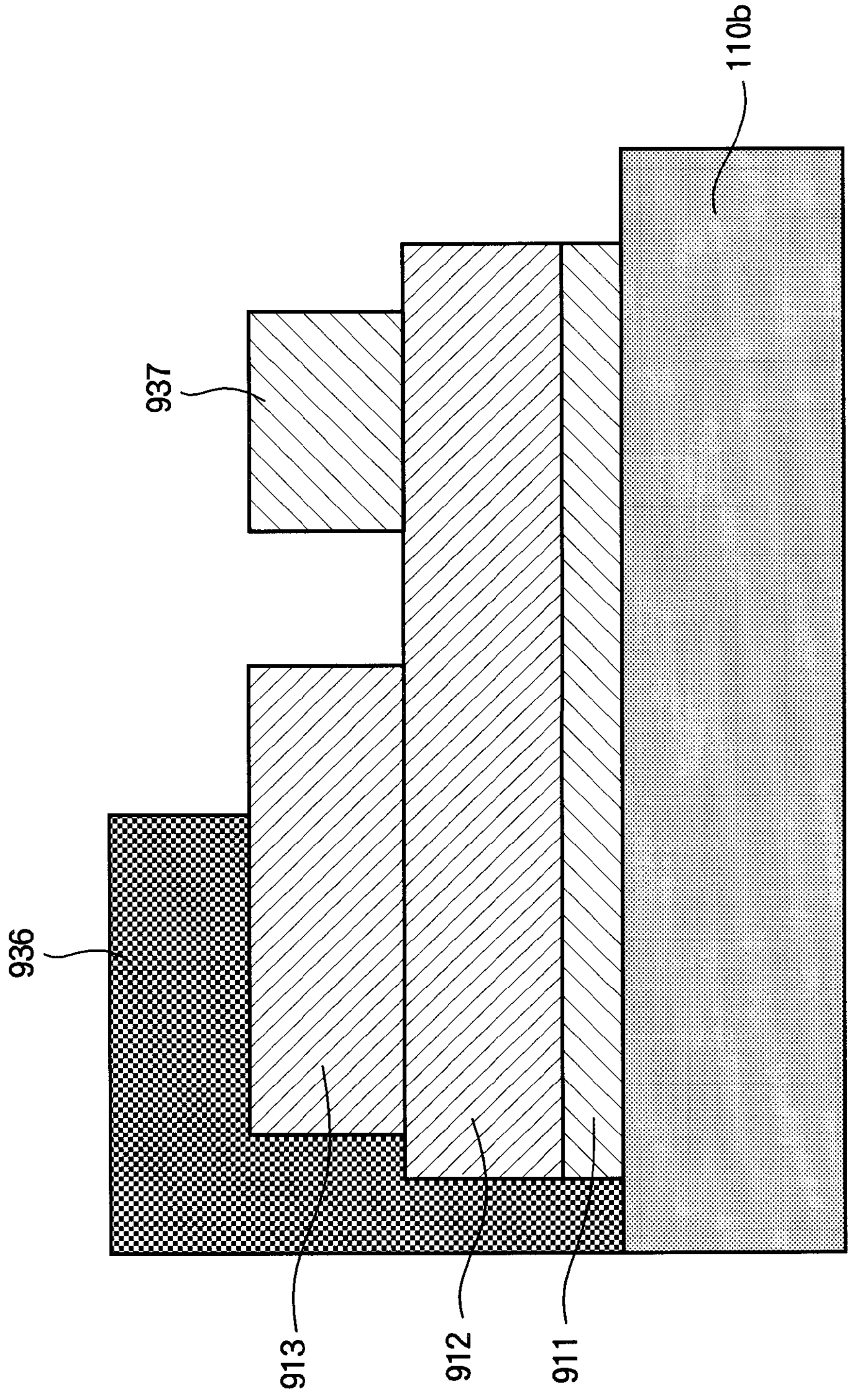
FIG. 36 is a sectional view taken along line 36-36 shown in FIG. 35.

FIG. 35 is a plan view schematically showing an example of a configuration including four light emitting elements 182 constituting a part of the light emitting element array 181, four light emitting elements 184 constituting a part of the light emitting element array 183 shown in FIG. 34, the electrodes and wirings connected to the light emitting elements. FIG. 36 is a sectional view taken along line 36-36 in FIG. 35.

In FIGS. 35 and 36, reference numerals 901, 902 and 903 indicate semiconductor layers constituting the light emitting elements 182. The semiconductor layers 901, 902 and 903 include a bonding layer 901 bonded to the substrate 110*b*, an n-type semiconductor layer 902 formed on the bonding layer 901, and a p-type semiconductor layer 903 formed on the n-type semiconductor layer 902. Reference numerals 911, 912 and 913 indicate semiconductor layers constituting the light emitting element 184. The semiconductor layers 911, 912 and 913 include a bonding layer 911 bonded to the substrate 110*b*, an n-type semiconductor layer 912 formed on the bonding layer 911 and a p-type semiconductor layer 913 formed on the n-type semiconductor layer 912. An n-side electrode 927 and a p-side electrode 926 are respectively connected to an n-side wiring 922 and a p-side wiring 921.

An n-side electrode 937 and a p-side electrode 936 of the light emitting element 184 are respectively connected to an n-side wiring 923 and a p-side wiring 920.

The cross section of the light emitting element 182 is the same as the light emitting element 184 shown in FIG. 36 (reference numerals 911, 912, 913, 936 and 937 in FIG. 36 are needed to be replaced with reference numerals 901, 902, 903, 926 and 927).

Figure 37:
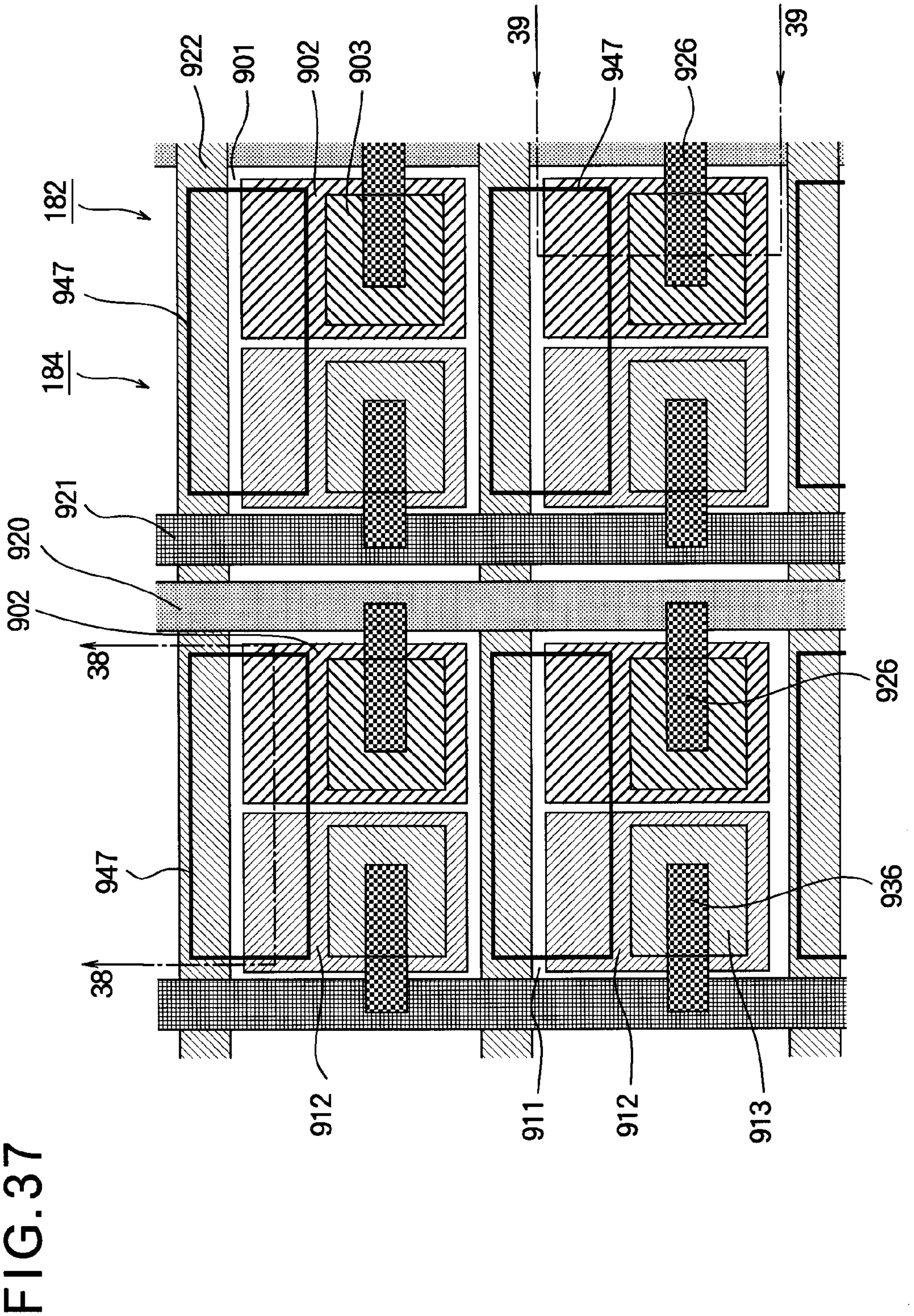
FIG. 37 is a plan view schematically showing another example of the configuration including light emitting elements constituting a part of the light emitting element array shown in FIG. 34 and electrodes and wirings connected to the light emitting element.
Figure 38:
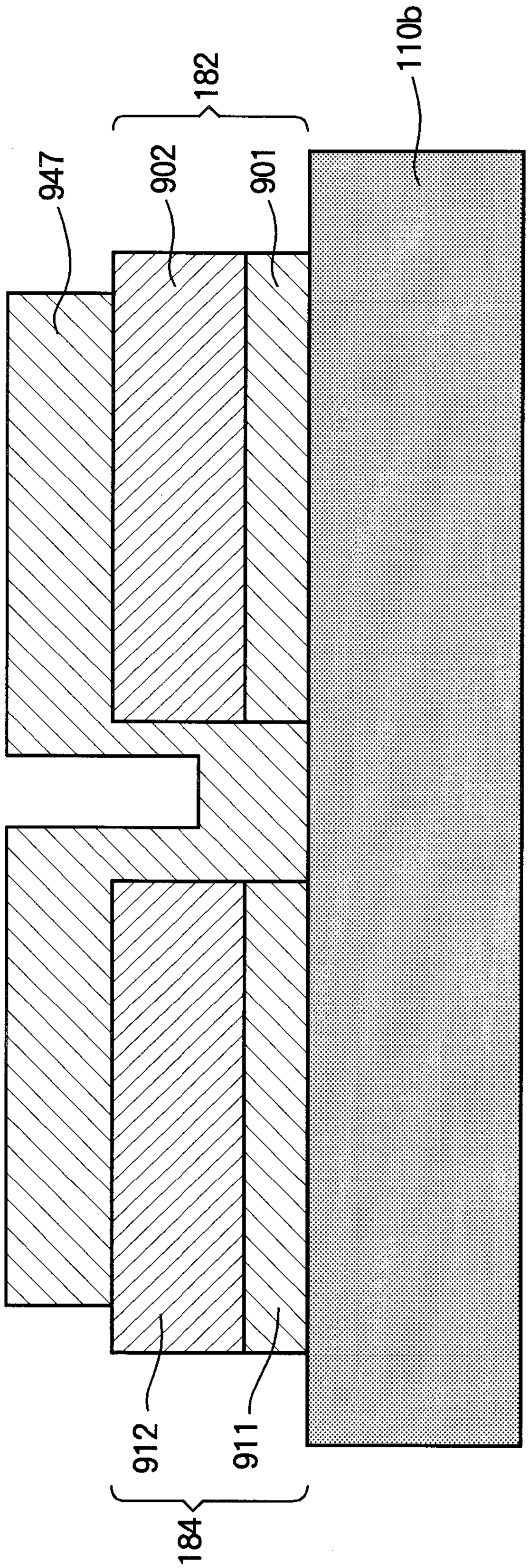
FIG. 38 is a sectional view taken along line 38-38 shown in FIG. 37.
Figure 39:
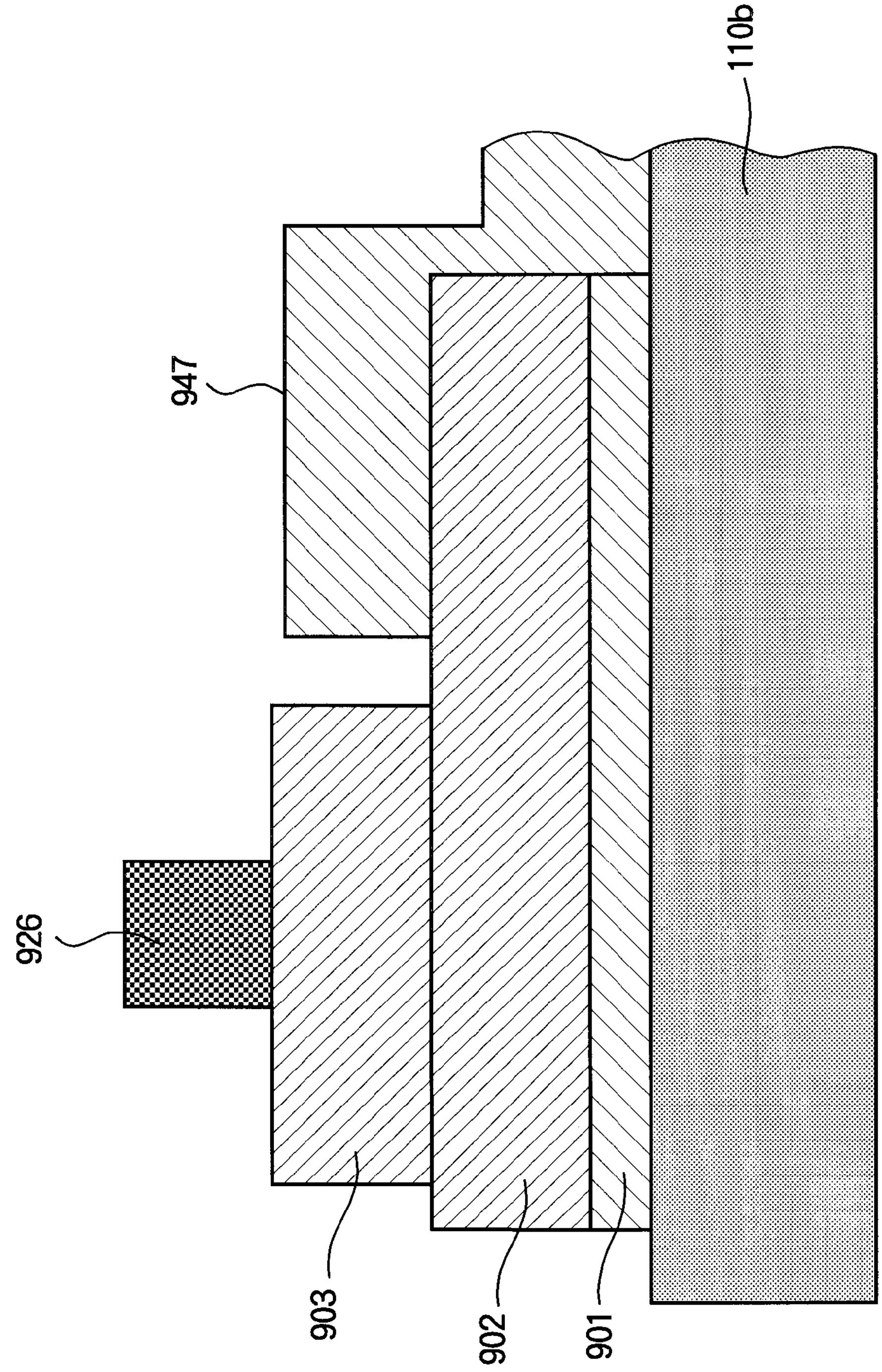
FIG. 39 is a sectional view taken along line 39-39 shown in FIG. 37.

FIG. 37 is a plan view schematically showing another example of a configuration including four light emitting elements 182 constituting a part of the light emitting element array 181, four light emitting elements 184 constituting a part of the light emitting element array 183 shown in FIG. 34, the electrodes and wirings connected to the light emitting elements. FIG. 38 is a sectional view taken along line 38-38 in FIG. 37. FIG. 39 is a sectional view taken along line 39-39 in FIG. 37.

The configuration shown in FIGS. 37 through 39 is different from the configuration shown in FIGS. 35 and 36 in the following respects. The configuration shown in FIGS. 37 through 39 has a common n-side electrode 947 for the n-type semiconductor layer 902 of the light emitting element 182 and for the n-type semiconductor layer 912 of the light emitting element 184. The common n-side electrode 947 is connected to the n-side wiring 922. The p-side electrode 926 of the light emitting element 182 is connected to the first p-side wiring 920. The p-side electrode 936 of the light emitting element 184 is connected to the second p-side wiring 921.

The configuration shown in FIGS. 35 and 36 and the configuration shown in FIGS. 37 through 39 can be formed using the method described in Embodiments 1 and 2.

In the configuration shown in FIG. 35, the light emitting elements 182 and 184 can be individually controlled (turned on and off). For example, the light emitting element 182 shown in FIG. 35 can be lighted by selecting wirings 922 and 921 connected to the first n-side electrode 927 and the first p-side electrode 926 connected to the light emitting element 182, and applying a voltage therethrough. The light emitting element 184 shown in FIG. 35 can be lighted by selecting wirings 923 and 920 connected to the second n-side electrode 937 and the second p-side electrode 936 connected to the light emitting element 184, and applying a voltage therethrough. Further, in the configuration shown in FIG. 37, the light emitting element 182 can be lighted by selecting wirings 922 and 920 connected to the common n-side electrode 947 and the first p-side electrodes 926 connected to the light emitting element 182, and applying a voltage therethrough. The light emitting element 184 shown in FIG. 37 can be lighted by selecting wirings 922 and 921 connected to the common n-side electrode 947 and the second p-side electrode 936 connected to the light emitting element 184, and applying a voltage therethrough.

As described above, according to Embodiment 3, the light emitting element array unit includes a plurality of kinds of light emitting elements 182 and 184 disposed on different positions in a plane (instead of laminating the light emitting elements 182 and 184). Therefore, the electric potential control between a plurality of semiconductor layers can be eliminated. As a result, in addition to the advantages of Embodiment 1 and 2, the control of the light emitting elements 182 and 184 can be simplified.

Embodiment 4

Figure 40:
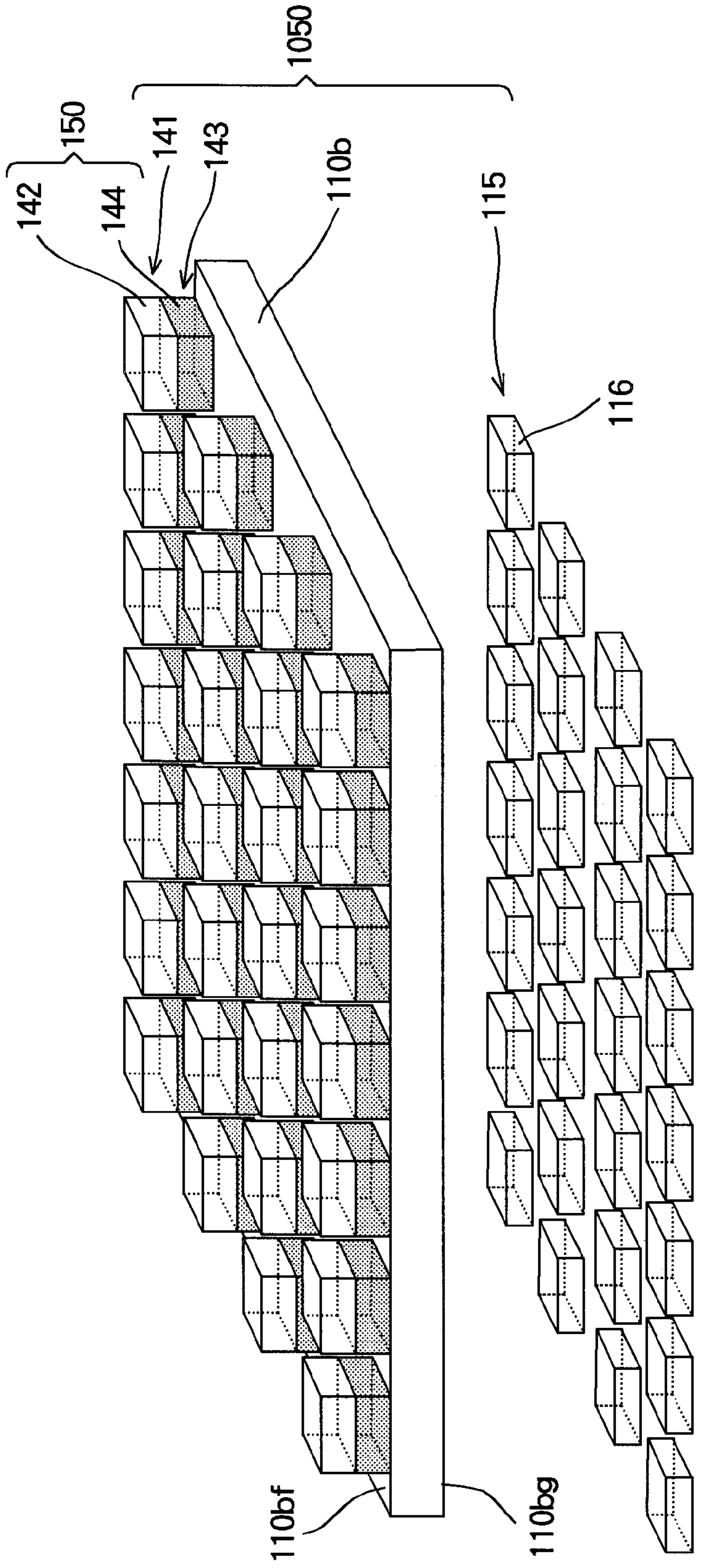
FIG. 40 is an exploded perspective view schematically showing an example of a configuration of a light emitting panel of a display device according to Embodiment 4 of the present invention.

FIG. 40 is an exploded perspective view schematically showing an example of a configuration of a light emitting panel of a display device according to Embodiment 4 of the present invention.

The light emitting panel of Embodiment 4 shown in FIG. 40 is generally the same as the light emitting panel of Embodiments 1, 2 and 3, but different therefrom in that the light emitting element arrays are formed on both surfaces of one substrate 110*b* in Embodiment 4. In other words, the light emitting panel shown in FIG. 40 includes a single light emitting element array unit 1050 in which light emitting element arrays 141 and 143 are formed on a surface 110*bf* of the substrate 110*b*, and a light emitting element array 115 are formed on a back surface 110*bg* of the substrate 110*b*. The light emitting element array 143 includes a plurality of light emitting elements 144, the light emitting element array 141 includes a plurality of light emitting elements 142, and the light emitting element array 115 includes a plurality of light emitting elements 116.

The light emitting element arrays 143 and 141 are laminated with each other. To be more specific, the light emitting element array 143 is formed on the upper surface 110*bf* of the substrate 110*b*, and the light emitting element array 141 is formed on the light emitting element array 143.

In the configuration shown in FIG. 40, it is preferable that the light emitting element array emitting light having shorter wavelength is disposed closer to the light emitting surface of the light emitting panel. For example, the light emitting elements 142 of the light emitting element array 141 emits light having the shortest wavelength, the light emitting elements 144 of the light emitting element array 143 emits light having the second shortest wavelength, and the light emitting elements 116 of the light emitting element array 115 emits light having the longest wavelength.

The light emitting element array unit 1050 using the respective light emitting elements 116, 144 and 142 can be formed using the same method as described in Embodiments 1, 2 and 3.

In this embodiment, the light emitting element arrays are formed on both side of one substrate, and therefore advantages as described in Embodiments 1, 2 and 3 can be obtained. Further, although it is necessary to assemble a plurality of light emitting element array units while adjusting the positions of the light emitting element array units with each other in Embodiments 1, 2 and 3, it is not necessary to perform such an adjustment in Embodiment 4.

Figure 41:
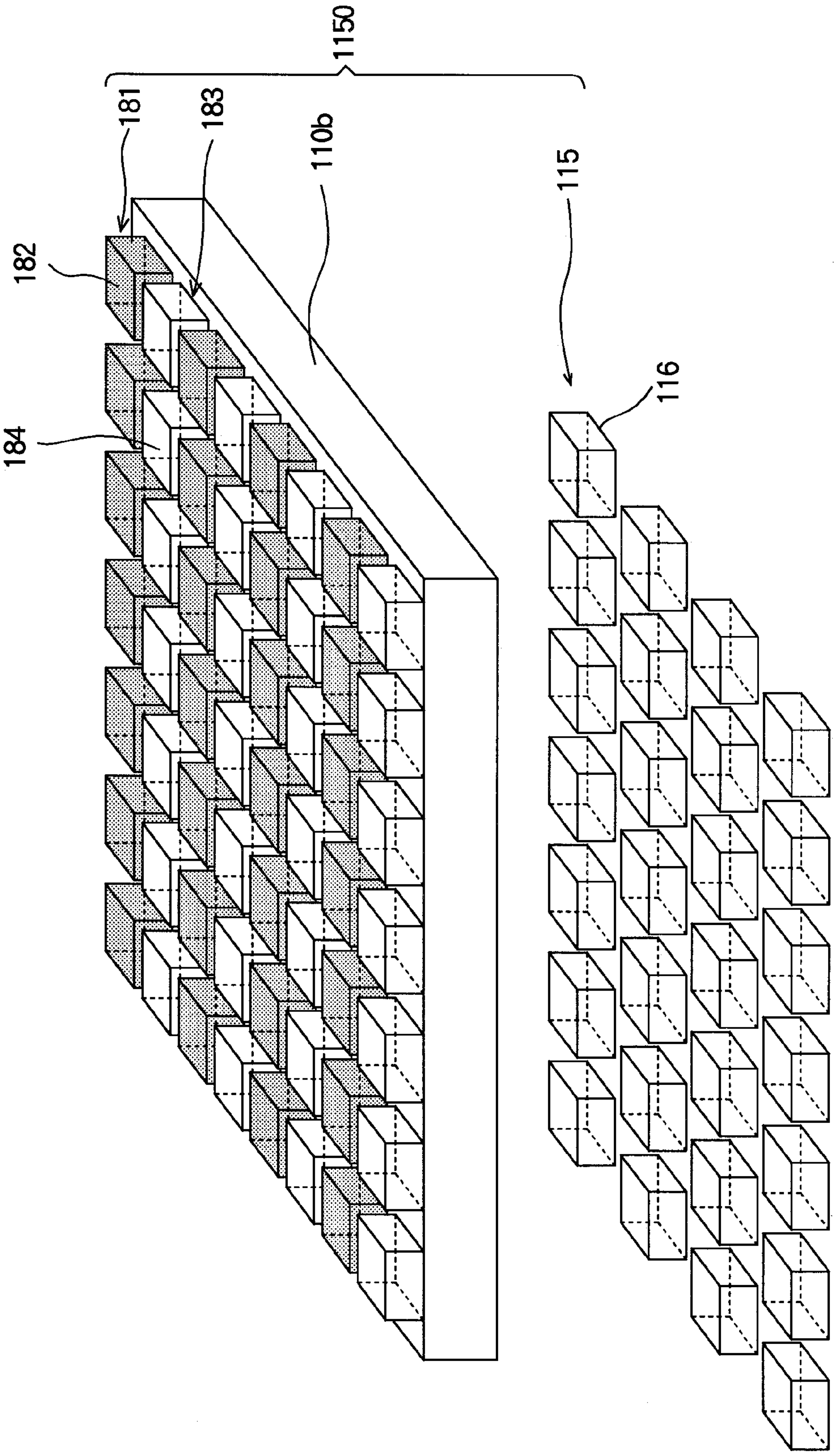
FIG. 41 is an exploded perspective view schematically showing another example of the configuration of a light emitting panel of the display device according to Embodiment 4 of the present invention.

FIG. 41 is an exploded perspective view schematically showing another example of the configuration of the light emitting panel of the display device according to Embodiment 4 of the present invention.

In the example shown in FIG. 41, the light emitting element arrays 181 and 183 are provided on the surface 110*bf* of the substrate 110*b* as was described in Embodiment 3. Further, the light emitting elements 182 of the light emitting element array 181 and the light emitting elements 184 of the light emitting element array 183 are disposed on different position in a planar direction. The single light emitting element array 115 is provided on the back surface 100*bg* of the substrate 100*b* as is the case with the example shown in FIG. 40.

In this case, the light emitting elements 116 of the light emitting element array 115 emit light having the longest wavelength. It is possible that either of the light emitting elements 182 of the light emitting element array 181 and the light emitting elements 184 of the light emitting element array 183 emits the light having longer wavelength than the other. In other respects, the example shown in FIG. 41 is the same as the example shown in FIG. 40.

Figure 42:
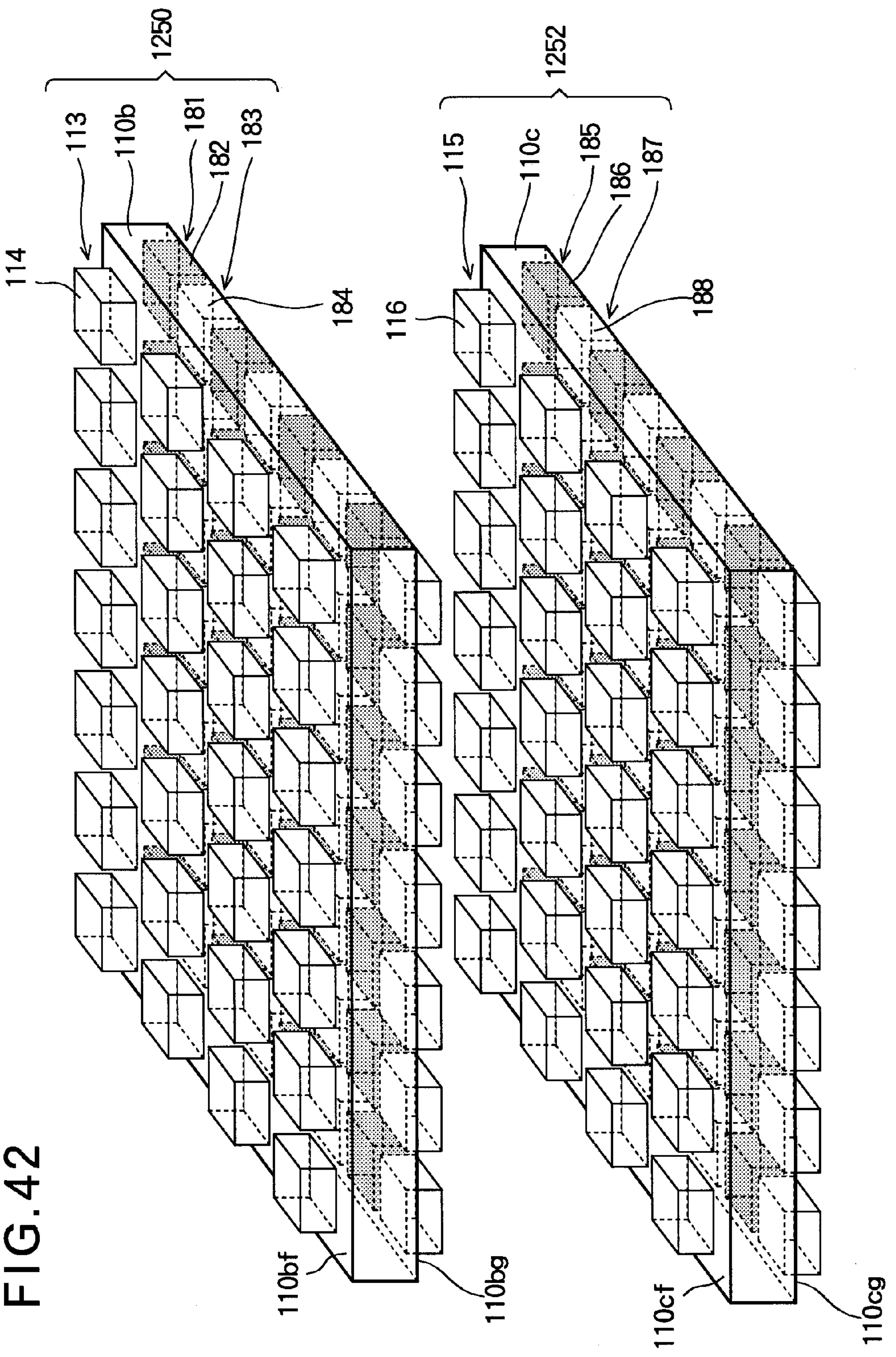
FIG. 42 is an exploded perspective view schematically showing still another configuration of the light emitting panel of the display device according to Embodiment 4 of the present invention.

FIG. 42 is an exploded perspective view schematically showing still another example of the configuration of the light emitting panel of the display device according to Embodiment 4 of the present invention. In the example shown in FIG. 42, the light emitting element array units each of which includes light emitting elements on both sides of the substrate are provided. To be more specific, in the example shown in FIG. 42, the light emitting element array 113 (including a plurality of light emitting elements 114) is provided on the surface 110*bg* of the first substrate 110*b*, and two light emitting element arrays 181 and 183 are provided on the back surface 110*bg* of the first substrate 110*b*. The light emitting element array 115 (including a plurality of light emitting elements 116) is provided on the surface 110*cg* of the second substrate 110*c*, and two light emitting element arrays 185 and 187 are provided on the back surface 110*cg* of the second substrate 110*c*. Light emitting elements 182 of the light emitting element array 181 and light emitting elements 184 of the light emitting element array 183 are disposed on different positions in a planar direction. Similarly, light emitting elements 186 of the light emitting element array 185 and light emitting elements 188 of the light emitting element array 187 are disposed on different positions in a planar direction.

The substrate 110*b* and the light emitting element arrays 113, 181 and 183 constitute a light emitting element array unit 1250. The substrate 110*c* and the light emitting element arrays 115, 185 and 187 constitute a light emitting element array unit 1252.

In the example shown in FIG. 42, it is preferable that the light emitting element array emitting light having shorter wavelength is disposed closer to the light emitting surface of the light emitting panel. It is possible that either of the light emitting element arrays 181 and 183 (disposed on the same substrate) emits light having longer wavelength than the other, and either of the light emitting element arrays 185 and 187 (disposed on the same substrate) emits light having longer wavelength than the other. In other respects, the example shown in FIG. 42 is the same as the example shown in FIG. 40.

In the example shown in FIG. 42, 6 kinds of light emitting element arrays are provided, and therefore it is possible to obtain light having 6 kinds of different wavelengths.

Figure 43:
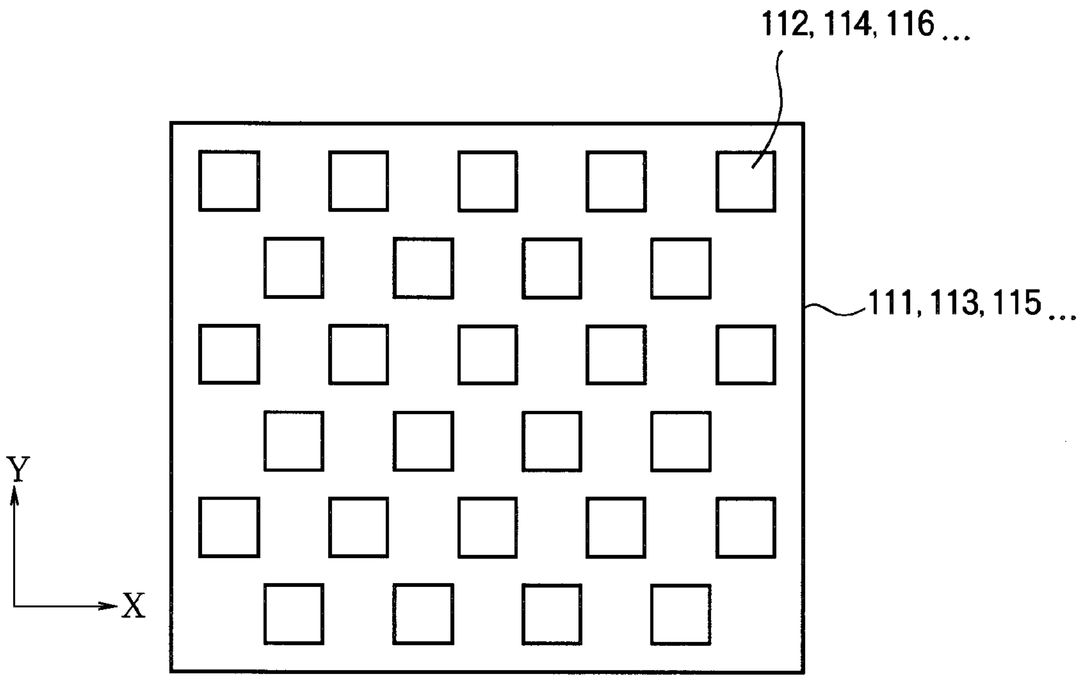
FIG. 43 shows a further example of an arrangement of light emitting elements of the light emitting element array.

In the examples shown in FIGS. 1 through 42, the light emitting elements (112, 114, 116 or the like) are disposed on all intersections of imaginary lines extending in the column direction (Y direction) and imaginary lines extending in the row direction (X direction) in the respective light emitting element arrays 111, 113, 115 or the like. However, this invention is not limited to such a configuration. For example, as shown in FIG. 43, the light emitting elements can be disposed (in a staggered manner) on alternate intersections of imaginary lines extending in the Y direction and imaginary lines extending in the X direction. To be more specific, the light emitting elements are arranged so as to be shifted from each other between the adjacent imaginary lines of the Y direction and shifted from each other between the adjacent imaginary lines of the X direction.

In the above described examples, n-type (n-side) and p-type (p-type) can be reversed relative to each other. Further, in the above described examples, N-type (n-side) is defined as a first conductivity type (first conductivity side), and p-type (p-side) is defined as a second conductivity type (second conductivity side). However, n-type (n-side) can be the second conductivity type (second conductivity side) and p-type (p-side) can be the first conductivity type (first conductivity side).

In the above described example, the light emitting elements containing nitride semiconductor has been described. However, the present invention is not limited to the light emitting element containing nitride semiconductor, but is applicable to a light emitting element containing, for example, oxide semiconductor such as ZnO or the like and also applicable to a light emitting element containing both of nitride semiconductor and oxide semiconductor.

Further, in the above described examples, although the light emitting device have been described to be used in the display device, the light emitting panel is applicable to a light source device such as a back light of a liquid crystal display device or an illuminating device. In this case, the arranging density of the light emitting elements can be increased, and therefore it becomes possible to obtain a light source device or an illuminating device that provides high luminance and uniform light intensity with a small surface area.

While the preferred embodiments of the present invention have been illustrated in detail, it should be apparent that modifications and improvements may be made to the invention without departing from the spirit and scope of the invention as described in the following claims.

What is claimed is:

1. A light emitting panel comprising:

a plurality of light emitting element arrays each of which includes a plurality of light emitting elements arranged in a plane, wherein said light emitting elements have light emitting regions, first contact regions contacting said light emitting regions, and second contact regions contacting other portions than said light emitting regions, wherein each of said light emitting element arrays includes first wirings and second wirings arranged in a lattice, said first wirings being connected to said first contact regions and said second wirings being connected to said second contact regions, wherein said first wirings are laminated above said second wirings at intersections of said lattice, wherein arrangement planes of said light emitting elements of said plurality of light emitting element arrays overlap with each other and are substantially parallel to each other, wherein said light emitting elements of said plurality of light emitting element arrays emit lights to the same side, upon application of voltages, and wherein said plurality of light emitting element arrays are arranged in descending order of wavelength in a proceeding direction of the lights emitted by said light emitting elements.

2. The light emitting panel according to claim 1, wherein said light emitting elements of one of said light emitting element arrays are composed of semiconductor material differing from light emitting elements of another of light emitting element arrays.

3. The light emitting panel according to claim 2, wherein said semiconductor material is an inorganic material.

4. The light emitting panel according to claim 3, wherein said semiconductor material contains at least one of nitride semiconductor and oxide semiconductor.

5. The light emitting panel according to claim 1, wherein said light emitting elements of one of said light emitting element arrays emit light whose wavelengths is different from light emitted by said light emitting elements of another of said light emitting element arrays.

6. The light emitting panel according to claim 5, wherein said light emitting elements of one of said light emitting element arrays are disposed on positions different from said light emitting elements of another of said light emitting element arrays in a direction perpendicular to said arrangement surface.

7. The light emitting panel according to claim 6, wherein said light emitting elements of one of said light emitting element arrays emit light whose wavelength is longer than light emitted by said light emitting elements of another of said light emitting element arrays disposed on a light emitting side of said one of said light emitting element arrays.

8. The light emitting panel according to claim 1, wherein said light emitting elements of the same light emitting element array emit light having the same wavelength.

9. The light emitting panel according to claim 1, wherein each of said light emitting element arrays is provided on a surface of a substrate.

10. The light emitting panel according to claim 9, wherein two of said light emitting element arrays are provided on a first surface and a second surface of the same substrate.

11. The light emitting panel according to claim 9, wherein one of said light emitting element arrays includes a substrate on which said light emitting elements are formed, and said substrate transmits light from said light emitting elements disposed in a direction opposite to a light emitting direction from said substrate.

12. The light emitting panel according to claim 1, wherein said light emitting element arrays include a first light emitting element array and a second light emitting element array, wherein said first light emitting element array and said second light emitting element array include light emitting elements laminated with each other on the same surface of the same substrate and emit, and wherein said light emitting elements of said first light emitting element array and said light emitting elements of said second light emitting element array emit lights having different wavelengths.

13. The light emitting panel according to claim 1, wherein said light emitting element arrays include a first light emitting element array and a second light emitting element array, wherein said first light emitting element array and said second light emitting element array include light emitting elements provided on different positions on the same surface of the same substrate and emit, and wherein said light emitting elements of said first light emitting element array and said light emitting elements of said second light emitting element array emit lights having different wavelengths.

14. A display device comprising:

said light emitting panel according to claim 1, and a driving portion that selectively drives respective light emitting elements of said light emitting panel to emit light.

15. A light source device comprising:

said light emitting panel according to claim 1, and a driving portion that selectively drives respective light emitting elements of said light emitting panel to emit light.

16. The light emitting panel according to claim 1, wherein electrodes are formed on said first contact regions, wherein said first wirings are connected to said electrodes at portions shifted from said light emitting regions of said light emitting elements.

17. The light emitting panel according to claim 1, wherein said first contact regions and said second contact regions are formed at different heights.

* * * * *